United States Patent
Kobayashi et al.

(10) Patent No.: US 6,686,861 B1
(45) Date of Patent: Feb. 3, 2004

(54) SLICE CIRCUIT CAPABLE OF ACCURATE CONVERSION OF AN ANALOG SIGNAL TO A DIGITAL SIGNAL

(75) Inventors: Keiji Kobayashi, Hyogo (JP); Hisayasu Satoh, Hyogo (JP)

(73) Assignee: Renesas Technology Corp., Tokyo (JP)

( * ) Notice: Subject to any disclaimer, the term of this patent is extended or adjusted under 35 U.S.C. 154(b) by 0 days.

(21) Appl. No.: 10/351,483

(22) Filed: Jan. 27, 2003

(30) Foreign Application Priority Data

Jul. 25, 2002 (JP) ......................................... 2002-216384

(51) Int. Cl.[7] ................................................. H03M 1/12
(52) U.S. Cl. ...................... 341/155; 341/118; 327/307; 375/317
(58) Field of Search ................................ 341/155, 158, 341/118; 327/307; 375/317, 318, 319

(56) References Cited

U.S. PATENT DOCUMENTS

| | | |
|---|---|---|
| 5,412,692 A | 5/1995 | Uchida |
| 5,978,422 A * | 11/1999 | Weber et al. ............... 375/317 |
| 6,104,238 A | 8/2000 | Mattisson et al. |
| 6,349,121 B1 * | 2/2002 | Anderson .................... 375/317 |
| 6,445,246 B1 | 9/2002 | Yoshida |
| 6,633,752 B1 * | 10/2003 | Hashigaya .................. 455/296 |
| 2001/0001616 A1 | 5/2001 | Rakib et al. |
| 2002/0001354 A1 | 1/2002 | McNally |

FOREIGN PATENT DOCUMENTS

JP 2002124857 4/2002

* cited by examiner

Primary Examiner—Howard L. Williams
(74) Attorney, Agent, or Firm—Leydig, Voit & Mayer, Ltd.

(57) ABSTRACT

A slice circuit includes a DC component adjusting circuit, an integrator, a low pass filter, and a comparator. The DC component adjusting circuit adjusts only a DC component in an input signal sent from an input terminal to produce a DC component having a uniform voltage level. The integrator amplifies only a high frequency component of or above a predetermined frequency in the input signal received from the DC component adjusting circuit. The low pass filter detects an average voltage of the input signal received from the DC component adjusting circuit. The comparator compares a voltage of the output signal sent from the integrator with a voltage of an output signal sent from the low pass filter, and provides a digital signal having a logical level corresponding to results of the comparison to an output terminal.

18 Claims, 53 Drawing Sheets

SLICE CIRCUIT CAPABLE OF ACCURATE CONVERSION OF AN ANALOG SIGNAL TO A DIGITAL SIGNAL

BACKGROUND OF THE INVENTION

1. Field of the Invention

The present invention relates to a slice circuit, and particularly to a slice circuit converting an FM demodulation output analog signal to a digital signal in an FSK (Frequency Shift Keying) demodulator of an FSK receiver.

2. Description of the Background Art

For various applications such as DECT (Digital European Cordless Telephone) and Bluetooth, an FSK demodulator uses a slice circuit as shown in FIG. 52.

Referring to FIG. 52, a conventional slice circuit 1100 includes an integrator 1120, a LPF (Low Pass Filter) 1130 and a comparator 1140.

Integrator 1120 includes resistances 1121 and 1123, a capacitor 1122 and an operational amplifier 1124. One end of resistance 1121 is connected to a node N20 and the other end is connected to an inverting input terminal of operational amplifier 1124, respectively. Capacitor 1122 is connected between a node N22 and a ground node GND. Resistance 1123 is connected between nodes N21 and N22.

Operational amplifier 1124 receives on its noninverting input terminal a signal carried on node N20, and receives on its inverting input terminal a signal carried on node N22. The signal on node N22 is equal to a signal produced by integrating an input signal by a low pass filter formed of resistance 1121 and capacitor 1122.

Accordingly, operational amplifier 1124 amplifies only high frequency components of or above a predetermined frequency in the input signal by a gain determined by resistances 1121 and 1123, and provides or passes components lower than the predetermined frequency as they are.

Low pass filter 1130 includes a resistance 1131, capacitors 1132 and 1133, and a switch 1134. Resistance 1131 is connected between nodes N20 and N23. Capacitor 1132 is connected between node N23 and ground node GND. Capacitor 1133 and switch 1134 are connected in series between node N23 and ground node GND. Capacitor 1132 is connected in parallel to capacitor 1133 and switch 1134.

When switch 1134 is off, low pass filter 1130 detects an average voltage of voltages forming the signal on node N20 by resistance 1131 and capacitor 1132. When switch 1134 is on, low pass filter 1130 detects an average voltage of voltages forming the signal on node N20 by resistance 1131 and capacitors 1132 and 1133.

Thus, low pass filter 1130 detects the average voltage of voltages forming the signal on node N20 while changing a capacitance by turning on and off switch 1134. Therefore, low pass filter 1130 has a larger time constant when switch 1134 is on.

Slice circuit 1100 receives an input signal subjected to FM demodulation by a frequency discriminator 1000, and converts the received input signal from an analog signal to a digital signal.

Therefore, integrator 1120 receives the input signal from frequency discriminator 1000 via an input terminal 1110, and amplifies only high frequency components, which have frequencies equal to or higher than a predetermined frequency, in the received input signal for providing it to the noninverting input terminal of comparator 1140.

Low pass filter 1130 receives the input signal from frequency discriminator 1000 via input terminal 1110, and detects the average voltage of voltages forming the received input signal. Low pass filter 1130 provides the detected average voltage to an inverting input terminal of comparator 1140.

Comparator 1140 receives on its noninverting input terminal the input signal amplified by integrator 1120, and receives the average voltage of the input signal on its inverting input terminal. Comparator 1140 compares the voltage of the input signal with the average voltage, and provides a signal at an H (logical high) level to an output terminal 1150 when the voltage of the input signal is higher than the average voltage. When the voltage of the input signal is equal to or lower than the average voltage, comparator 1140 provides a signal at an L (logical low) level to output terminal 1150.

As described above, slice circuit 1100 amplifies only high frequency components in the input signal subjected to the FM demodulation by frequency discriminator 1000, and converts the signal from the analog signal to the digital signal.

However, the conventional slice circuit suffers from the following problems.

(1) When the input signal demodulated by the frequency discriminator is accompanied by drift of DC offset changing fast, the slice circuit cannot follow such changes, and the input signal cannot be accurately converted from the analog signal to the digital signal.

(2) According to modulation conditions, when "1" or "0" continues, the input signal sent from the frequency discriminator keeps a uniform voltage value for a certain duration. When the slice circuit receives this input signal, comparator 1140 receives from integrator 1120 the voltage at substantially the same level as the voltage received from low pass filter 1130 so that the comparing operation in comparator 1140 cannot be performed accurately.

(3) When noise components of high frequencies are input, these noise components are erroneously detected as intended signal components.

Referring to FIG. 53, the foregoing problems (1)–(3) will now be described in greater detail. When an input signal INS accompanied by fast drift of DC offset, low pass filter 1130 of slice circuit 1100 cannot follow such fast changes, and provides a signal INDC indicating the average voltage of voltages forming input signal INS to the inverting input terminal of comparator 1140.

Thereby, the voltage level of signal INDC hardly crosses the voltage level of input signal INS for a period from timing t1 to timing t2, and comparator 1140 can hardly compare the voltage level of input signal INS with the voltage level of signal INDC. Consequently, comparator 1140 provides a signal DX1. Thus, slice circuit 1100 cannot accurately convert the input signal from the analog signal to the digital signal when the input signal is accompanied by the fast drift of DC offset.

When slice circuit 1100 receives components corresponding to components including a succession of "1" or "0" according to the FSK modulation at or after timing t2, the voltage level of signal INDC approaches the voltage level of input signal INS, and the voltage level of input signal INS cannot be discriminated from the voltage level of signal INDC during a period from timing t3 to timing t4. Consequently, comparator 1140 cannot accurately compare the voltage level of input signal INS with the voltage level of signal INDC, and provides a signal DX1 including an error component DES1.

A gain of integrator 1120 may be increased for overcoming the problem of the above item (1). In this case, however, integrator 1120 provides an amplified signal INA having a larger amplitude than input signal INS. Thereby, the voltage level of signal INDC crosses the voltage level of amplified signal INA during the period between timing t1 and timing t2, and comparator 1140 provides a signal DX2. As described above, the problem of the foregoing item (1) can be overcome by increasing the gain of integrator 1120. However, if input signal INS contains noise components having the same frequency as the high frequency components to be amplified in integrator 1120, amplified signal INS contains amplified noise components, resulting in the problem of the foregoing item (3).

The conventional slice circuit 1100 is configured to overcome the problems of the above items (1) and (2) by turning off switch 1134 of low pass filter 1130 to reduce the time constant during an initial period of reception of the input signal, and by turning on switch 1134 to increase the time constant during a latter period of reception of the input signal. This is because the drift of DC offset is generally fast during the initial period of reception of the input signal, and the drift of DC offset is generally slow during the latter period of reception of the input signal.

Accordingly, by controlling the time constant of the low pass filter as described above, it is attempted to cope with the fast drift of DC offset during the initial reception period, and to delay the timing, at which the voltage level of signal INDC approaches the voltage level of input signal INS, during the latter reception period as far as possible.

However, even if the measures are attempted by increasing the time constant of low pass filter 1130 and delaying the approach of the output voltage of low pass filter 1130 to the output voltage of integrator 1120 as far as possible, these measures do not fundamentally overcome an erroneous inverting operation of comparator 1140. Thus, conventional slice circuit 1100 cannot overcome both the problems in the items (1) and (2) at the same time.

For removing the noise components contained in the input signal as far as possible, the gain in integrator 1120 may be reduced. In this case, however, the voltage level of signal INDC cannot cross the voltage level of input signal INS when the input signal is accompanied by the fast drift of DC offset as described above. Therefore, comparator 1140 cannot accurately provide the digital signal. Thus, conventional slice circuit 1100 cannot overcome both the problems in the items (1) and (3) at the same time.

SUMMARY OF THE INVENTION

Accordingly, an object of the invention is to provide a slice circuit, which can accurately convert an input signal from an analog signal to a digital signal even when the input signal contains fast drift of DC offset.

Another object of the invention is to provide a slice circuit, which can accurately convert an input signal from an analog signal to a digital signal by removing noises even when the input signal contains fast drift of DC offset.

According to the invention, a slice circuit receiving an input signal prepared by demodulating a receive signal subjected to frequency modulation in a predetermined manner and having a voltage level corresponding to the frequency modulation, and converting the received input signal from an analog signal to a digital signal, includes a signal processing circuit and a comparator.

The signal processing circuit produces, based on the input signal, one of a first processing signal formed of a first main signal and a first reference signal, a second processing signal formed of a second main signal and a second reference signal, and a third processing signal formed of the first main signal and the second reference signal.

The comparator compares the voltage level of the first main signal with the voltage level of the first reference signal to provide a digital signal having a voltage level corresponding to results of the comparison when receiving the first processing signal. The comparator compares the voltage level of the second main signal with the voltage level of the second reference signal to provide a digital signal having a voltage level corresponding to results of the comparison when receiving the second processing signal. Further, the comparator compares the voltage level of the first main signal with the voltage level of the second reference signal to provide a digital signal having a voltage level corresponding to results of the comparison when receiving the third processing signal.

The first main signal is a signal having an amplified high frequency component of or above a predetermined frequency and a DC component formed of a predetermined voltage level, or is a signal having the high frequency component and a DC component at a voltage level changing in accordance with the DC component in the input signal. The second main signal is a signal having the high frequency component and a DC component being the same as the DC component in the input signal. Further, the first reference signal is a signal having an average voltage obtained by smoothing the input signal as it is. The second reference signal is a signal at a voltage level lower than the average voltage.

According to the invention, therefore, the slice circuit can achieve all or some of the following three effects.

(a) Even when an input signal Vin contains the drift of DC offset, the drift of DC offset can be removed, and input signal Vin can be accurately followed and converted from an analog signal to a digital signal.

(b) Even when the input signal contains components formed of a succession of uniform voltage levels, the input signal can be accurately converted from an analog signal to a digital signal.

(c) Even when the input signal contains noise components, erroneous detection of noise components can be prevented.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIG. 21 is a circuit diagram showing a DC component adjusting circuit, an integrator, a comparator and an average potential detecting circuit shown in FIG. 20, and also shows a period detecting circuit in a block from;

DESCRIPTION OF THE PREFERRED EMBODIMENTS

Embodiments of the invention will now be described with reference to the drawings. In the figures, the same or corresponding portions bear the same reference numbers, and description thereof is not repeated.

First Embodiment

Figure 1:
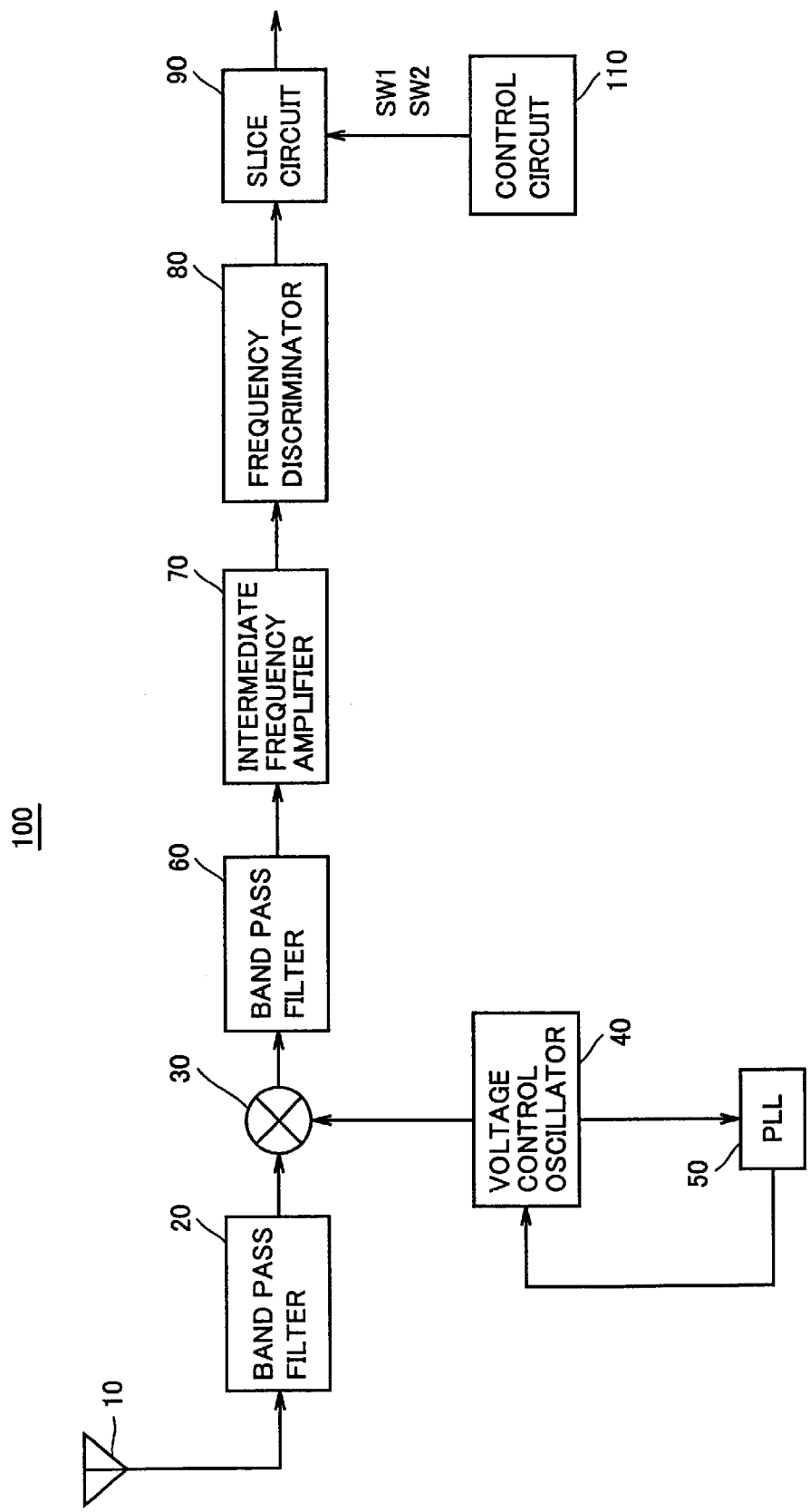
FIG. 1 is a schematic block diagram of a receiver of a first embodiment.

Referring to FIG. 1, a receiver 100 according to a first embodiment of the invention includes an antenna 10, band pass filters 20 and 60, a mixer 30, a voltage control oscillator 40, a PLL (Phase Locked Loop) 50, an intermediate frequency amplifier 70, a frequency discriminator 80, a slice circuit 90 and a control circuit 110.

Antenna 10 receives a receive signal subjected to FSK modulation, and provides the receive signal to band pass filter 20. Band pass filter 20 extracts a signal, which has a frequency in an intended frequency band, from the signal received from antenna 10, and provides the extracted signal to mixer 30.

Mixer 30 mixes the signal sent from band pass filter 20 with the signal sent from voltage control oscillator 40, and provides the mixed signals to band pass filter 60. It is assumed that band pass filter 20 provides a signal having a predetermined frequency width and a central frequency of fc, and voltage control oscillator 40 provides a signal of a frequency of f0. In this case, mixer 30 provides a signal of a frequency of (fc+f0) and a signal of a frequency of (fc−f0) to band pass filter 60.

Voltage control oscillator 40 divides the frequency of a period signal sent from PLL 50 to provide a signal of a predetermined frequency (e.g., of f0) to mixer 30 and PLL 50. PLL 50 provides a period signal, which is synchronized with the signal of the predetermined frequency sent from voltage control oscillator 40, to voltage control oscillator 40.

Band pass filter 60 extracts a signal having an intended frequency of (fc−f0) from the signal, which is sent from mixer 30 and has frequencies of (fc+f0) and (fc−f0), and provides the extracted signal to intermediate frequency amplifier 70.

Intermediate frequency amplifier 70 amplifies the signal of the frequency of (fc−f0) until it has a substantially constant amplitude. Frequency discriminator 80 converts the frequency-modulated signal to an amplitude-modulated signal. Thus, frequency discriminator 80 converts the frequency-modulated signal to a signal performing indication by means of differences in voltage level (which means that the FM demodulation is performed).

Slice circuit 90 converts the input signal sent from frequency discriminator 80 from the analog signal to the digital signal in a manner to be described later. Control circuit 110 provides signals SW1 and SW2 to slice circuit 90.

Figure 2:
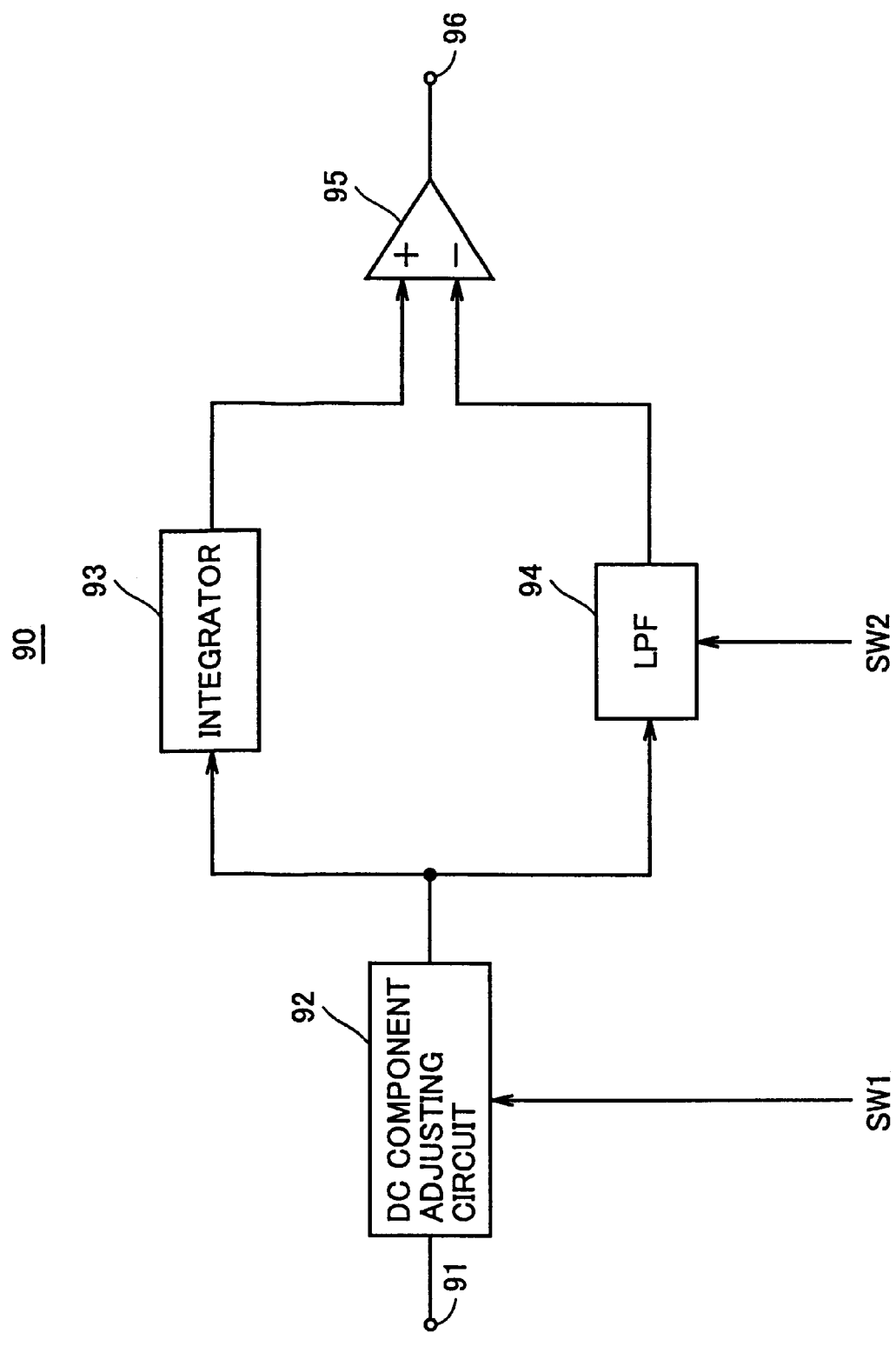
FIG. 2 is a block diagram of a slice circuit shown in FIG. 1.

Referring to FIG. 2, slice circuit 90 includes a DC component adjusting circuit 92, an integrator 93, a low pass filter 94 and a comparator 95. DC component adjusting circuit 92 receives an input signal subjected to the FM demodulation from frequency discriminator 80 via an input terminal 91. DC component adjusting circuit 92 adjusts only the DC components in the received input signal to provide DC components formed of a uniform voltage level, and sends an input signal having the DC components thus adjusted to integrator 93 and a low pass filter 94. A manner of adjusting the DC components in the input signal will be described later.

Integrator 93 amplifies only components, which have high frequencies equal to or higher than a predetermined frequency, in the input signal sent from DC component adjusting circuit 92. Low pass filter 94 detects an average voltage of the input signal received from DC component adjusting circuit 92.

Comparator 95 receives the output signal of integrator 93 on its noninverting input terminal, and receives the output signal of low pass filter 94 on its inverting input terminal. Comparator 95 compares the voltage of the input signal, in which only high frequency components of or above the predetermined frequency are amplified, with the average voltage of the input signal, and provides a digital signal having theological level corresponding to results of this comparison to an output terminal 96.

Thus, comparator 95 provides a signal at H-level to output terminal 96 when the voltage of the input signal, in which only the high frequency components are amplified, is higher than the average voltage of the input signal, and provides a signal at L-level to output terminal 96 when the voltage of the input signal, in which only the high frequency components are amplified, is equal to or lower than the average voltage of the input signal.

DC component adjusting circuit 92, integrator 93 and low pass filter 94 form a signal processing circuit.

Figure 3:
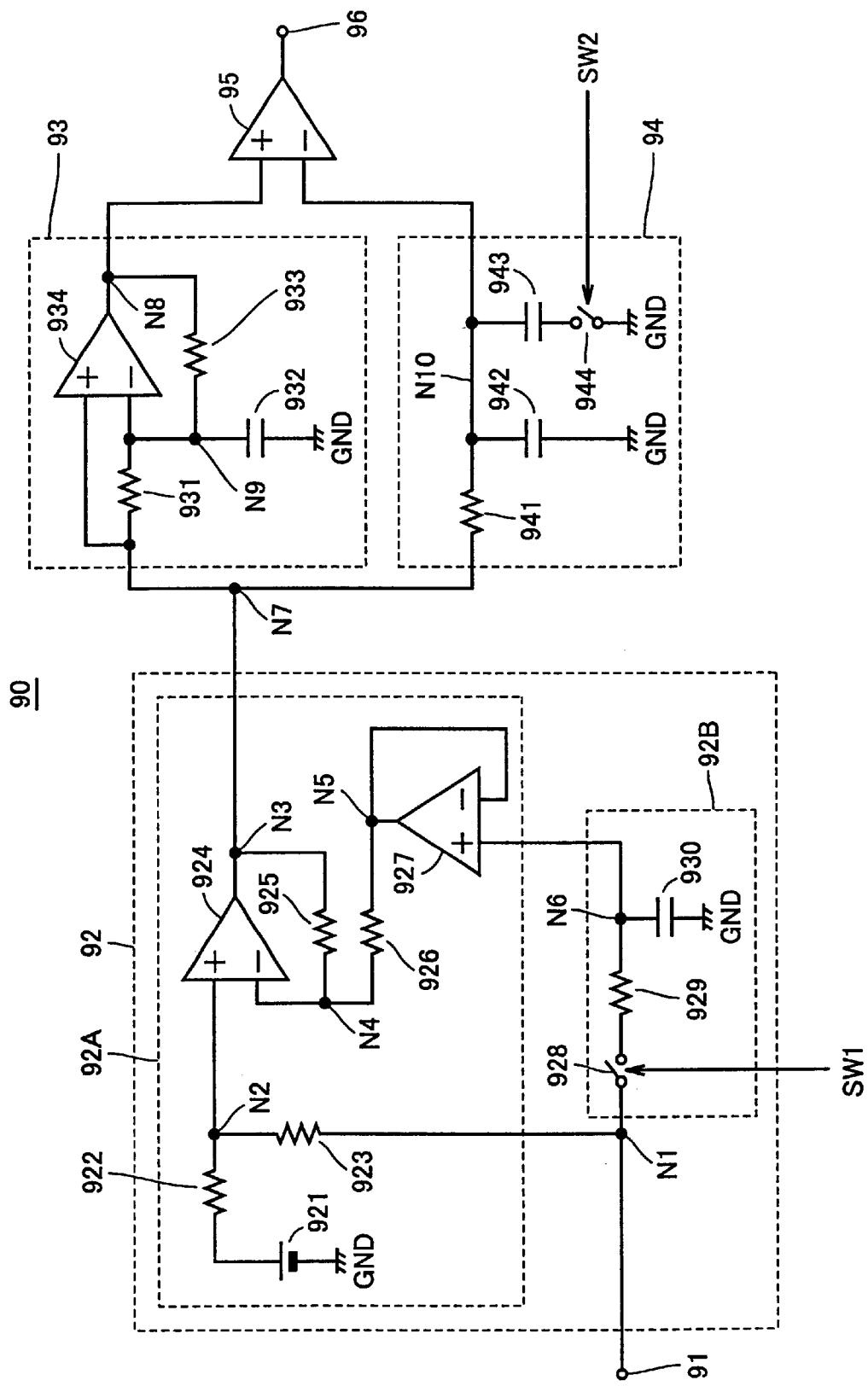
FIG. 3 is a circuit diagram of a DC component adjusting circuit, an integrator, a comparator and a low pass filter.

FIG. 3 is a circuit diagram of DC component adjusting circuit 92, integrator 93, low pass filter 94 and comparator 95 shown in FIG. 2. Referring to FIG. 3, DC component adjusting circuit 92 includes a DC level converting circuit 92A and a sample hold circuit 92B.

DC level converting circuit 92A includes a voltage supply 921, resistances 922, 923, 925 and 926, and operational amplifiers 924 and 927.

Voltage supply 921 and resistance 922 are connected in series between node N2 and ground node GND. Resistance 922 is connected to node N2, and resistance 923 is connected between nodes N1 and N2.

Operational amplifier 927 has a noninverting input terminal receiving an output signal of sample hold circuit 92B, and also has an inverting input terminal connected to its output terminal. Thus, operational amplifier 927 forms a buffer, and sends the output signal of sample hold circuit 92B to a node N5 as it is.

Resistance 925 is connected between nodes N3 and N4. Resistance 926 is connected between nodes N4 and N5. Operational amplifier 924 receives on its noninverting input terminal a signal carried on node N2, and also receives on its inverting input terminal a signal carried on node N4. Operational amplifier 924 receives its output signal (i.e., signal on node N3) on its inverting input terminal via resistance 925, and also receives on its inverting input terminal an output signal of operational amplifier 927 (i.e., signal on node N5) via resistance 926.

Sample hold circuit 92B includes a switch 928, a resistance 929 and a capacitor 930. Switch 928 and resistance 929 are connected in series between nodes N1 and N6. Switch 928 is connected to node N1, and resistance 929 is connected to node N6. Capacitor 930 is connected between node N6 and ground node GND.

Switch 928 receives a signal SW1 from control circuit 110. Switch 928 is turned on by signal SW1 at H-level, and is turned off by signal SW1 at L-level. Resistance 929 and capacitor 930 form a low pass filter.

The input signal subjected to FM demodulation by frequency discriminator 80 is sent to node N1 through input terminal 91. This signal is supplied from node N1 to DC level converting circuit 92A and sample hold circuit 92B. Assuming that Vin represents this input signal, Vb represents a signal on node N6, input signal Vin has a frequency of f, resistance 929 has a resistance value of R1 and capacitor 930 has a capacitance of C, the following equation is established when switch 928 is on.:

$$Vb = Vin/(1 + j\omega CR1) \qquad (1)$$

where ω is equal to 2πf

Accordingly, the low pass filter formed of resistance 929 and capacitor 930 has frequency characteristics, in which cut-off frequency fc is determined by the following equation:

$$fc = 1/(2\pi CR1) \qquad (2)$$

When signal SW1 turns on switch 928, the voltage of input signal Vin is transmitted via node N1 to resistance 929 and capacitor 930 so that capacitor 930 accumulates electric charges. The voltage on node N6 becomes equal to Vb expressed by the equation (1). When signal SW1 turns off switch 928, the charges accumulated in capacitor 930 will be gradually discharged. In this case, the voltage on node N6 maintains the level, which was kept immediately before turn-off of switch 928, for a predetermined time, and then will gradually lower.

A time required for discharging the charges accumulated in capacitor 930 depends on the self-discharging of capacitor 930 and an input resistance to the noninverting input terminal of operational amplifier 927. By employing operational amplifier 927 having a high input resistance, the noninverting input terminal of operational amplifier 927 takes in only a minute current, and capacitor 930 substantially holds the accumulated charges.

Accordingly, when signal SW1 turns on switch 928, sample hold circuit 92B detects an average voltage of input signal Vin, and provides signal Vb formed of the average voltage expressed by the equation (1). When signal SW1 turns off switch 928, sample hold circuit 92B holds the detected average voltage, and provides the average voltage thus held.

Sample hold circuit 92B receives signal SW1 at H-level from control circuit 110 during an initial period of reception of the input signal, and receives signal SW1 at L-level from control circuit 110 during a latter period of reception of the input signal. In the invention, the "initial period of reception" represents a period, during which an access code is primarily sent, and the "latter period of reception" represents a period, during which data is primarily sent.

During the initial period of reception of the input signal, therefore, switch 928 is turned on, and sample hold circuit 92B detects the average voltage of input signal Vin to provide it to the noninverting input terminal of operational amplifier 927. During the latter period of reception of the input signal, switch 928 is turned off, and sample hold circuit 92B provides the hold value of the detected average voltage to the noninverting input terminal of operational amplifier 927.

Input signal Vin sent to node N1 is supplied to node N2 via resistance 923. Assuming that voltage supply 921 provides output voltage Vref, signal Va is present on node N2, resistances 922, 923, 925 and 926 have resistance values R2, R3, R4 and R5, respectively, signal Vc is the output signal of operational amplifier 924 and thus is present on node N3, signal Vp is present on node N4, and signal Vd is the output signal of operational amplifier 927 and thus is present on node N5, the following equations (3) and (4) are established:

$$Va=Vin+(R3/(R2+R3))(Vref-Vin) \quad (3)$$

$$Vp=(R4Vd+R5Vc)/(R4+R5) \quad (4)$$

In operational amplifier 924, a relationship of Va=Vp is established as a result of imaginary short, and signal Vc can be expressed as followed by substituting Va for Vp:

$$Vc=((R4+R5)/R5)Va-(R4/R5)Vd \quad (5)$$

Operational amplifier 924 receives signal Va expressed by the equation (3) on its noninverting input terminal, and more specifically receives signal Va prepared by dividing a voltage difference between output voltage Vref (which may also be referred to as a "reference voltage") of voltage supply 921 and the voltage of input signal Vin in accordance with resistance values R2 and R3 of resistances 922 and 923, and adding the voltage of input signal Vin to the divided voltage produced by the above division. Operational amplifier 924 forms a noninverting amplifier circuit together with resistances 925 and 926, and receives output signal Vd of operational amplifier 927 on its bias terminal.

In an ordinary noninverting amplifier circuit, one terminal of resistance 926 determining the gain thereof, i.e., node N5 is grounded. According to the invention, however, one end of resistance 926 receives output signal Vd of operational amplifier 927. Thus, the bias terminal of the noninverting amplifier circuit formed of operational amplifier 924 and resistances 925 and 926 is floated by the voltage forming output signal Vd.

According to the invention, a ratio between resistance values R2 and R3 of resistances 922 and 923 is set to 1:1. Therefore, the equation (3) can be changed as follows:

$$Va=Vin+(Vref-Vin)/2 \quad (6)$$

In the invention, a ratio between resistance values R4 and R5 of resistances 925 and 926 is set to 1:1. Therefore, the equation (5) can be changed as follows:

$$Vc=2Va-Vd \quad (7)$$

Since operational amplifier 927 provides signal Vd, which is received on its noninverting input terminal, as it is, Vd is equal to Vb. Therefore, signal Vc can be expressed as follows from the equations (6) and (7) as well as the relationship of Vd=Vb.

$$Vc=Vin+Vref-Vb \quad (8)$$

When switch 928 is turned on, Vin is equal to Vb so that a relationship of (Vc=Vref) is obtained from the equation (8). Since signal Vb is formed of an average voltage of input signal Vin, the relationship of (Vc=Vref) is established by the DC components of output signal Vc, and the AC components of output signal Vc are the same as the AC components in input signal Vin according to the equation (8).

Accordingly, when switch 928 of sample hold circuit 92B is turned on, DC level converting circuit 92A converts the DC components in input signal Vin to DC components formed of a uniform voltage level (Vref), and provides the AC components in input signal Vin as they are.

When switch 928 of sample hold circuit 92B is turned off, a relationship of (Vin=Vb) is not established, and the average voltage of input signal Vin, which was attained immediately before the turn-off of switch 928, is held in signal Vb. In this case, therefore, operational amplifier 924 provides output signal Vc expressed by the equation (8). The DC components in input signal Vin are not changed to DC components formed of a uniform voltage level, and output signal Vc of which DC offset changes in accordance with input signal Vin is provided.

As described above, when switch 928 is turned on, DC component adjusting circuit 92 maintains the AC components in input signal Vin received through input terminal 91 as they are, and provides an output signal produced by converting the DC components to DC components formed of a uniform voltage level (Vref). When switch 928 is turned off, it provides the output signal, in which DC offset changes in accordance with input signal Vin.

Figure 4:
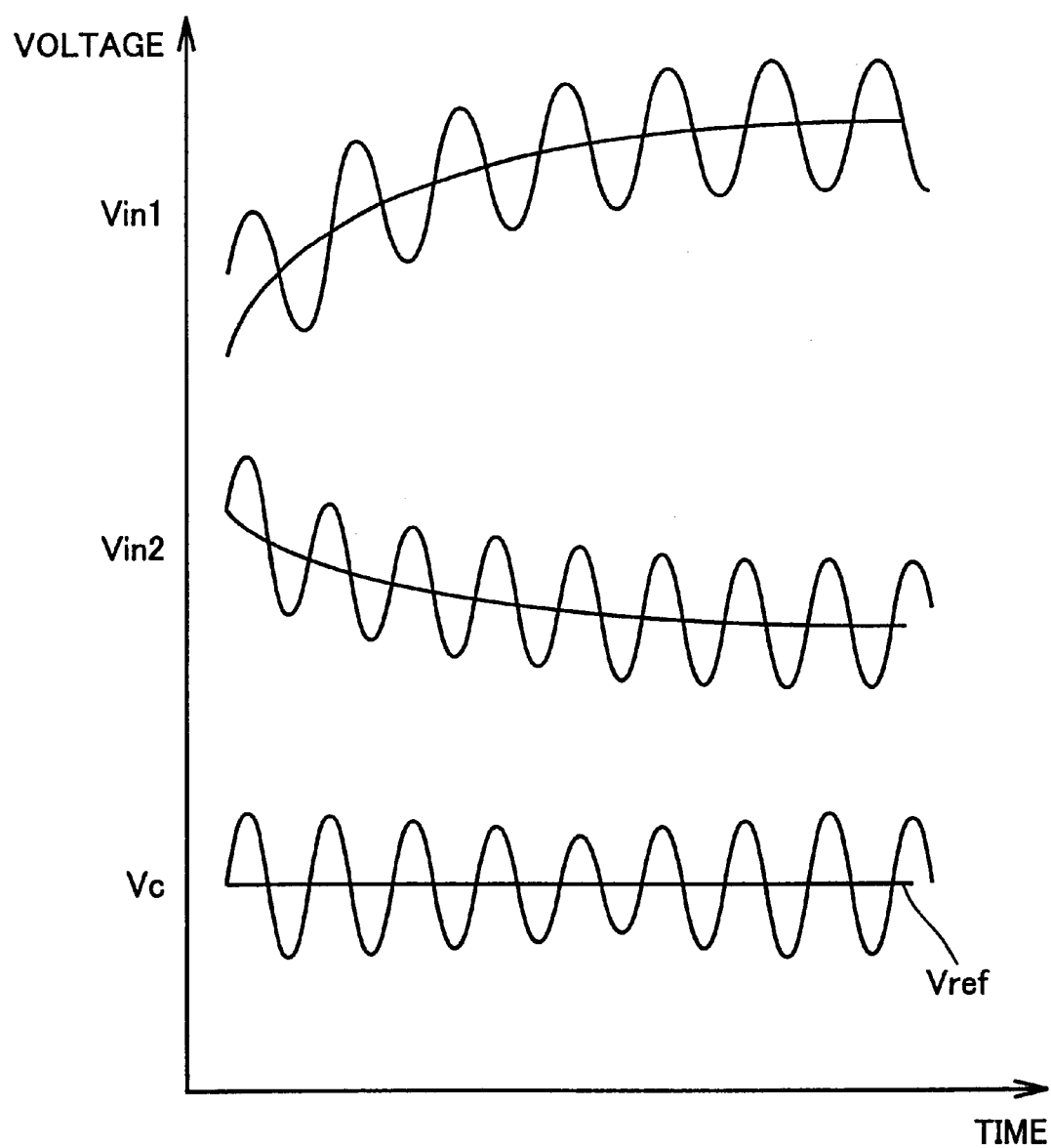
FIG. 4 is a timing chart of signals for illustrating a function of the DC component adjusting circuit shown in FIG. 2.

During the initial period of reception of input signal Vin, slice circuit 90 receives input signals Vin1 and Vin2, in which DC offset drifts to a large extent as shown in FIG. 4. When switch 928 is turned on, DC component adjusting circuit 92 provides the output signal, in which the AC components in input signal Vin are maintained as they are, and the DC components are changed to DC components formed of a uniform voltage level, as described above. Therefore, even when input signals Vin1 and Vin2, in which the DC offset drifts to a large extent, is received, DC component adjusting circuit 92 provides output signal Vc, in which the DC components are changed to the DC components formed of the uniform voltage level (Vref).

By using DC component adjusting circuit 92, input signals Vin1 and Vin2, which have drifting DC components, can be changed to input signal Vc having uniform DC offset.

Referring to FIG. 3 again, integrator 93 includes resistances 931 and 933, a capacitor 932 and an operational amplifier 934. Resistance 931 is connected between nodes N7 and N9. Resistance 933 is connected between nodes N8 and N9. Capacitor 932 is connected between node N9 and ground node GND. Operational amplifier 934 receives an input signal sent from DC component adjusting circuit 92 on its noninverting input terminal via node N7, receives the input signal sent from DC component adjusting circuit 92 on its inverting input terminal via a low pass filter formed of resistance 931 and capacitor 932, and receives an output signal, i.e., a signal on node N8 on its inverting input terminal via resistance 933.

Accordingly, integrator 93 amplifies only high frequency components, which have frequencies equal to or higher than a predetermined frequency, in the input signal, and sends them to comparator 95. The high frequency components of or above the predetermined frequency are components, of which inversion from "1" to "0" or from "0" to "1" by the FSK modulation occurs within a period shorter than a predetermined period.

LPF 94 includes a resistance 941, capacitors 942 and 943, and a switch 944. Resistance 941 is connected between nodes N7 and N10. Capacitor 942 is connected between node N10 and ground node GND. Capacitor 943 and switch 944 are connected in series between node N10 and ground node GND. Switch 944 is turned on by a signal SW2 at H-level sent from control circuit 110, and is turned off by signal SW2 at L-level sent from control circuit 110.

Low pass filter 94 receives the input signal sent from DC component adjusting circuit 92 via node N7, and detects the average voltage of the received input signal. Low pass filter 94 provides the detected average voltage to an inverting input terminal of comparator 95. Switch 944 in low pass filter 94 is employed for changing a time constant. When switch 944 is on, the capacitance of low pass filter 94 is equal to a sum of the capacitances of capacitors 942 and 943 so that the time constant is large. When switch 944 is off, the capacitance of low pass filter 94 is equal to the capacitance of capacitor 942 so that the time constant is small. As described above, the time constant can be adjusted in low pass filter 94.

Figure 5:
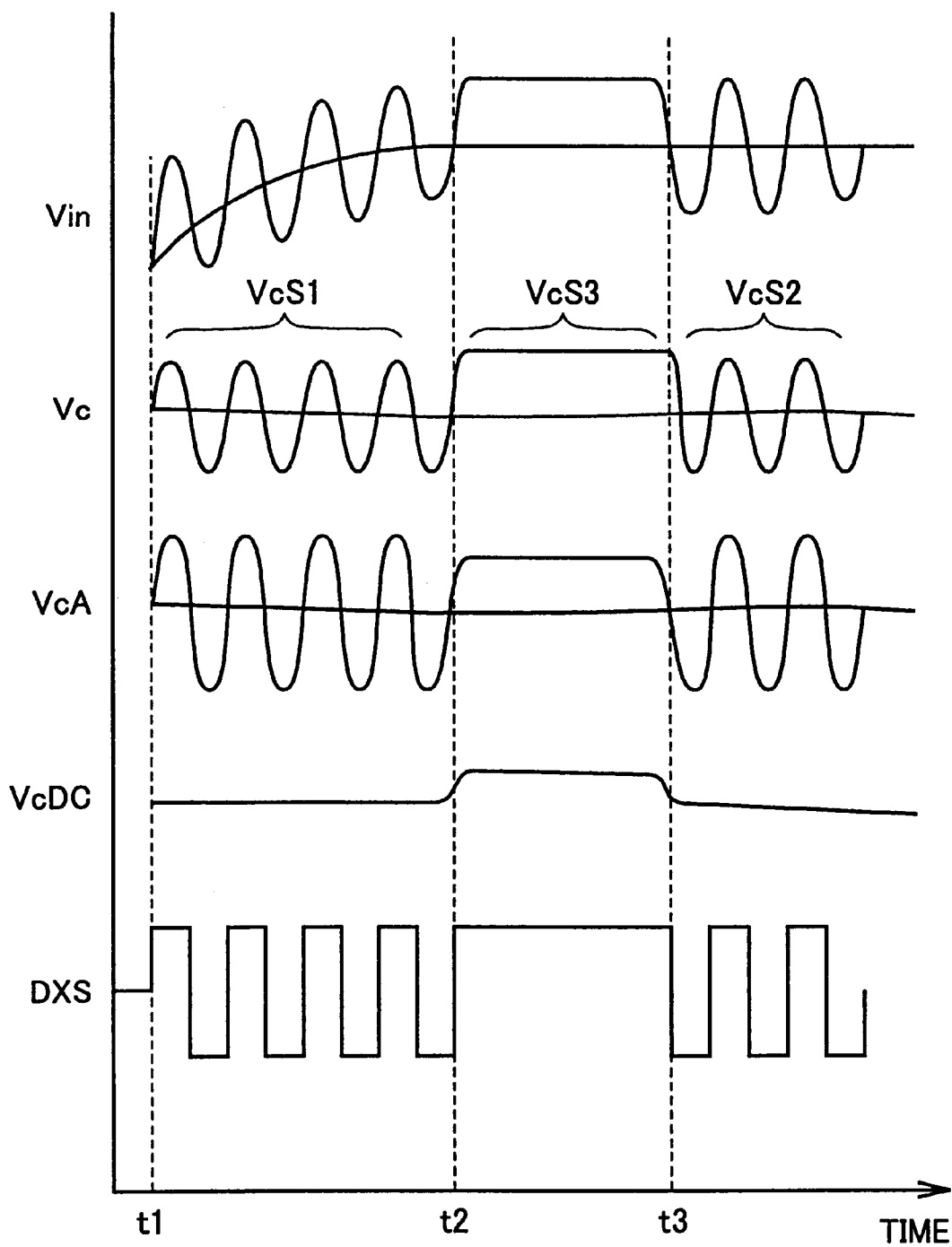
FIG. 5 is a timing chart of signals for illustrating an operation of the slice circuit shown in FIG. 1.

Referring to FIG. 5, an operation of slice circuit 90 will now be described. In FIG. 5, switch 928 in sample hold circuit 92B is on during a period from timing t1 to timing t2, and switch 928 is off after timing t2. Switch 944 in low pass filter 94 is off.

When slice circuit 90 receives input signal Vin via input terminal 91, DC component adjusting circuit 92 maintains the AC components in input signal Vin during the period from ting t1 to timing t2 as they are, changes the DC components to the DC components formed of the uniform voltage level during the above period, and provides signal Vc, in which DC offset changes in accordance with the DC offset in input signal Vin after timing t2, as already described. After timing t2, the DC offset in input signal Vin hardly drifts so that the DC offset in signal Vc provided after timing t2 is equal to the DC components (DC offset) formed of the uniform voltage level changed by the DC component adjusting circuit 92 during the period from timing t1 to timing t2.

Integrator 93 receives signal Vc provided from DC component adjusting circuit 92 via node N7, and amplifies only high frequency components of or above a predetermined frequency in the received signal Vc to provide a signal VcA to the noninverting input terminal of comparator 95. Low pass filter 94 receives signal Vc sent from DC component adjusting circuit 92 via node N7, detects the average voltage of received signal Vc, and provides a signal VcDC formed of the detected average voltage to the inverting input terminal of comparator 95.

Thereby, comparator 95 compares the voltage of signal VcA sent from integrator 93 with the voltage of signal VcDC sent from low pass filter 94, and provides a digital signal DXS corresponding to results of the comparison to output terminal 96.

As described above, even when input signal Vin contains the drift of DC offset, slice circuit 90 removes the drift of DC offset, and provides signal Vc formed of the uniform voltage level (signal Vc during the period from timing t1 to timing t2). Integrator 93 provides the signal by amplifying components VcS1 forming signal Vc during the period from timing t1 to timing t2 and components VcS2 forming signal Vc after timing t3, and provides the signal without amplifying components VcS3 forming signal Vc during a period from timing t2 to timing t3.

As a result, even if input signal Vin contains fast drift of the DC offset, input signal Vin can be followed and converted from the analog signal to the digital signal. Since low pass filter 94 has a small time constant, low pass filter 94 can follows signal Vc sent from DC component adjusting circuit 92, and the voltage of output signal VcDC of low pass filter 94 does not approach the voltage of output signal VcA. Therefore, even when slice circuit 90 receives the components corresponding to a signal including a succession of "1" or "0" produced by FSK modulation, input signal Vin can be accurately converted from an analog signal to a digital signal.

Referring to FIG. 1 again, an operation of receivier 100 will now be described. Antenna 10 receives a signal, and provides the received signal to band pass filter 20. Band pass filter 20 extracts only a signal in an intended frequency band from the signal received from antenna 10, and provides the extracted signal to mixer 30. Voltage control oscillator 40 provides a signal of a predetermined frequency to mixer 30. Mixer 30 mixes the signal sent from band pass filter 20 with the signal sent from voltage control oscillator 40, and provides a signal produced by the mixture to band pass filter 60.

Thereby, band pass filter 60 extracts a signal having an intended frequency from the signal sent from mixer 30, and provides it to intermediate frequency amplifier 70. Intermediate frequency amplifier 70 amplifies the signal sent from band pass filter 60 to attain a uniform amplitude. Frequency discriminator 80 effects FM demodulation on the signal sent from intermediate frequency amplifier 70, and provides the demodulated input signal to slice circuit 90.

Control circuit 110 provides signal SW1 at H-level to slice circuit 90 during a period from start (timing t1) of the signal reception to timing t2, provides signal SW1 at L-level to slice circuit 90 after timing t2, and provides signal SW2 at L-level to slice circuit 90 regardless of the period.

Thereby, slice circuit 90 accurately converts input signal Vin from the analog signal to the digital signal by removing the drift of DC offset in input signal Vin during the initial period (from timing t1 to timing t2) of reception of input signal Vin. Also, even if input signal Vin contains components formed of a succession of uniform voltage levels during the latter period (after timing t2) of reception of input signal Vin, slice circuit 90 accurately converts input signal Vin from the analog signal to the digital signal. Receiver 100 provides the input signal, which is converted from the analog signal to the digital signal, to a bas band portion. Thereby, the operation in receiver 100 ends.

According to the first embodiment, the slice circuit used in the receiver includes the DC component adjusting circuit, which maintains the AC components in the input signal as they are, and converts the DC components to the DC components formed of the uniform voltage level, as well as the low pass filter, of which gain can be set small. Therefore, even if the input signal contains the fast drift of DC offset, the input signal can be accurately converted from the analog signal to the digital signal. Even when the input signal contains the components corresponding to the signal formed of a succession of "1" or "0" produced by the FSK modulation, the input signal can be accurately converted from the analog signal to the digital signal.

Second Embodiment

Figure 6:
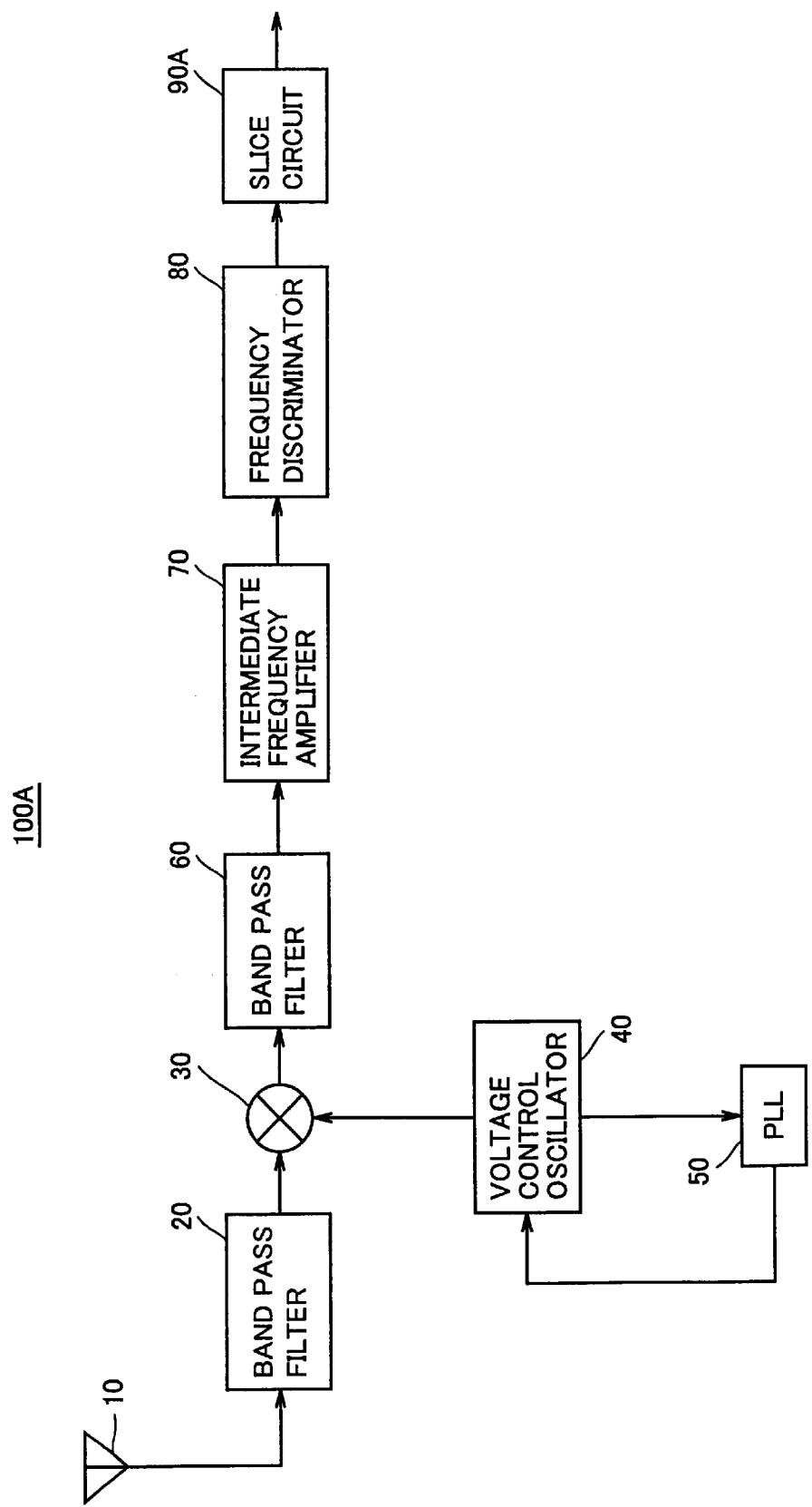
FIG. 6 is a schematic block diagram of a receiver of a second embodiment.

Referring to FIG. 6, a receiver 100A according to a second embodiment is the same as receiver 100 except for that control circuit 100 in receiver 100 is removed, and slice circuit 90 in receiver 100 is replaced with a slice circuit 90A.

Figure 7:
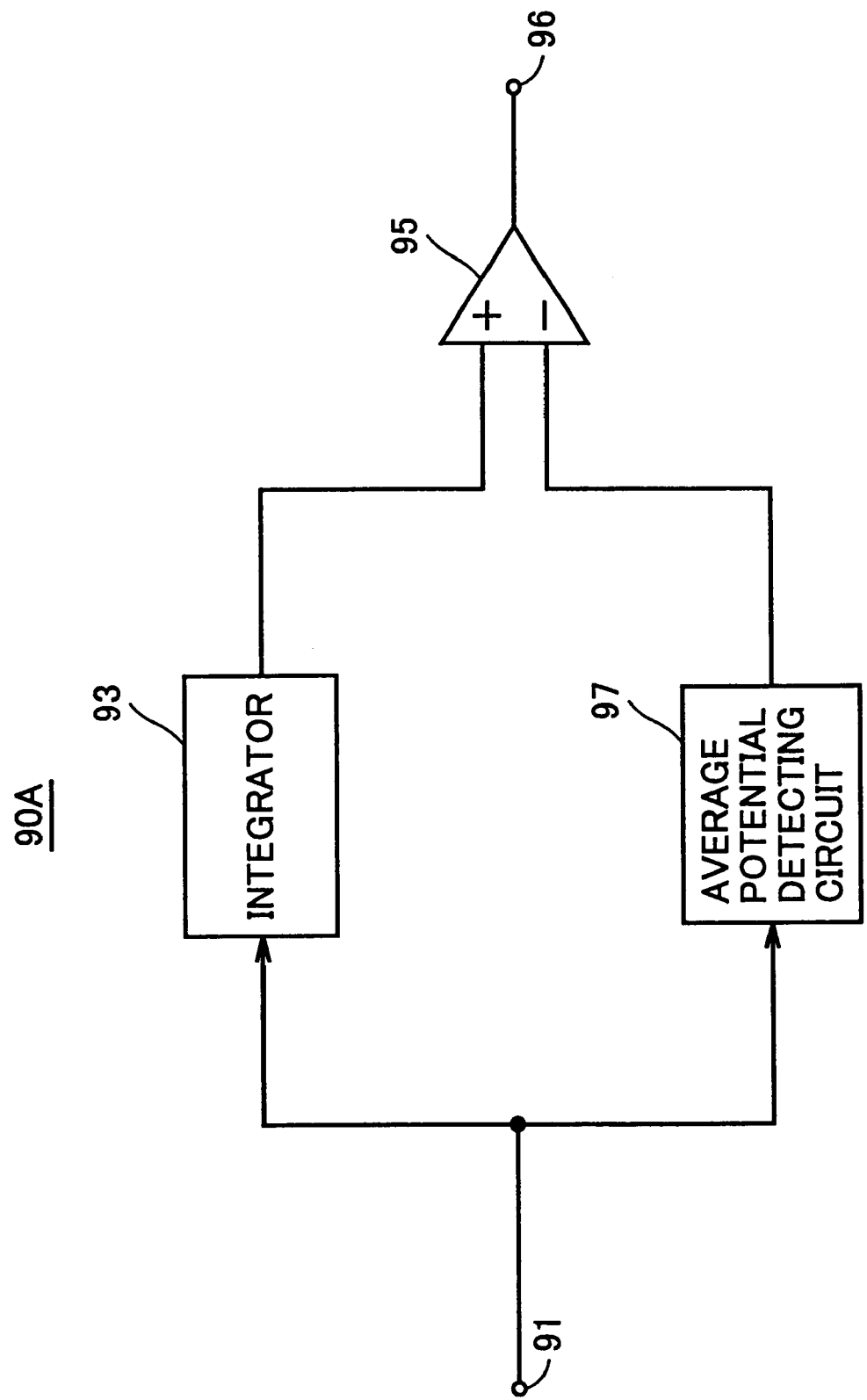
FIG. 7 is a block diagram of the slice circuit shown in FIG. 6.

Referring to FIG. 7, slice circuit 90A includes integrator 93, comparator 95 and an average potential detecting circuit 97. Integrator 93 and comparator 95 are substantially the same as those in the first embodiment. In slice circuit 90A, however, integrator 93 and average potential detecting circuit 97 receive the input signals via input terminal 91.

Average potential detecting circuit 97 attenuates input signal Vin received via input terminal 91, and detects the average voltage of the input signal thus attenuated. Average potential detecting circuit 97 provides the detected average voltage to the inverting input terminal of comparator 95.

Integrator 93 and average potential detecting circuit 97 form a signal processing circuit.

Figure 8:
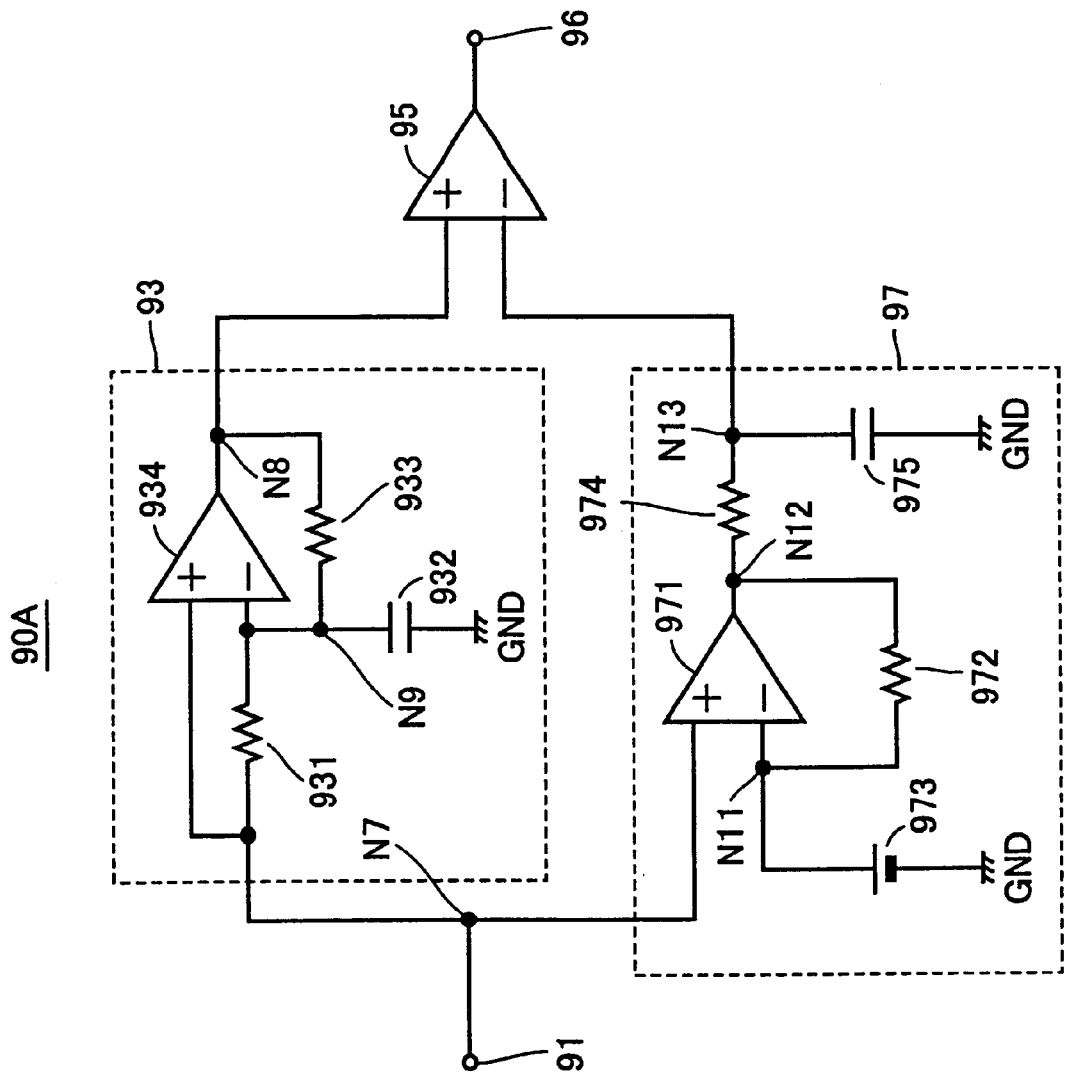
FIG. 8 is a circuit diagram of an integrator, a comparator and an average potential detecting circuit shown in FIG. 7.

FIG. 8 is a circuit diagram showing integrator 93, comparator 95 and average potential detecting circuit 97 shown in FIG. 7. The circuit structures of integrator 93 and comparator 95 are already described.

Referring to FIG. 8, average potential detecting circuit 97 includes an operational amplifier 971, resistances 972 and 974, a voltage supply 973 and a capacitor 975. Voltage supply 973 is connected between a node N11 and ground node GND, and provides a uniform voltage Vref1. Resistance 972 is connected between nodes N11 and N12. Operational amplifier 971 receives on its noninverting input terminal the input signal carried on node N7, and receives on its inverting input terminal the signal carried on node N11. Assuming that resistance 972 has a resistance value of Rc, operational amplifier 971 serves as a differential amplifier circuit, which uses uniform voltage Vref1 and resistance Rc as a reference and a load, respectively, and has a gain below one.

Resistance 974 is connected between nodes N12 and N13. Capacitor 975 is connected between node N13 and ground node GND. Resistance 974 and capacitor 975 form a low pass filter.

Uniform voltage Vref1 provided by voltage supply 973 depends on the power supply voltage of slice circuit 90A, and is set to maximize the input/output dynamic range of slice circuit 90A. For example, uniform voltage Vref1 is set to half the power supply voltage of slice circuit 90A.

Operational amplifier 971 receives the input signal on node N7 and uniform voltage Vref1 on node N11, and differentially amplifies the input signal based on uniform voltage Vref1 for providing the amplified signal to node N12. In this case, the gain of operational amplifier 971 is smaller than "1" so that operational amplifier 971 attenuates the input signal and provides it to node N12.

The low pass filter formed of resistance 974 and capacitor 975 smoothes the signal on node N12, and thus detects the average voltage of the signal on node N12 for providing the average voltage thus detected to the inverting input terminal of comparator 95. The low pass filter formed of resistance 974 and capacitor 975 does not smooth the original input signal, but smoothes the input signal attenuated by operational amplifier 971. Therefore, even if the input signal contains the components corresponding to the signal formed of a succession of "1" or "0" produced by the FSK modulation, the output average voltage is lower than the voltage of the output signal of integrator 93.

As described above, average potential detecting circuit 97 detects the average voltage of the input signal in the attenuated form.

Figure 9:
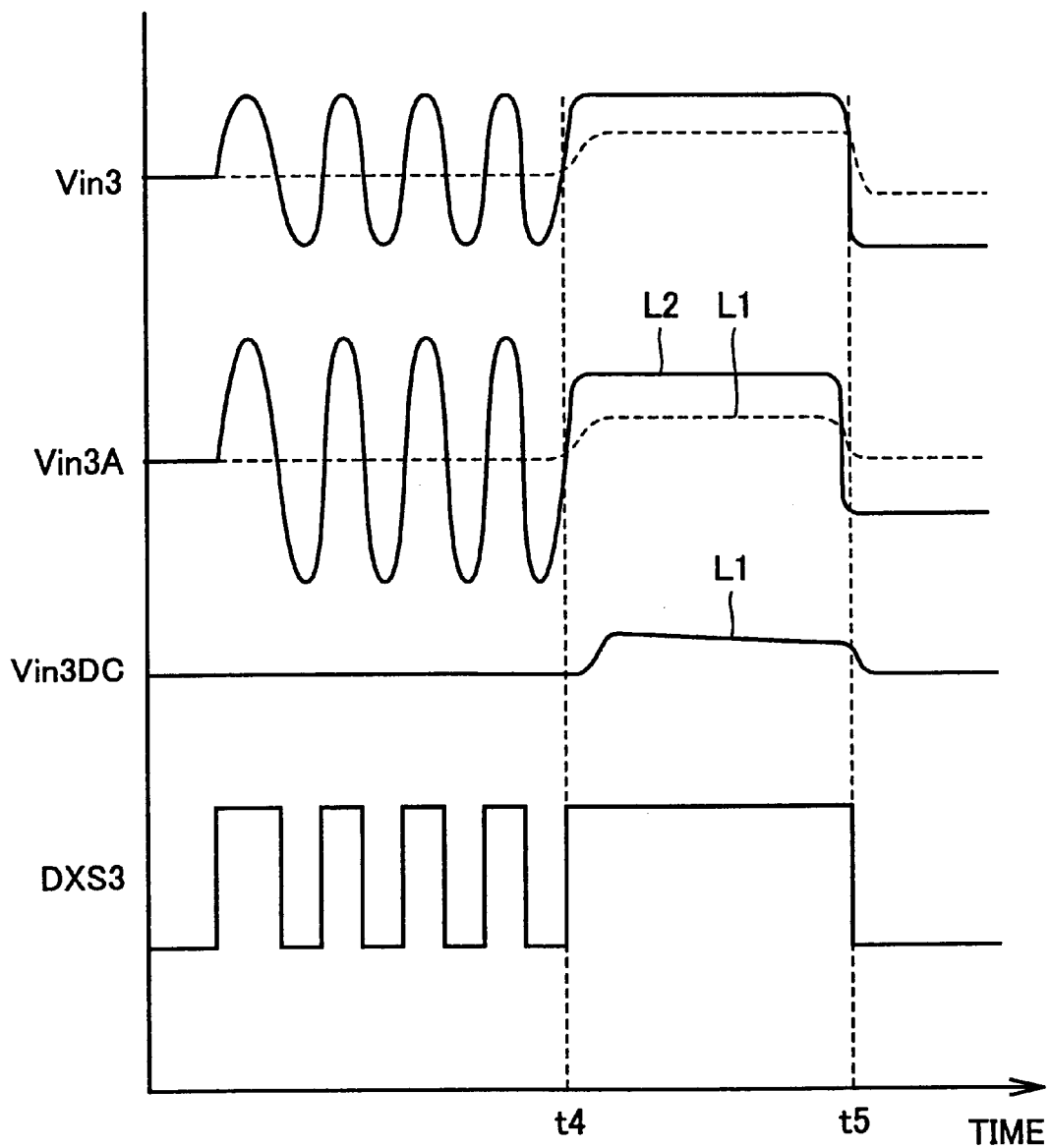
FIG. 9 is a timing chart of signals for illustrating an operation of the slice circuit shown in FIG. 6.

Referring to FIG. 9, an operation of slice circuit 90A will now be described. When slice circuit 90A receives an input signal Vin3 subjected to the FM demodulation, integrator 93 amplifies only the high frequency components of frequencies equal to or higher than the predetermined frequency, and provides a signal Vin3A produced by this amplification to the noninverting input terminal of comparator 95.

Average potential detecting circuit 97 attenuates the amplitude of input signal Vin3 on node N7, detects the average voltage of the input signal having the attenuated amplitude, and provides a signal Vin3DC formed of the detected average voltage to the inverting input terminal of comparator 95. Comparator 95 compares the voltage of output signal Vin3A sent from integrator 93 with the voltage of output signal Vin3DC sent from average potential detecting circuit 97, and provides a digital signal DXS3 having the logical level corresponding to results of the comparison to output terminal 96. Thereby, the operation in slice circuit 90A ends.

As described above, average potential detecting circuit 97 of slice circuit 90A attenuates the amplitude of input signal Vin3 by operational amplifier 971, and detects the average voltage of the input signal thus attenuated. Accordingly, the voltage of signal Vin3DC is lower than the voltage of signal Vin3A during a period from timing t4 to timing t5. As a result, even if input signal Vin3 contains components corresponding to the signal formed of a succession of "1" or "0" produced by the FSK modulation, a voltage level L1 of output signal Vin3DC of average potential detecting circuit 97 does not approach a voltage level L2 of output signal Vin3A of integrator 93 so that comparator 95 can accurately convert the input signal from the analog signal to the digital signal.

Owing to provision of average potential detecting circuit 97, comparator 95 can accurately convert input signal Vin3 from the analog signal to the digital signal without requiring setting of a large gain in operational amplifier 934 included in integrator 93, and therefore the amplification factor of integrator 93 can be small. As a result, even when input signal Vin3 contains noise components of the same frequencies as the high frequency components to be amplified by integrator 93, such an error can be prevented that the noise components are amplified and detected as an intended signal.

Operations of receiver 100A are the same as those of receiver 100 except for that the operation of slice circuit 90 is replaced with an operation of slice circuit 90A.

Structures and operations other than the above are the same as those in the first embodiment.

According to the second embodiment, the slice circuit includes the average potential detecting circuit attenuating the amplitude of the input signal, and detecting the average voltage of the attenuated input signal. Therefore, even if the input signal contains components corresponding to the signal formed of a succession of "1" or "0" produced by the FSK modulation, the input signal can be accurately converted from the analog signal to the digital signal, and such an error can be prevented that the noise components are detected as the intended signal.

Third Embodiment

Figure 10:
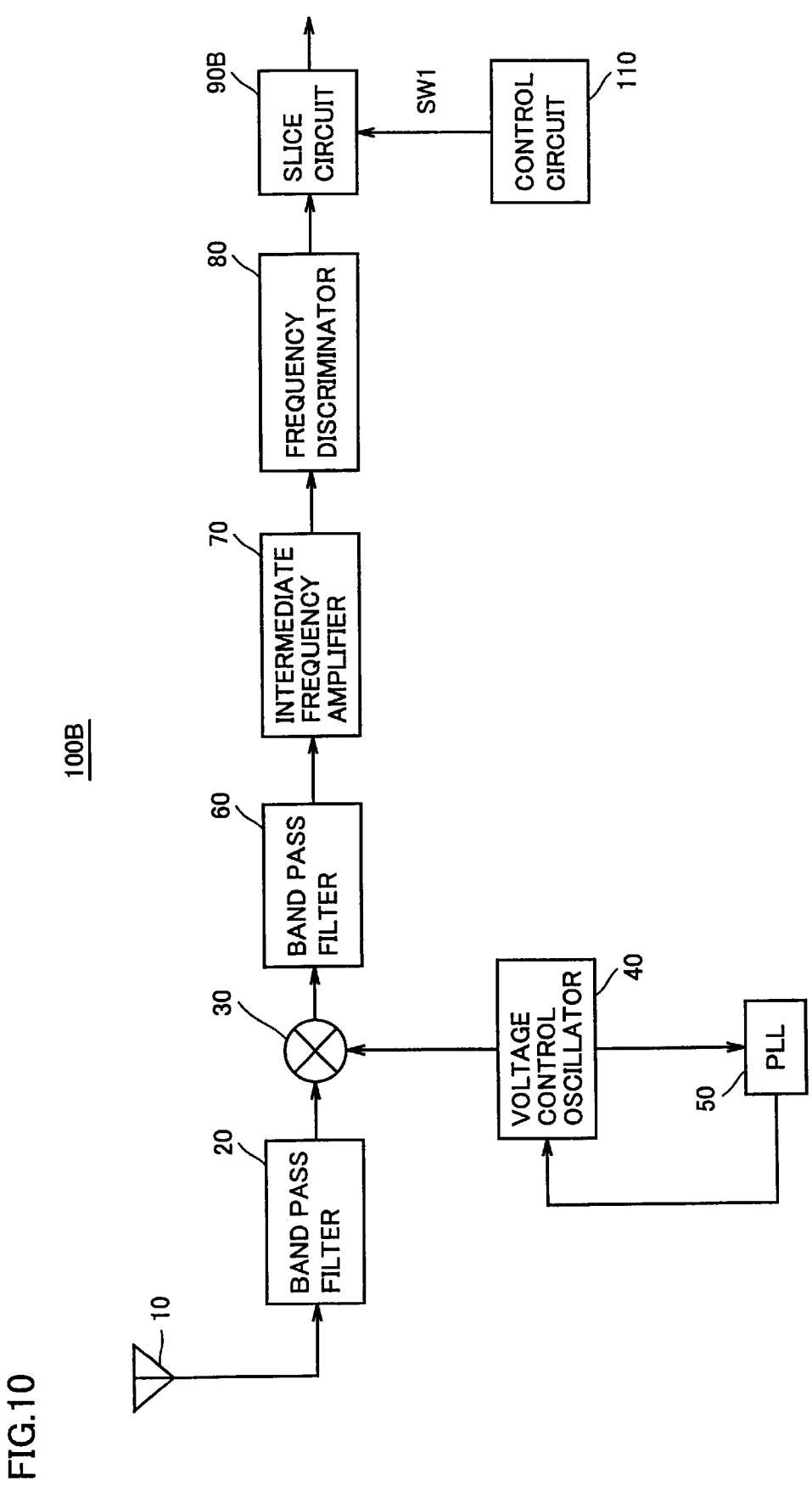
FIG. 10 is a schematic block diagram of a receiver according to third and fourth embodiments of the invention.

Referring to FIG. 10, a receiver 100B of a third embodiment is the same as receiver 100 except for that slice circuit 90 in receiver 100 is replaced with a slice circuit 90B.

Figure 11:
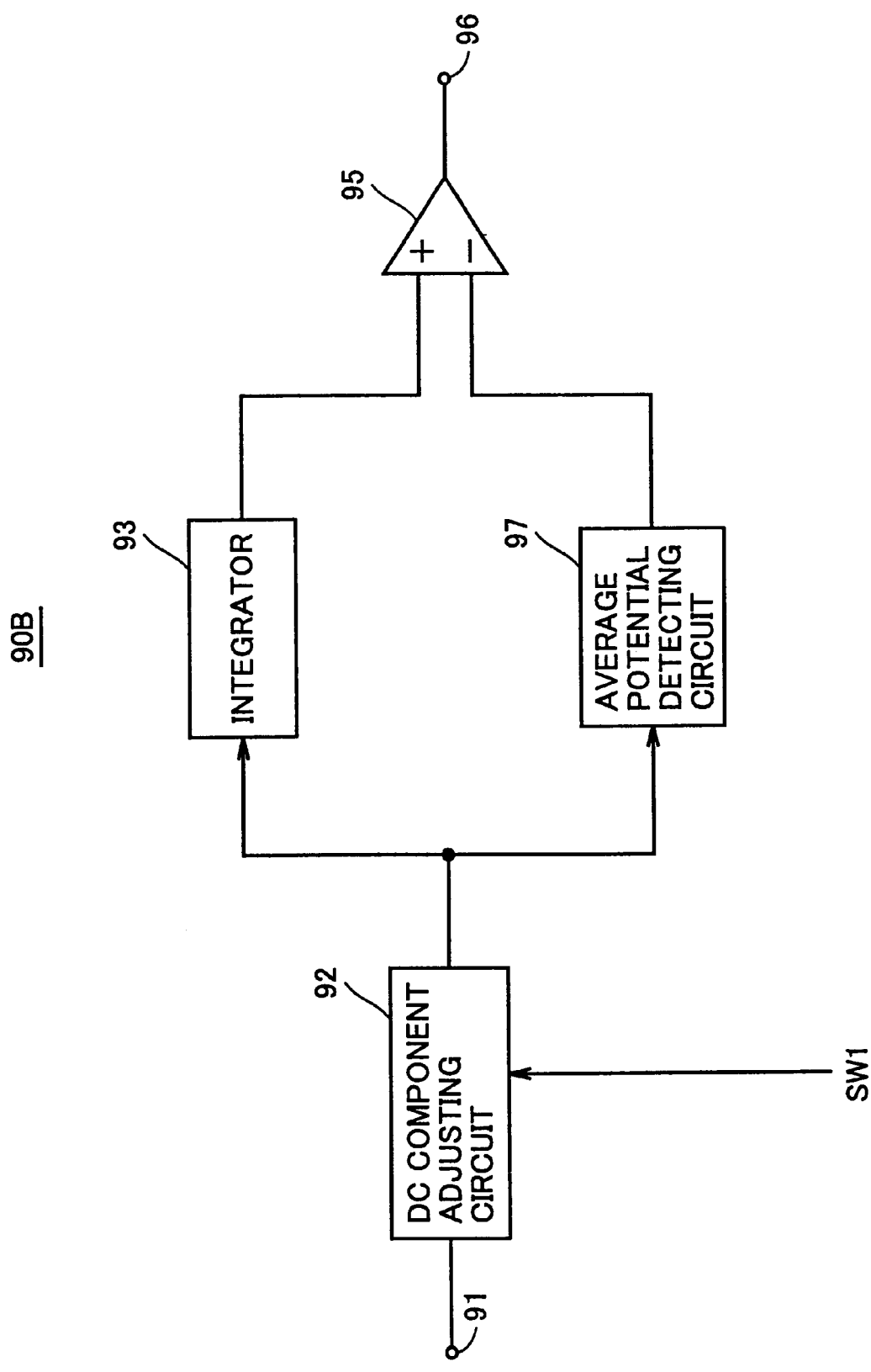
FIG. 11 is a block diagram of a slice circuit shown in FIG. 10.

Referring to FIG. 11, slice circuit 90B includes DC component adjusting circuit 92, integrator 93 and average potential detecting circuit 97.

As already described in connection with the first embodiment, DC component adjusting circuit 92 receives the input signal via input terminal 91, maintains the AC components in the received input signal as they are, and converts the DC components to the DC components formed of a uniform voltage level. DC component adjusting circuit 92 provides the input signal, in which the voltage level of the DC components is changed, to integrator 93 and average potential detecting circuit 97.

Integrator 93 amplifies only the high frequency components of or above the predetermined frequency in the input signal sent from DC component adjusting circuit 92, and provides the amplified input signal to the noninverting input terminal of comparator 95, as already described in connection with the first embodiment.

Average potential detecting circuit 97 receives the input signal from DC component adjusting circuit 92, attenuates the amplitude of the received input signal, and detects the average voltage of the attenuated input signal. Average potential detecting circuit 97 provides the detected average voltage to the inverting input terminal of comparator 95.

Comparator 95 compares the voltage of the output signal of integrator 93 with the voltage of output signal of average potential detecting circuit 97, and provides the digital signal having the logical level corresponding to results of the comparison to output terminal 96.

DC component adjusting circuit 92, integrator 93 and average potential detecting circuit 97 form a signal processing circuit.

Figure 12:
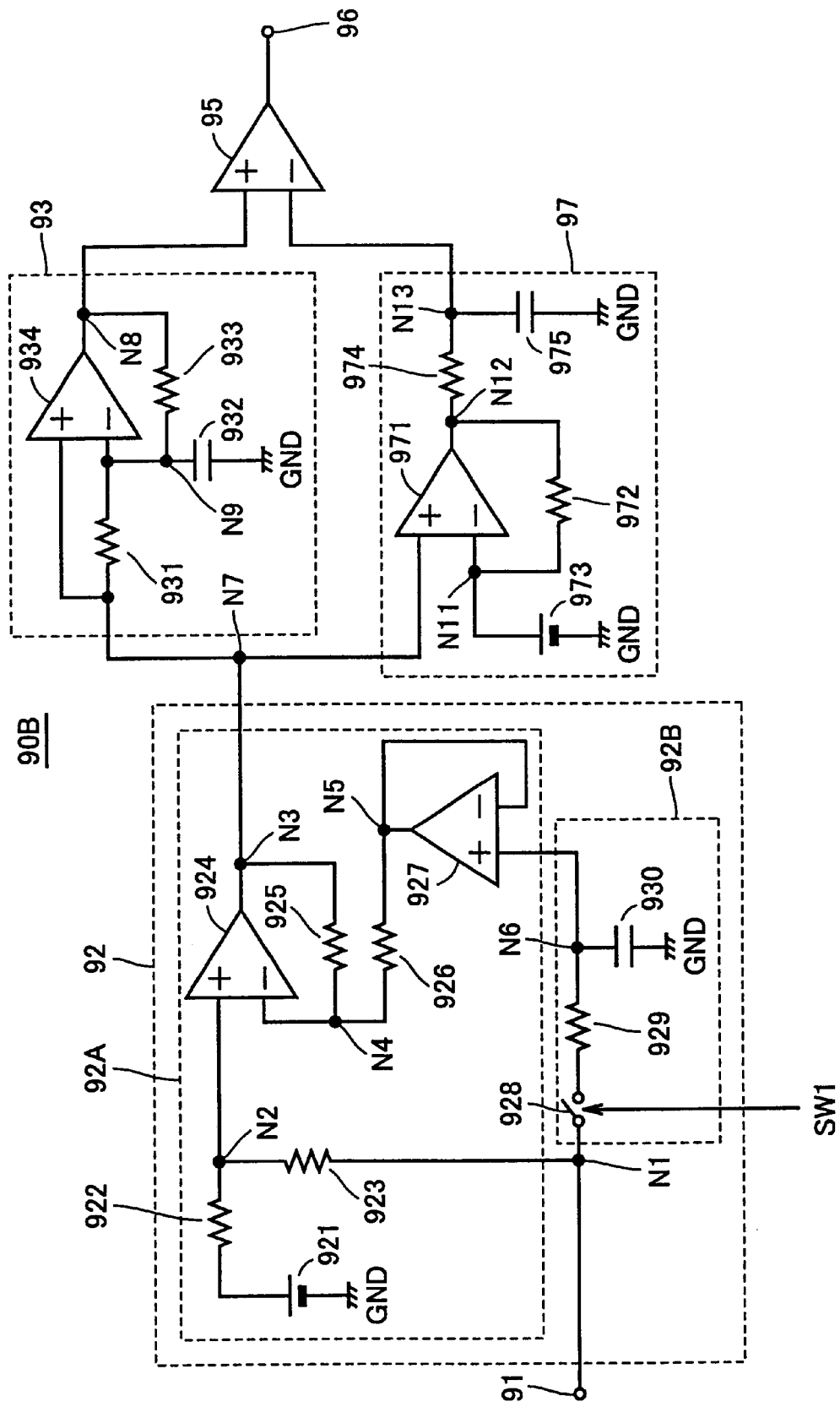
FIG. 12 is a circuit diagram of a DC component adjusting circuit, an integrator, a comparator and an average potential detecting circuit shown in FIG. 11.

FIG. 12 is a circuit diagram showing DC component adjusting circuit 92, integrator 93, comparator 95 and average potential detecting circuit 97. DC component adjusting circuit 92, integrator 93 and comparator 95 have the same structures as those shown in the circuit diagram of FIG. 3, and average potential detecting circuit 97 has the same structure as that shown in the circuit diagram of FIG. 8. Therefore, the structures in FIG. 12 will now be described in greater detail.

Figure 13:
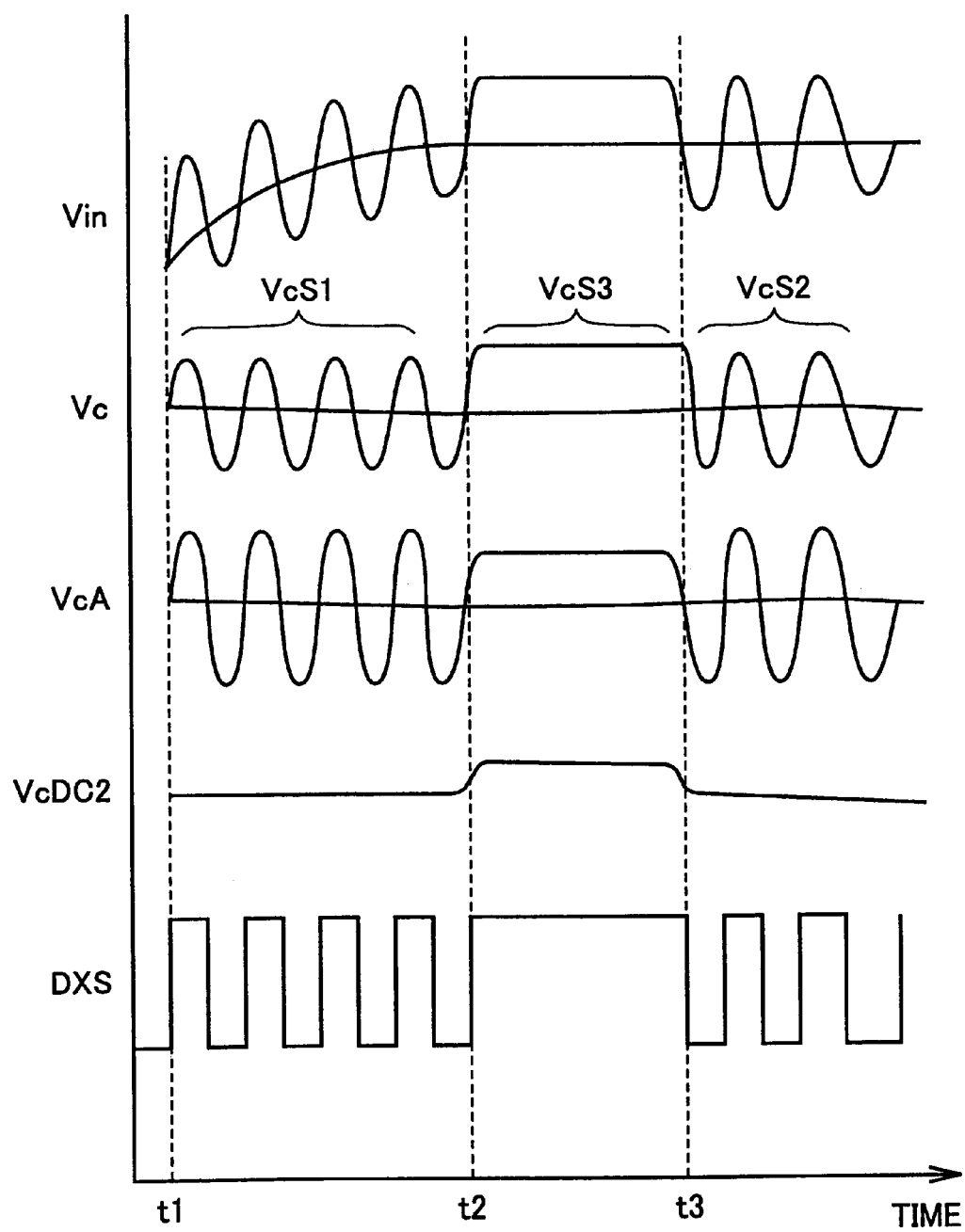
FIG. 13 is a timing chart of signals for illustrating an operation of the slice circuit shown in FIG. 10.

Referring to FIG. 13, an operation of slice circuit 90B will now be described. When input signal Vin is received via input terminal 91, DC component adjusting circuit 92 maintains the AC components in input signal Vin as they are, and converts the DC components to DC components formed of a uniform voltage level to provide signal Vc to integrator 93 and average potential detecting circuit 97.

Integrator 93 amplifies only the high frequency components of or above the predetermined frequency in signal Vc sent from DC component adjusting circuit 92, and provides signal VcA to the noninverting input terminal of comparator 95. Average potential detecting circuit 97 attenuates the amplitude of signal Vc sent from DC component adjusting circuit 92, and detects the average voltage of the attenuated signal. Average potential detecting circuit 97 provides a signal VcDC2 formed of the detected average voltage to the inverting input terminal of comparator 95.

Thereby, comparator 95 compares the voltage of signal VcA sent from integrator 93 with the voltage of signal VcDC2 sent from average potential detecting circuit 97, and provides digital signal DXS, which has the logical level corresponding to results of the comparison, to the output terminal. Thereby, the operation in slice circuit 90B ends.

As described above, slice circuit 90B produces signal Vc by maintaining the AC components in input signal Vin as they are, and converting the DC components to the DC components formed of the uniform voltage level. Further, slice circuit 90B attenuates the amplitude of signal Vc, and detects the average value of the attenuated signal.

Accordingly, even if input signal Vin contains the drift of DC offset, slice circuit 90B removes the drift of DC offset so that input signal Vin can be accurately followed and converted from the analog signal to the digital signal.

Slice circuit 90B attenuates the amplitude of input signal Vin and detects the average voltage of input signal Vin, input signal Vin can be accurately converted from the analog signal to the digital signal even when input signal Vin contains components VcS3 corresponding to the signal formed of a succession of "1" or "0" produced by the FSK modulation.

Further, a small gain can be set in integrator 93 when slice circuit 90B amplifies only the high frequency components of or above the predetermined frequency in signal Vc sent from DC component adjusting circuit 92. Therefore, erroneous detection of noise components can be prevented.

The operations of receiver 100B are the same as those of receiver 100 except for that the operation of slice circuit 90 is replaced with the operation of slice circuit 90B.

Structures and operations other than the above are the same as those in the first embodiment.

According to the third embodiment, the slice circuit includes the DC component adjusting circuit, which maintains the AC components in the input signal as they are, and converts the DC components to the DC components formed of the uniform voltage level, and the average potential detecting circuit, which attenuates the amplitude of the input signal, and detects the average voltage of the attenuated input signal. Therefore, the following three effects can be achieved:

(a) Even when input signal Vin contains the drift of DC offset, the drift of DC offset can be removed, and input signal Vin can be accurately followed and converted from the analog signal to the digital signal.

(b) Even when the input signal contains components formed of a succession of uniform voltage levels, the input signal can be accurately converted from the analog signal to the digital signal.

(c) Even when the input signal contains noise components, erroneous detection of noise components can be prevented.

Fourth Embodiment

A receiver according to a fourth embodiment is the same as receiver 100B of the third embodiment. In the fourth embodiment, control circuit 110 provides signal SW1 at H-level to switch 928 of slice circuit 90B during the initial period of reception of the receive signal, and provides signal SW1 at L-level to switch 928 during the latter period of reception of the receive signal.

During the initial period of reception of the receive signal, DC component adjusting circuit 92 maintains the AC components in input signal Vin as they are, and converts the DC components to the DC components formed of a uniform voltage level in accordance with signal SW1 at H-level sent from control circuit 110. During the latter period of reception of the receive signal, DC component adjusting circuit 92 provides the output signal, in which the AC components in input signal Vin are maintained as they are, and the DC offset changes in accordance with input signal Vin, in accordance with signal SW1 at L-level sent from control circuit 110.

Structures and operations other than the above are the same as those already described in connection with the third embodiment.

As described above, even if the DC components in input signal Vin drift during the initial period of reception of the receive signal, slice circuit 90B of the third embodiment changes input signal Vin to the signal, from which drift of the DC components is removed, during the above initial period. During the latter period of reception of the receive signal, slice circuit 90B changes input signal Vin to the signal, in which the DC components change in accordance with input signal Vin, and converts input signal Vin from the analog signal to the digital signal.

It is preferable that the drift of DC components in input signal Vin occurs throughout the period of reception of the receive signal. In practice, however, the drift of DC components primarily occurs during the initial period of reception of the receive signal, and hardly occurs during the latter period of reception of the receive signal.

Accordingly, by controlling DC component adjusting circuit 92 as described above, input signal Vin can be accurately converted from the analog signal to the digital signal.

According to the fourth embodiment, the slice circuit remove the drift of DC components in input signal Vin during the initial period of reception of the receive signal. During the latter period of reception of the receive signal, the slice circuit changes input signal Vin to the signal, in which the DC components change in accordance with input signal Vin, and converts input signal Vin from the analog signal to the digital signal. Therefore, the drift of DC components in the input signal can be efficiently removed.

Fifth Embodiment

Figure 14:
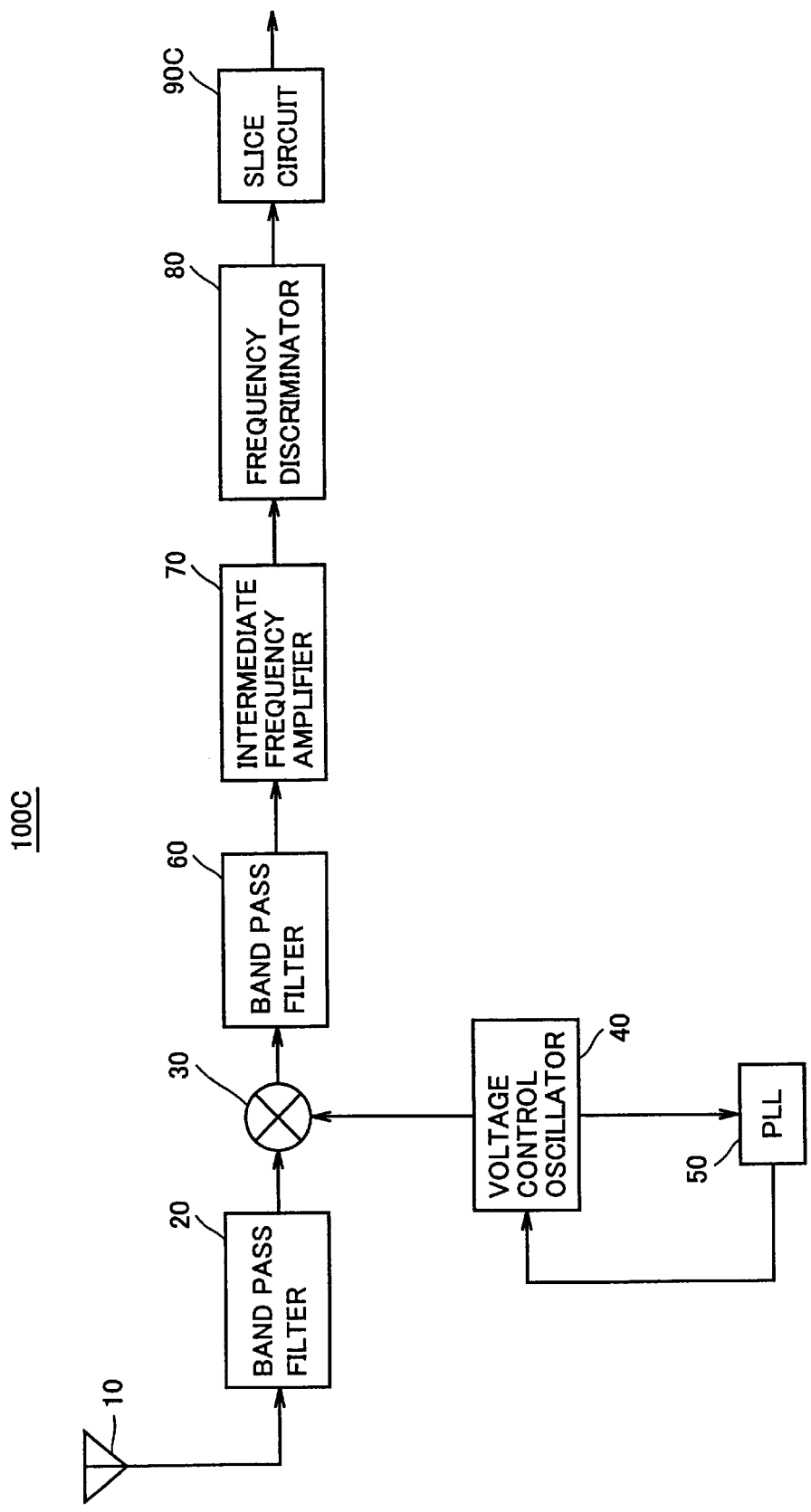
FIG. 14 is a schematic block diagram of a receiver according to a fifth embodiment.

Referring to FIG. 14, a receiver 100C according to a fifth embodiment is the same as receiver 100 except for that control circuit 110 in receiver 100 is removed, and slice circuit 90 in receiver 100 is replaced with a slice circuit 90C.

Figure 15:
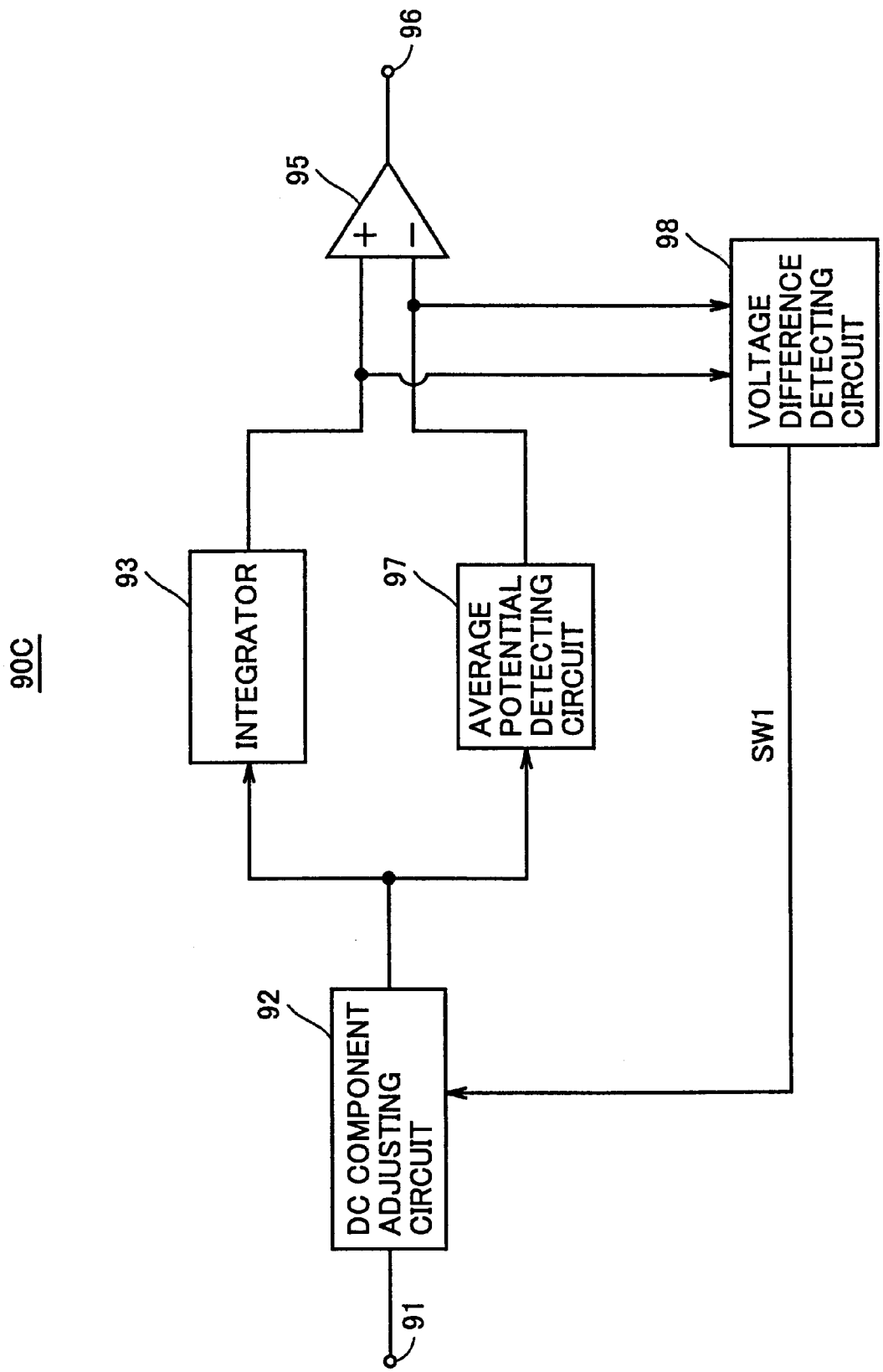
FIG. 15 is a block diagram of a slice circuit shown in FIG. 14.

Referring to FIG. 15, slice circuit 90C is the same as slice circuit 90B except for that a voltage difference detecting circuit 98 is additionally employed. Voltage difference detecting circuit 98 detects a voltage difference between two signals applied to comparator 95, and provides signal SW1 at H-level to DC component adjusting circuit 92 when the detected voltage difference falls within a predetermined range. When the detected voltage difference falls outside the predetermined range, it provides signal SW1 at L-level to DC component adjusting circuit 92.

DC component adjusting circuit 92, integrator 93 and average potential detecting circuit 97 form a signal processing circuit.

Figure 16:
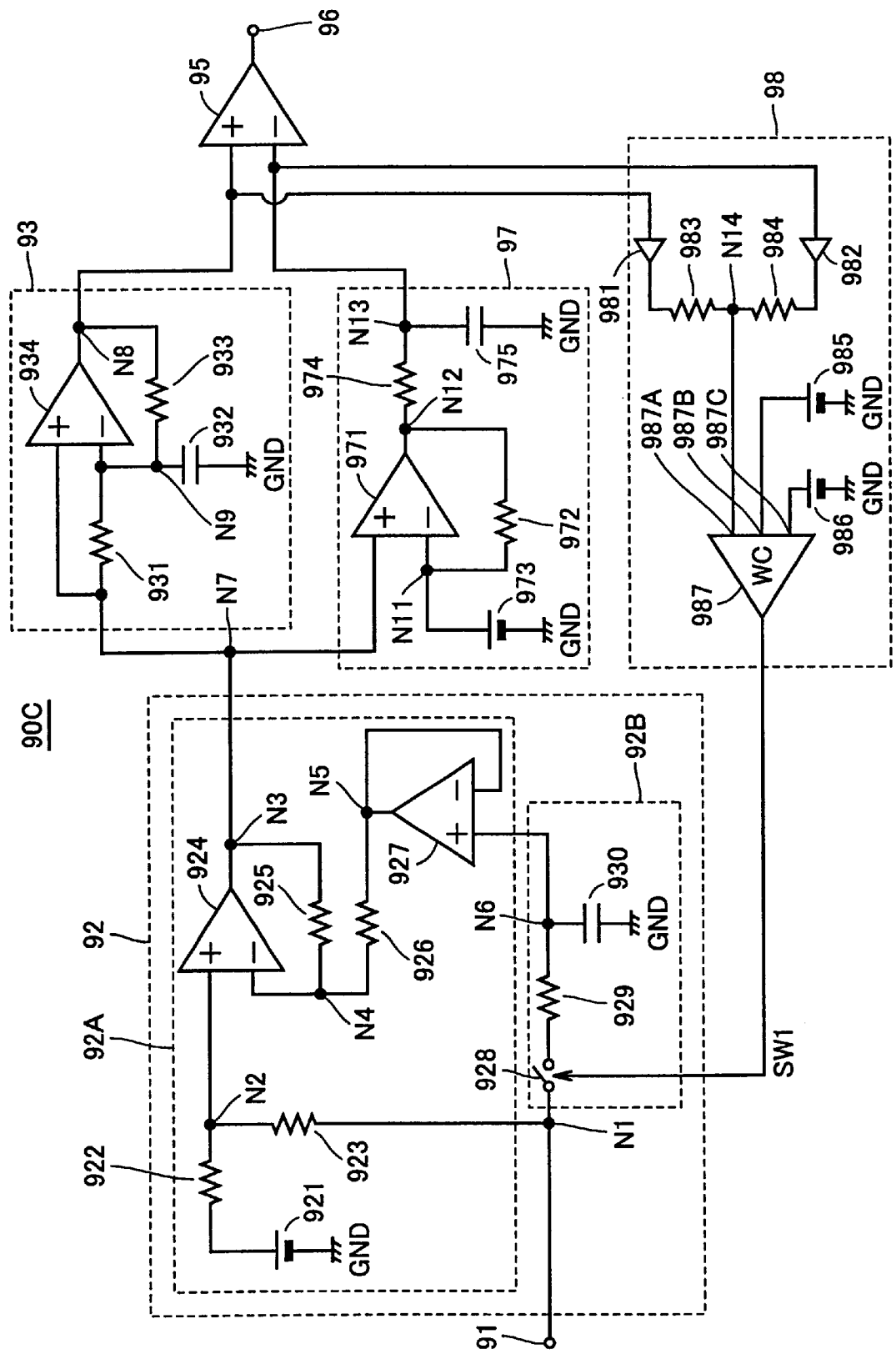
FIG. 16 is a circuit diagram of a DC component adjusting circuit, an integrator, a comparator, an average potential detecting circuit and a voltage difference detecting circuit shown in FIG. 15.

FIG. 16 is a circuit diagram showing DC component adjusting circuit 92, integrator 93, comparator 95, average potential detecting circuit 97 and voltage difference detecting circuit 98 shown in FIG. 15. DC component adjusting circuit 92, integrator 93, comparator 95 and average potential detecting circuit 97 are the same as those already described, and description thereof is not repeated.

Referring to FIG. 16, voltage difference detecting circuit 98 includes buffers 981 and 982, resistances 983 and 984, power supplies 985 and 986, and a window comparator 987. Buffer 981 is connected between node N8 and resistance 983. Buffer 981 provides the output signal of integrator 93 to resistance 983 as it is.

Buffer 982 is connected between node N13 and resistance 984. Buffer 982 sends the output signal of average potential detecting circuit 97 to resistance 984 as it is.

Resistances 983 and 984 are connected in series between buffers 981 and 982. A ratio between resistance values of resistances 983 and 984 is set to 1:1. Therefore, the voltage dividing circuit formed of resistances 983 and 984 detects the voltage difference between the output signal of integrator 93 and the output signal of average potential detecting circuit 97, and provides a divided voltage, which is produced by halving the detected voltage difference, from node N14.

A voltage supply 985 is connected between an input terminal 987B of window comparator 987 and ground node GND. Voltage supply 985 supplies a uniform voltage Vref2. A voltage supply 986 is connected between an input terminal 987C of window comparator 987 and ground node GND. Voltage supply 986 supplies a uniform voltage Vref3 lower than uniform voltage Vref2.

Window comparator 987 receives on its input terminal 987A the voltage placed on node N14, receives uniform voltage Vref2 on its input terminal 987B and receives uniform voltage Vref3 on its input terminal 987C.

Figure 17:
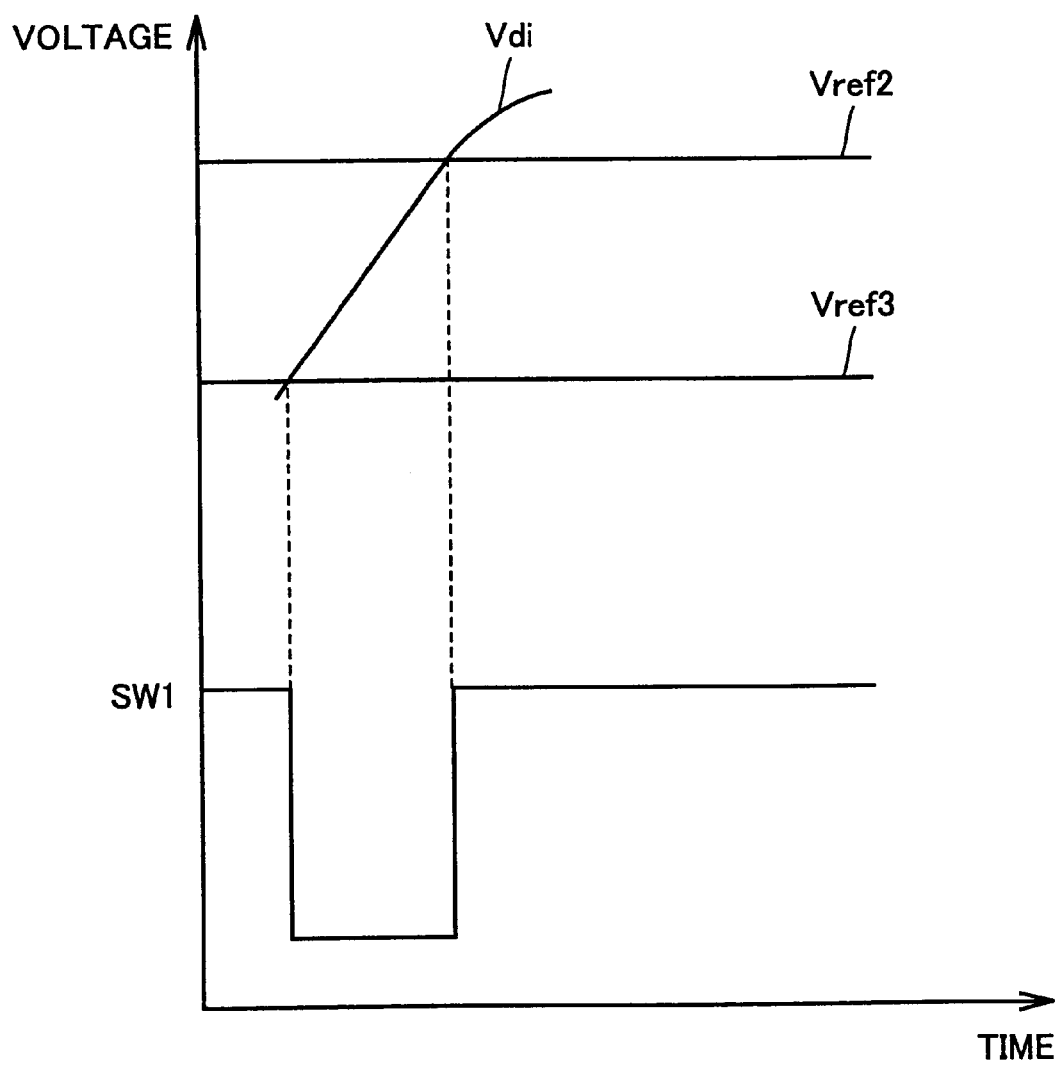
FIG. 17 is a timing chart of signals for illustrating an operation of the voltage difference detecting circuit shown in FIGS. 15 and 16.

Referring to FIG. 17, description will now be given on the operation of window comparator 987. Window comparator 987 compares a divided voltage Vdi received on input terminal 987A with uniform voltage Vref2 received on input terminal 987B and uniform voltage Vref3 received on input terminal 987C, and provides signal SW1 formed of the logical level corresponding to results of the comparison to switch 928. Divided voltage Vdi is produced by halving the voltage difference between the output signals of integrator 93 and average potential detecting circuit 97.

More specifically, window comparator 987 provides signal SW1 at L-level when divided voltage Vdi is equal to or higher than uniform voltage Vref3, and is equal to or lower than uniform voltage Vref2. When divided voltage Vdi is lower than uniform voltage Vref3, or is higher than uniform voltage Vref2, window comparator 987 provides signal SW1 at H-level. Thus, window comparator 987 provides signal SW1 at L-level when divided voltage Vdi falls within a predetermined range between uniform voltages Vref3 and Vref3, and provides signal SW1 at H-level when divided voltage Vdi falls outside the predetermined range.

As described above, voltage difference detecting circuit 98 provides signal SW1 at L-level to switch 928 of sample hold circuit 92B when the voltage difference between the output signals of integrator 93 and average potential detecting circuit 97 falls within the predetermined range, and provides signal SW1 at H-level to switch 928 of sample hold circuit 92B when the voltage difference between the output signals of integrator 93 and average potential detecting circuit 97 falls outside the predetermined range.

Figure 18:
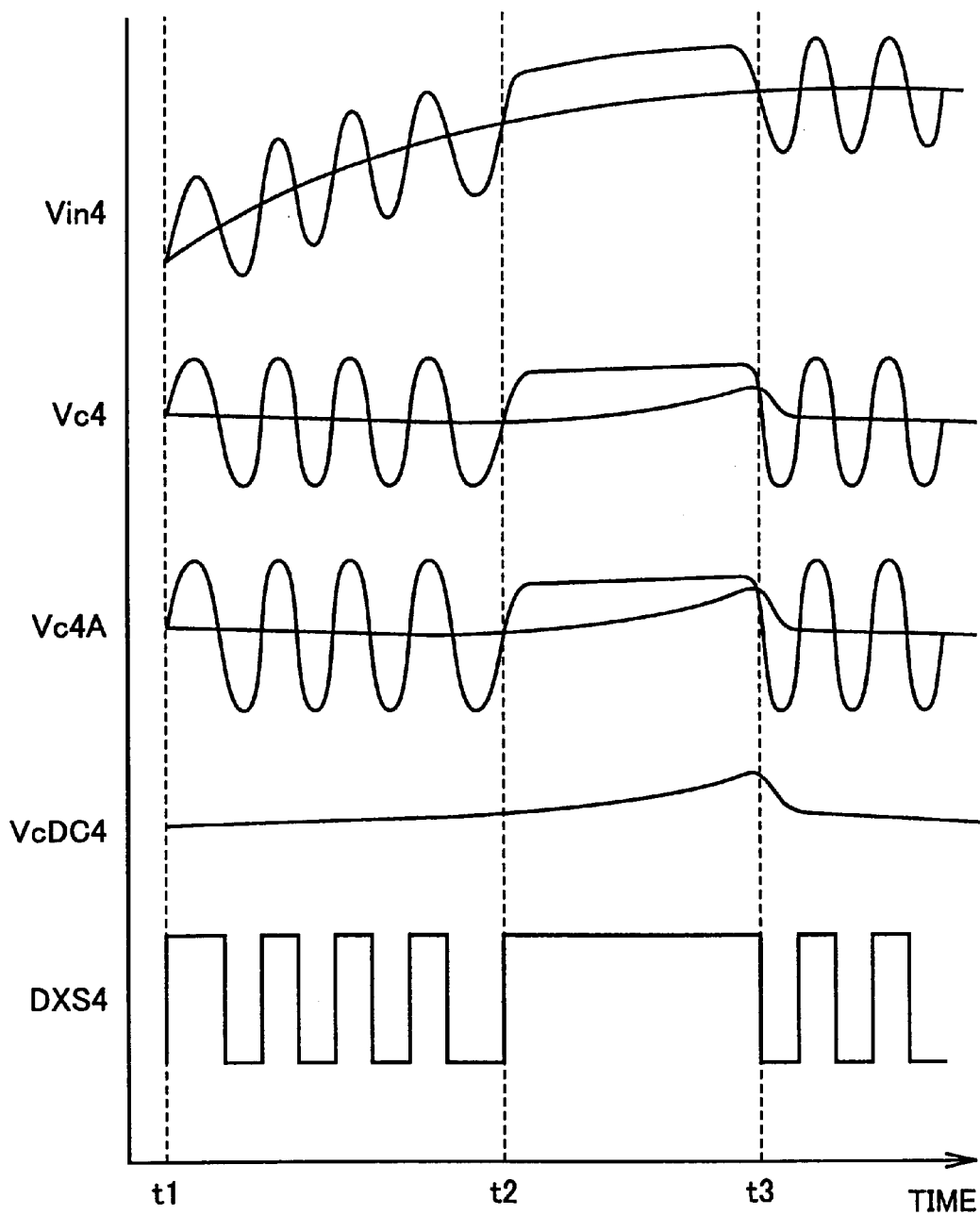
FIG. 18 is a timing chart of signals for illustrating an operation of the slice circuit shown in FIG. 14.

Referring to FIG. 18, description will now be given on the operation of slice circuit 90C. When an input signal Vin4 is applied to DC component adjusting circuit 92 via input terminal 91, DC component adjusting circuit 92 also receives signal SW1 at H-level from voltage difference detecting circuit 98. During the initial period of reception of input signal Vin4, the voltage difference between the two signals supplied to comparator 95 is small (lower than uniform voltage Vref3) so that voltage difference detecting circuit 98 provides signal SW1 at H-level.

In accordance with signal SW1 at H-level, DC component adjusting circuit 92 produces an input signal Vc4, in which AC components in input signal Vin4 are maintained as they are, and DC components are converted to the DC components formed of the uniform voltage level, and provides it to node N7.

Integrator 93 receives input signal Vc4 from DC component adjusting circuit 92, amplifies only the high frequency components of or above the predetermined frequency in input signal Vc4, and provides a signal Vc4A thus produced to the noninverting input terminal of comparator 95 and voltage difference detecting circuit 98. Average potential detecting circuit 97 receives input signal Vc4 from DC component adjusting circuit 92, attenuates the amplitude of input signal Vc4 and detects the average voltage of the signal having the attenuated amplitude. Average potential detecting circuit 97 provides a signal VcDC4 formed of the detected average voltage to the inverting input terminal of comparator 95 and voltage difference detecting circuit 98.

At timing t2, the voltage difference between signal Vc4A sent from integrator 93 and signal VcDC4 sent from average potential detecting circuit 97 falls within the predetermined range so that voltage difference detecting circuit 98 provides signal SW1 at L-level to DC component adjusting circuit 92 in the manner already described. In accordance with signal SW1 at L-level, DC component adjusting circuit 92 produces input signal Vc4, in which the voltage level of DC components at timing t2 is maintained in accordance with signal SW1 at L-level, and the DC components change in accordance with the change in DC offset in input signal Vin4, and provides it to node N7.

During a period from timing t2 to timing t3, integrator 93 performs the foregoing operation, and provides signal Vc4A to the noninverting input terminal of comparator 95 and voltage difference detecting circuit 98. Average potential detecting circuit 97 provides signal VcDC4 to the inverting input terminal of comparator 95 and voltage difference detecting circuit 98.

Immediately before timing t3, the voltage difference between signal Vc4A sent from integrator 93 and signal VcDC4 sent from average potential detecting circuit 97 becomes lower than uniform voltage Vref3, and falls outside the predetermined range, so that voltage difference detecting circuit 98 provides signal SW1 at H-level to DC component adjusting circuit 92.

At timing t3, DC component adjusting circuit 92 produces input signal Vc4, in which the AC components in input signal Vin4 are maintained, and the DC components are changed to the DC components formed of the uniform voltage level, in accordance with signal SW1 at H-level, and provides it to node N7.

Thereafter, integrator 93 and average potential detecting circuit 97 perform the same operations as those already described. Thus, integrator 93 provides signal Vc4A to the noninverting input terminal of comparator 95 and voltage difference detecting circuit 98, and average potential detecting circuit 97 provides signal VcDC4 to the inverting input terminal of comparator 95 and voltage difference detecting circuit 98.

Thereby, comparator 95 accurately compares the voltage of signal Vc4A sent from integrator 93 with the voltage of signal VcDC4 sent from average potential detecting circuit 97 throughout the period, and provides a digital signal DXS4 having the logical level corresponding to results of the comparison to output terminal 96. Thereby, the operation of slice circuit 90C ends.

In slice circuit 90C, since voltage difference detecting circuit 98 provides signal SW1 to switch 928 of DC component adjusting circuit 92, it is not necessary to use control circuit 110, and switch 928 of sample hold circuit 92B can be automatically switched in accordance with the voltage difference between the two signals supplied to comparator 95.

When the voltage difference between the two signals supplied to comparator 95 falls outside the predetermined range, the DC components in the input signal are changed to the DC components formed of the uniform voltage level. Based on the input signal, in which the DC components have the uniform voltage level, integrator 93 amplifies the high frequency components in the input signal, and average potential detecting circuit 97 detects the average voltage of the input signal. Therefore, comparator 95 can always compare the voltage of output signal of integrator 93 with the voltage of output signal of average potential detecting circuit 97, and can accurately convert the input signal from the analog signal to the digital signal.

The operation of receiver 100C is the same as that of receiver 100 except for that the operation of slice circuit 90 is replaced with the operation of slice circuit 90C.

Structures and operations other than the above are the same as those in the first and third embodiments.

According to the fifth embodiment, the slice circuit includes the DC component adjusting circuit for selectively performing the signal processing, in which the AC components in the input signal are maintained as they are, and the DC components are changed to the DC components formed of the uniform voltage level, and the signal processing of providing the input signal, in which the DC components change in accordance with the DC offset in the input signal. Also, the slice circuit includes the average potential detecting circuit attenuating the amplitude of the input signal and detecting the average voltage of the attenuated input signal, and the voltage difference detecting circuit producing the signal, which switches the signal processing in the DC component adjusting circuit, in accordance with the voltage difference between the two signals supplied to the comparator. Therefore, the single slice circuit can achieve the following three effects.

(a) Even when input signal Vin contains the drift of DC offset, the drift of DC offset can be removed, and input signal Vin can be accurately followed and converted from the analog signal to the digital signal.

(b) Even when the input signal contains components formed of a succession of uniform voltage levels, the input signal can be accurately converted from the analog signal to the digital signal.

(c) Even when the input signal contains noise components, erroneous detection of noise components can be prevented.

Sixth Embodiment

Figure 19:
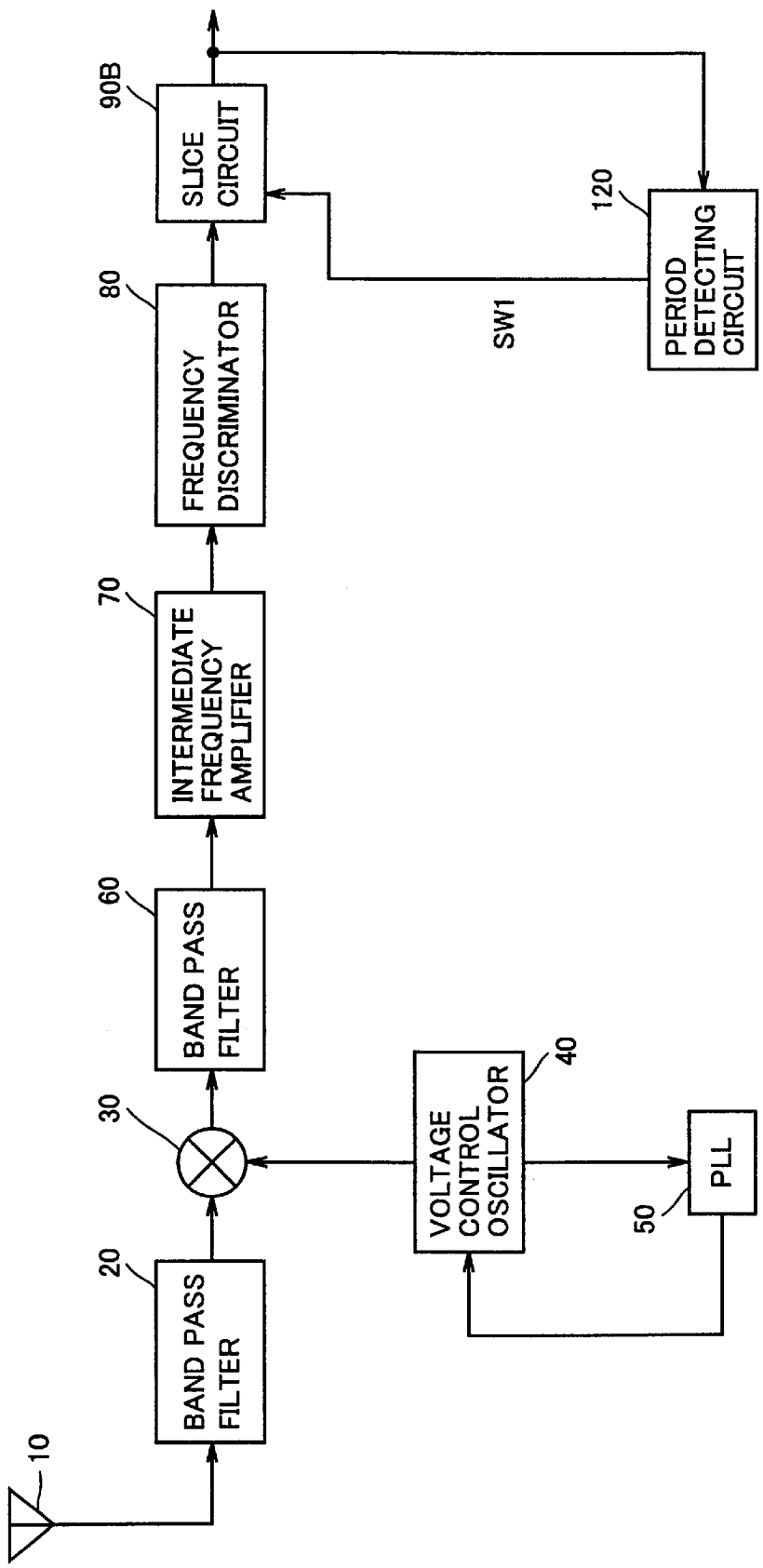
FIG. 19 is a schematic block diagram of a receiver according to a sixth embodiment.

Referring to FIG. 19, a receiver 100D according to a sixth embodiment is the same as receiver 100 except for that control circuit 110 in receiver 100 is removed, and slice circuit 90 in receiver 100 is replaced with slice circuit 90B.

Although a period detecting circuit 120 is shown in FIG. 19, period detecting circuit 120 is included in a base band portion arranged in a stage next to receiver 100D, and is not included in receiver 100D.

Period detecting circuit 120 detects a period, for which H-level continues in the digital signal issued from slice circuit 90B, or a period, for which L-level continues in the above digital signal, and provides signal SW1 at H-level to slice circuit 90B when the detected period falls outside a predetermined range. When the detected period falls within the predetermined range, period detecting circuit 120 provides signal SW1 at L-level to slice circuit 90B.

Figure 20:
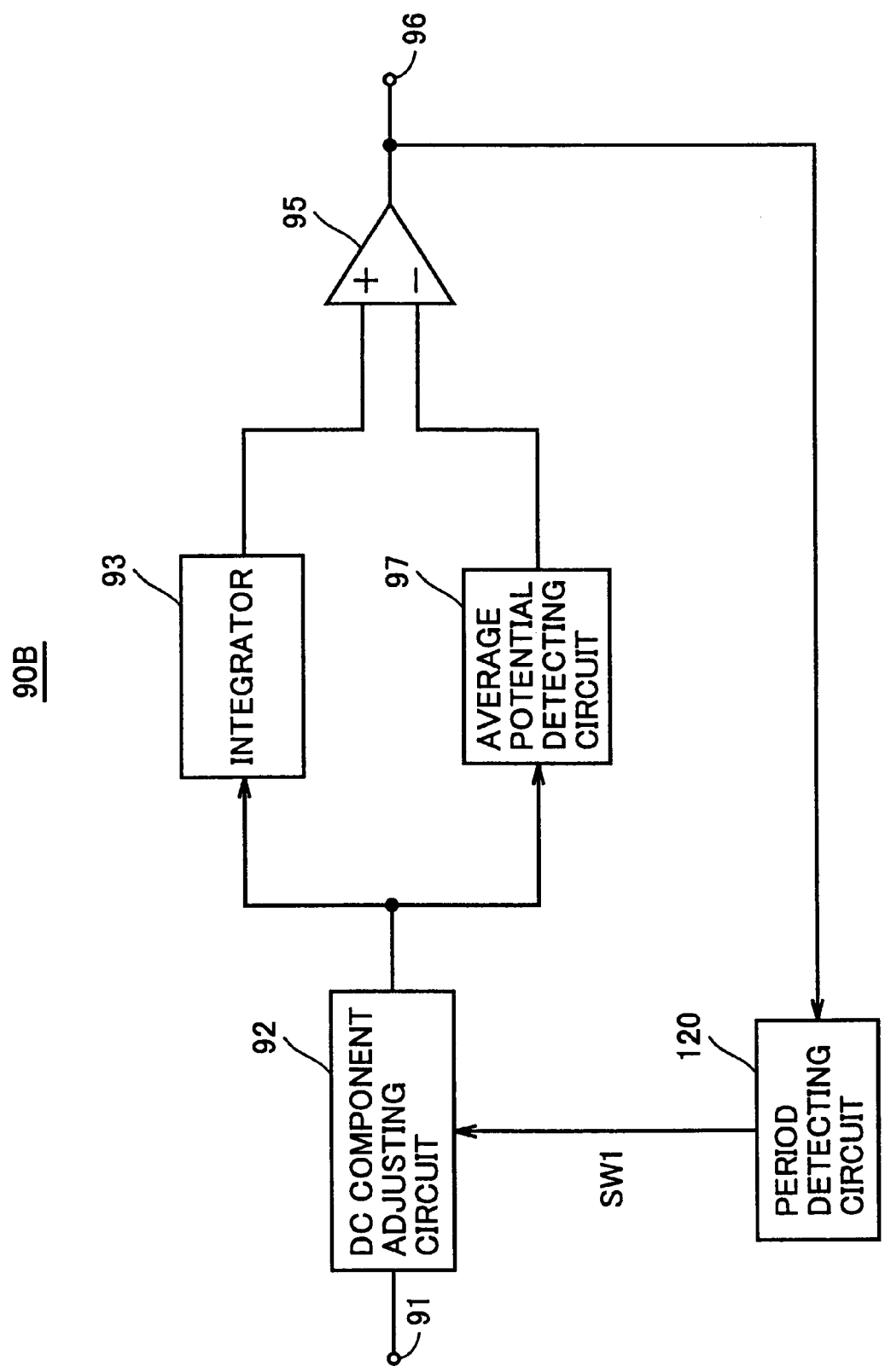
FIG. 20 is a block diagram of a slice circuit shown in FIG. 19.

Referring to FIG. 20, slice circuit 90B includes DC component adjusting circuit 92, integrator 93, comparator 95 and average potential detecting circuit 97. DC component adjusting circuit 92, integrator 93, comparator 95 and average potential detecting circuit 97 perform the same functions as those already described in connection with the third embodiment.

DC component adjusting circuit 92 processes the input signal in accordance with the logical level of signal SW1 sent from period detecting circuit 120. In accordance with signal SW1 at H-level sent from period detecting circuit 120, DC component adjusting circuit 92 maintains the AC components in the input signal as they are, and changes the DC components to the DC components formed of the uniform voltage level. DC component adjusting circuit 92 provides the signal, in which the DC components change in accordance with the change in DC offset in the input signal, in accordance with signal SW1 at L-level sent from period detecting circuit 120.

Figure 21:
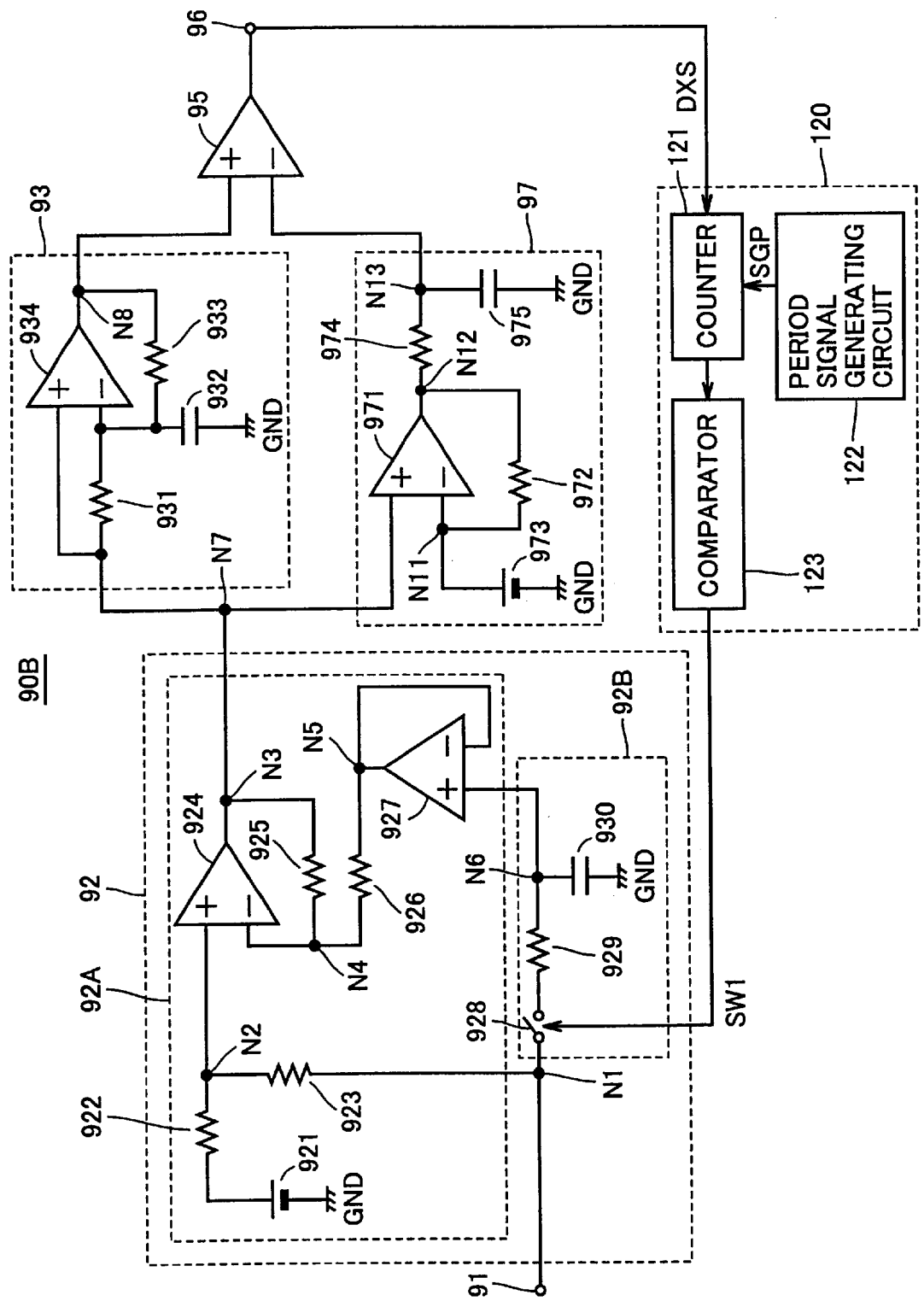

FIG. 21 is a circuit diagram showing DC component adjusting circuit 92, integrator 93, comparator 95 and average potential detecting circuit 97, and also shows period detecting circuit 120 in a block form.

DC component adjusting circuit 92, integrator 93, comparator 95 and average potential detecting circuit 97 have the circuit structures already described.

Referring to FIG. 21, period detecting circuit 120 includes a counter 121, a period signal generating circuit 122 and a comparator 123. Counter 121 receives digital signal DXS from output terminal 96, and receives a period signal SGP from period signal generating circuit 122. Counter 121 counts period signal SGP during a period, for which H-level or L-level continues in digital signal DXS, and provides the count thus obtained to comparator 123.

Period signal generating circuit 122 generates period signal SGP having a uniform period, and provides period signal SGP thus generated to counter 121. Comparator 123 compares the count provided by counter 121 with a reference value. Comparator 123 provides signal SW1 at H-level to DC component adjusting circuit 92 when the count is larger than the reference value, and provides signal SW1 at L-level to DC component adjusting circuit 92 when the count is equal to or lower than, the reference value.

Figure 22:
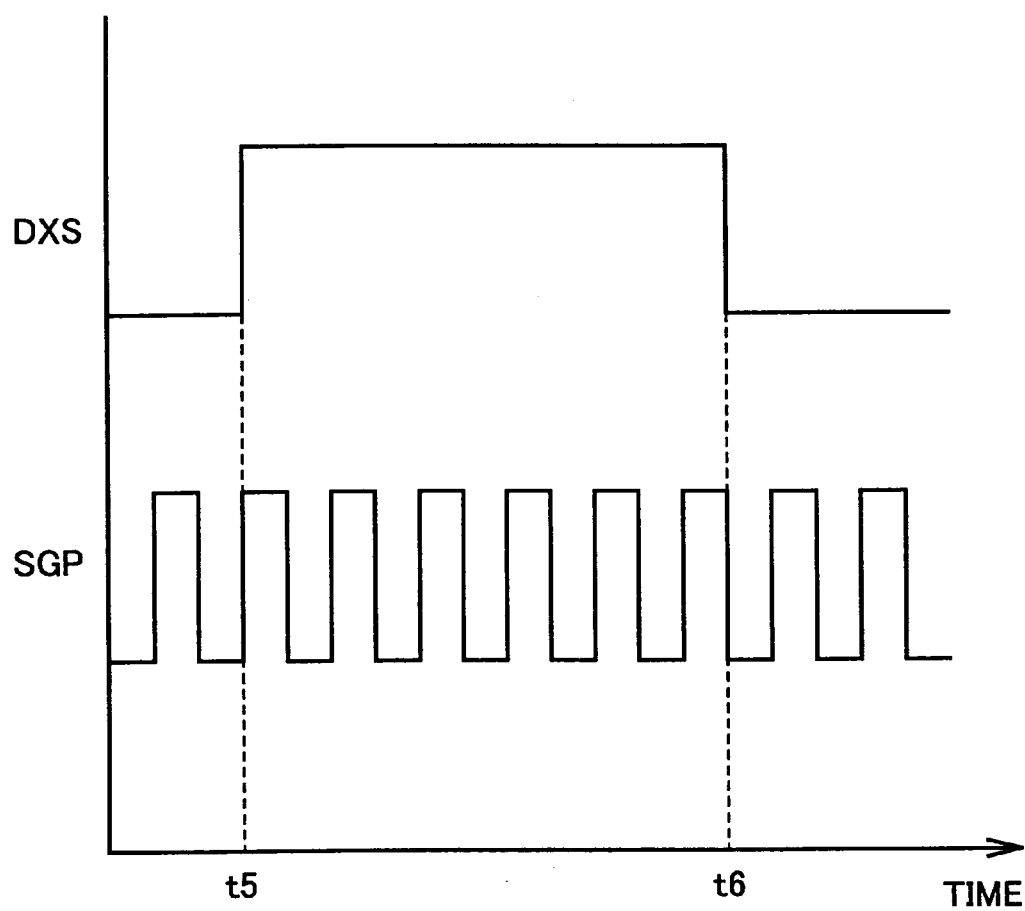
FIG. 22 is a timing chart of signals for illustrating a function of the period detecting circuit shown in FIGS. 20 and 21.

Referring to FIG. 22, an operation in period detecting circuit 120 will now be described. Counter 121 receives digital signal DXS from output terminal 96, and also receives period signal SGP from period signal generating circuit 122. When digital signal DXS changes from L-level to H-level at timing t5, counter 121 starts counting of the components included in period signal SGP, and provides the results to comparator 123.

Then, digital signal DXS changes from H-level to L-level at timing t6 so that counter 121 stops counting. In connection with FIG. 22, it has been described that the components included in period signal SGP are counted when digital signal DXS changes from L-level to H-level. However, counter 121 also starts counting of the components included in period signal SGP when digital signal DXS changes from H-level to L-level. Thus, counter 121 starts counting of the components included in period signal SGP whenever digital signal DXS changes its logical level, and will reset the count for recounting the components included in period signal SGP when a next change occurs in logical level of digital signal DXS.

Thereby, comparator 123 compares the count with the reference value every time it receives the count from counter 121, and provides signal SW1 at H-level to DC component adjusting circuit 92 when the count is larger than the reference value. When the count is equal to or smaller than the reference value, comparator 123 provides signal SW1 at L-level to DC component adjusting circuit 92.

Figure 23:
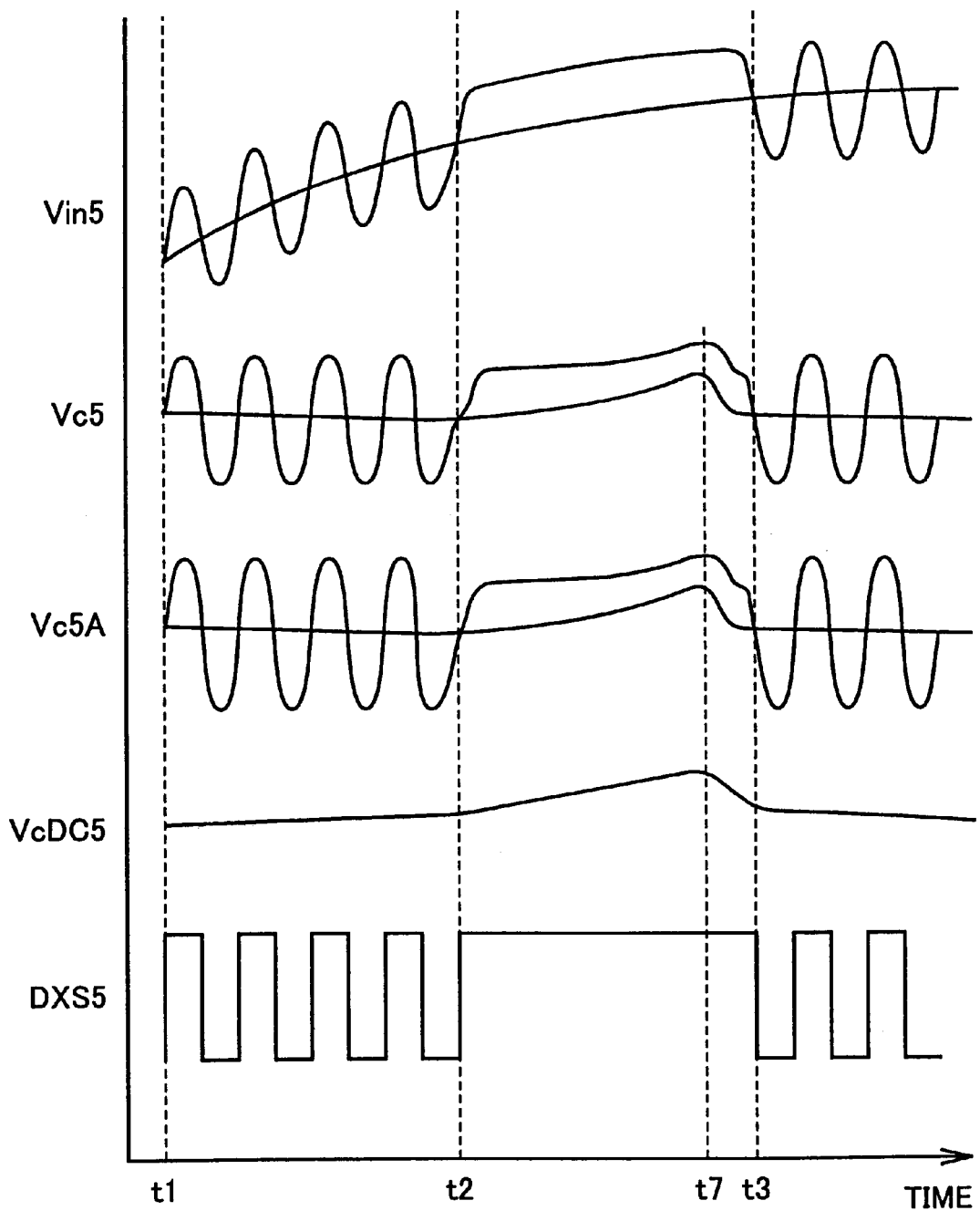
FIG. 23 is a timing chart of signals for illustrating an operation of the slice circuit shown in FIG. 19.

Referring to FIG. 23, the operation of slice circuit 90B in the sixth embodiment will now be described. When an input signal Vin5 is applied to DC component adjusting circuit 92 via input terminal 91, DC component adjusting circuit 92 receives signal SW1 at H-level from period detecting circuit 120. At the start of reception of input signal Vin5, the digital signal provided from slice circuit 90B includes a succession of L-levels so that period detecting circuit 120 provides signal SW1 at H-level.

DC component adjusting circuit 92 provides an input signal Vc5, in which the AC components in input signal Vin5 are maintained as they are, and the DC components are converted to the DC components formed of a uniform voltage level, to node N7 in accordance with signal SW1 at H-level.

Integrator 93 receives input signal Vc5 from DC component adjusting circuit 92, amplifies only the high frequency components of or above the predetermined frequency in input signal Vc5, and provides a signal Vc5A to the noninverting input terminal of comparator 95. Average potential detecting circuit 97 receives input signal Vc5 from DC component adjusting circuit 92, attenuates the amplitude of input signal Vc5, and detects the average voltage of the attenuated signal. Average potential detecting circuit 97 provides a signal VcDC5 formed of the detected average voltage to the inverting input terminal of comparator 95.

Comparator 95 compares the voltage of signal Vc5A sent from integrator 93 with signal VcDC5 sent from average potential detecting circuit 97, and provides a digital signal DXS5 having the logical level corresponding to results of this comparison to output terminal 96.

Period detecting circuit 120 receives digital signal DXS5 via output terminal 96, and counts the components included in period signal SGP when digital signal DXS5 changes from L-level to H-level. During the period from timing t1 to timing t2, since digital signal DXS5 frequently changes from H-level to L-level and vice versa, period detecting circuit 120 provides signal SW1 at L-level to DC component adjusting circuit 92.

After timing t2, H-level continues in digital signal DXS5, and period detecting circuit 120 provides signal SW1 at H-level to DC component adjusting circuit 92 at timing t7 when the period of succession of H-levels exceeds a predetermined range.

Thereby, DC component adjusting circuit 92 provides input signal Vc5, in which the AC components in input signal Vin5 are maintained as they are, and the DC components are converted to the DC components formed of a uniform voltage level, to node N7.

Integrator 93 amplifies only the high frequency components of or above the predetermined frequency in input signal Vc5 sent from DC component adjusting circuit 92, and provides signal Vc5A to the noninverting input terminal of comparator 95. Average potential detecting circuit 97 attenuates the amplitude of signal Vc5 sent from DC component adjusting circuit 92, and detects the average voltage of the signal having the attenuated amplitude. Average potential detecting circuit 97 provides signal VcDC5 formed of the detected average voltage to the inverting input terminal of comparator 95.

Comparator 95 compares the voltage of signal Vc5A sent from integrator 93 with signal VcDC5 sent from average potential detecting circuit 97, and provides digital signal DXS5 having the logical level corresponding to results of the comparison to output terminal 96.

For a period from switching of signal SW1 to L-level at or after timing t1 to timing t7, switch 928 of DC component adjusting circuit 92 is kept off. However, the noninverting input terminal of operational amplifier 927 has a high input resistance. Therefore, operational amplifier 927 continuously provides a voltage nearly equal to the average voltage of input signal Vin, which was present immediately before turn-off of switch 928, for a predetermined period. Accordingly, the DC components in input signal Vc5 do not drift immediately after the turn-off of switch 928, and will slowly drift. During this period, therefore, comparator 95 accurately compares the voltage of signal Vc5A with the voltage of signal VcDC5, and provides digital signal DXS5 corresponding to results of the comparison.

As described above, slice circuit 90B in the sixth embodiment changes the DC components in the input signal to the DC components formed of the uniform voltage level when the output digital signal continuously keeps H- or L-level for a period exceeding a predetermined range. Therefore, even if the input signal contains the components formed of a succession of H- or L-levels, the input signal can be accurately converted from the analog signal to the digital signal.

The reference value in comparator 123 of period detecting circuit 120 may be changed, and may be determined in accordance with the type of the input signal. More specifically, the reference value may be small when the input signal to be converted from the analog signal to the digital signal contains many components having a succession of H- or L-levels. Also, the reference value may be large when the input signal to be converted from the analog signal to the digital signal contains few components having a succession of H- or L-levels. Thereby, the period for providing signal SW1 at H-level by period detecting circuit 120 can be freely changed.

The operation of receiver 100D is the same as that of receiver 100 except for that the operation of slice circuit 90 is replaced with the operation of slice circuit 90B described above.

Structures and operations other than the above are the same as those in the first and third embodiments.

According to the sixth embodiment, the slice circuit includes the DC component adjusting circuit selectively performing the signal processing, in which the AC components in the input signal are maintained as they are, and the DC components are changed to the DC components formed of the uniform voltage level, and the signal processing of providing the input signal, in which the DC components change in accordance with the DC offset in the input signal. Also, the slice circuit includes the average potential detecting circuit attenuating the amplitude of the input signal and detecting the average voltage of the attenuated input signal. The signal processing in the DC component adjusting circuit is switched in accordance with the period, for which H- or L-level continues in the digital signal. Therefore, the single slice circuit can achieve the following three effects.

(a) Even when input signal Vin contains the drift of DC offset, the drift of DC offset can be removed, and input signal Vin can be accurately followed and converted from the analog signal to the digital signal.

(b) Even when the input signal contains components formed of a succession of uniform voltage levels, the input signal can be accurately converted from the analog signal to the digital signal.

(c) Even when the input signal contains noise components, erroneous detection of noise components can be prevented.

Seventh Embodiment

Figure 24:
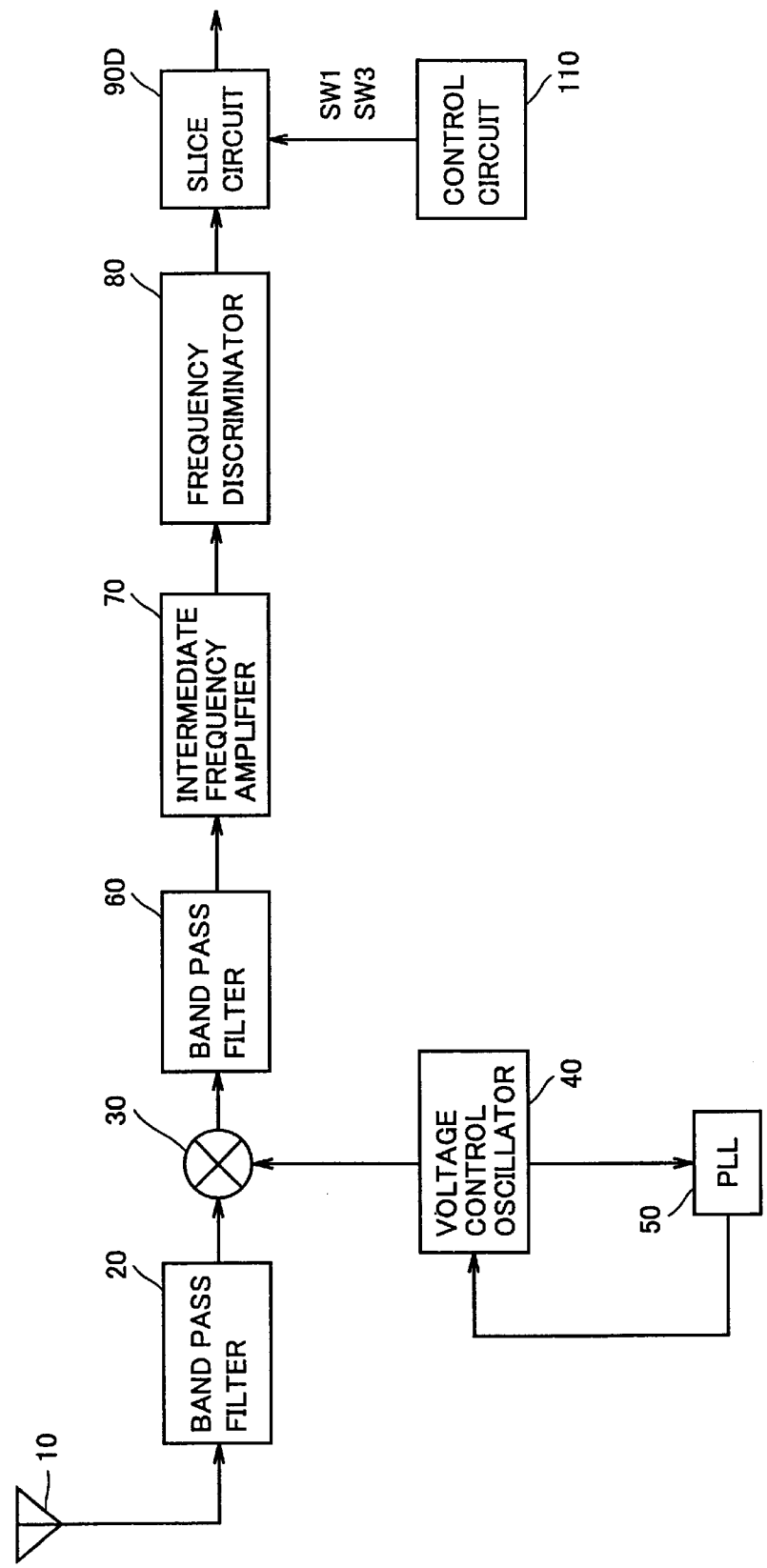
FIG. 24 is a schematic block diagram of a receiver according to a seventh embodiment.

Referring to FIG. 24, a receiver 100E according to a seventh embodiment is the same as receiver 100 except for that slice circuit 90 in receiver 100 is replaced with a slice circuit 90D. In the seventh embodiment, control circuit 110 provides signals SW1 and SW3 to slice circuit 90D.

Figure 25:
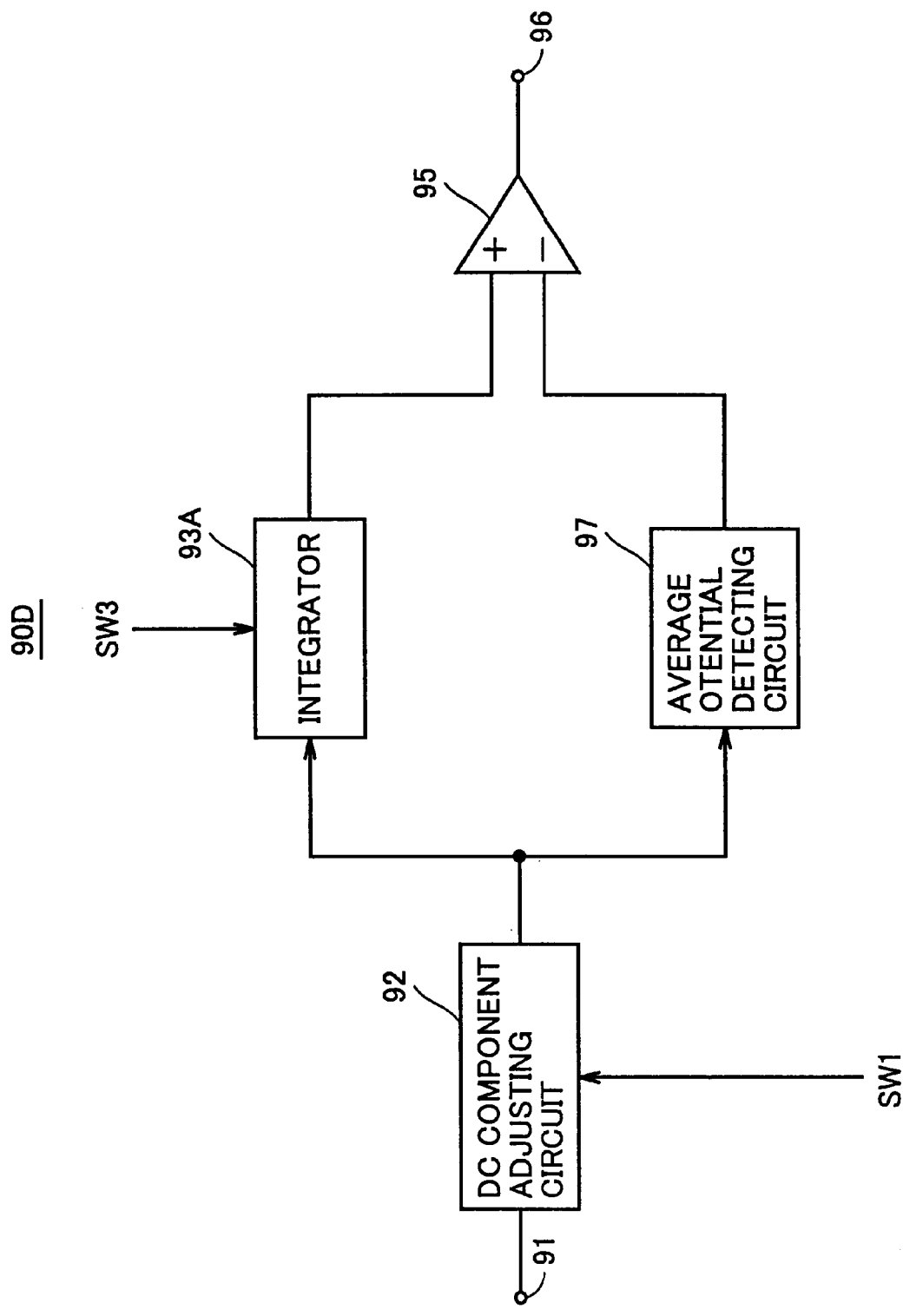
FIG. 25 is a block diagram of a slice circuit shown in FIG. 24.

Referring to FIG. 25, slice circuit 90D includes DC component adjusting circuit 92, an integrator 93A, comparator 95 and average potential detecting circuit 97. DC component adjusting circuit 92, comparator 95 and average potential detecting circuit 97 are the same as those already described.

Integrator 93A amplifies only the high frequency components in the input signal with a gain, which is changed in accordance with the logical level of signal SW3 sent from control circuit 110.

DC component adjusting circuit 92, integrator 93A and average potential detecting circuit 97 form a signal processing circuit.

Figure 26:
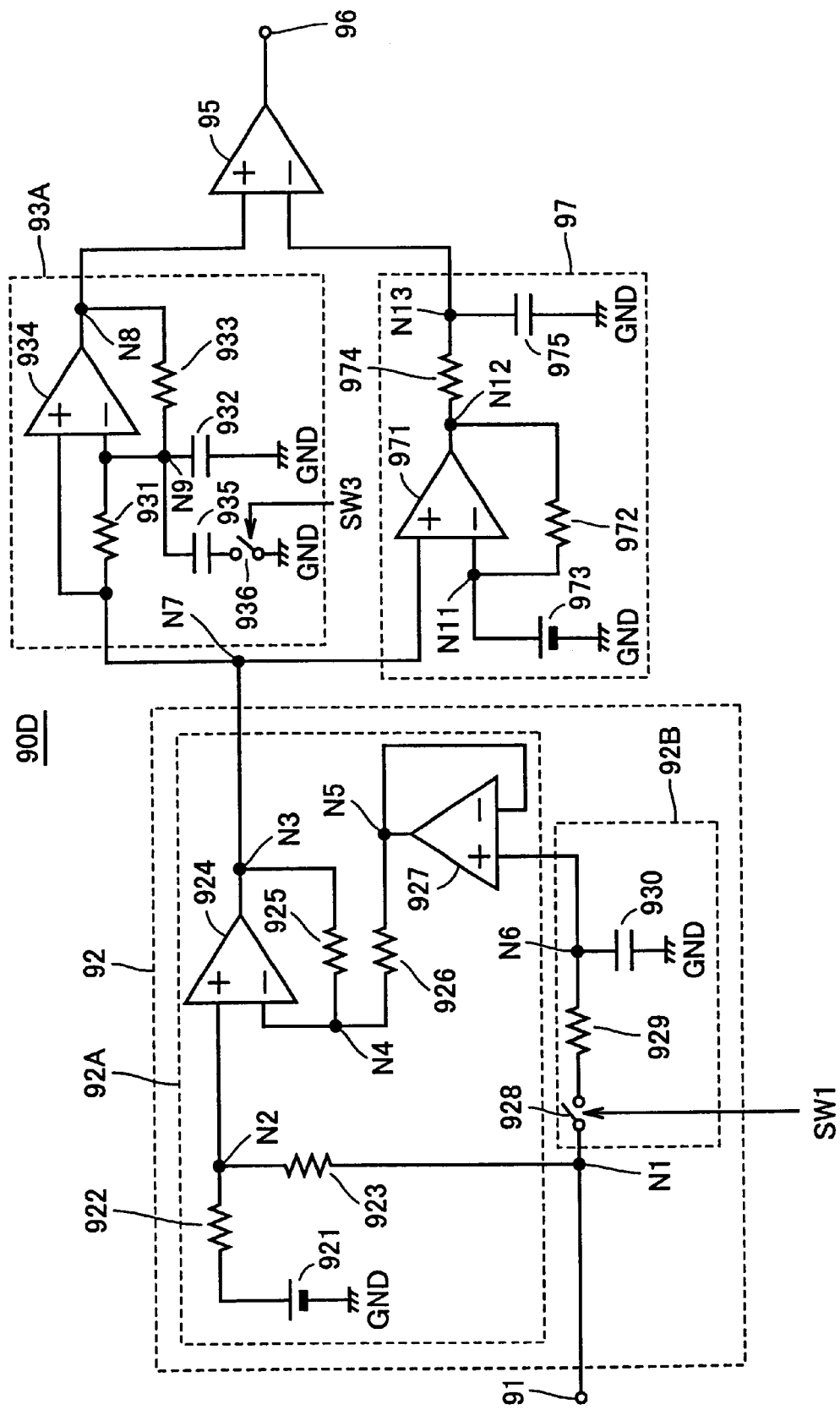
FIG. 26 is a circuit diagram showing a DC component adjusting circuit, an integrator, a comparator and an average potential detecting circuit shown in FIG. 25.

FIG. 26 is a circuit diagram showing DC component adjusting circuit 92, integrator 93A, comparator 95 and average potential detecting circuit 97 shown in FIG. 25. The circuit structures of DC component adjusting circuit 92, comparator 95 and average potential detecting circuit 97 are the same as those already described.

Referring to FIG. 26, integrator 93A is the same as integrator 93 except for that a capacitor 935 and a switch 936 are additionally employed. Capacitor 935 and switch 936 are connected in series between node N9 and ground node GND. Switch 936 is turned on by signal SW3 at H-level sent from control circuit 110, and is turned off by signal SW3 at L-level sent from control circuit 110.

Switch 936 receives signal SW3 at H-level during the initial period of reception of the input signal, and receives signal SW3 at L-level during the latter period of reception of the input signal. During the initial period of the input signal reception, therefore, integrator 93A amplifies only the high frequency components of or above the predetermined frequency in the input signal with an increased gain. During the latter period of the input signal reception, integrator 93A amplifies only the high frequency components in the input signal with a reduced gain.

The operation of slice circuit 90D is the same as that of slice circuit 90B except for that the gain of integrator 93A is switched. During the initial period of the input signal reception, integrator 93A amplifies only the high frequency components in the input signal sent from DC component adjusting circuit 92 to a large extent in accordance with signal SW3 at H-level sent from control circuit 110. During the latter period of the input signal reception, integrator 93A amplifies only the high frequency components in the input signal sent from DC component adjusting circuit 92 to a small extent in accordance with signal SW3 at L-level sent from control circuit 110.

Figure 27:
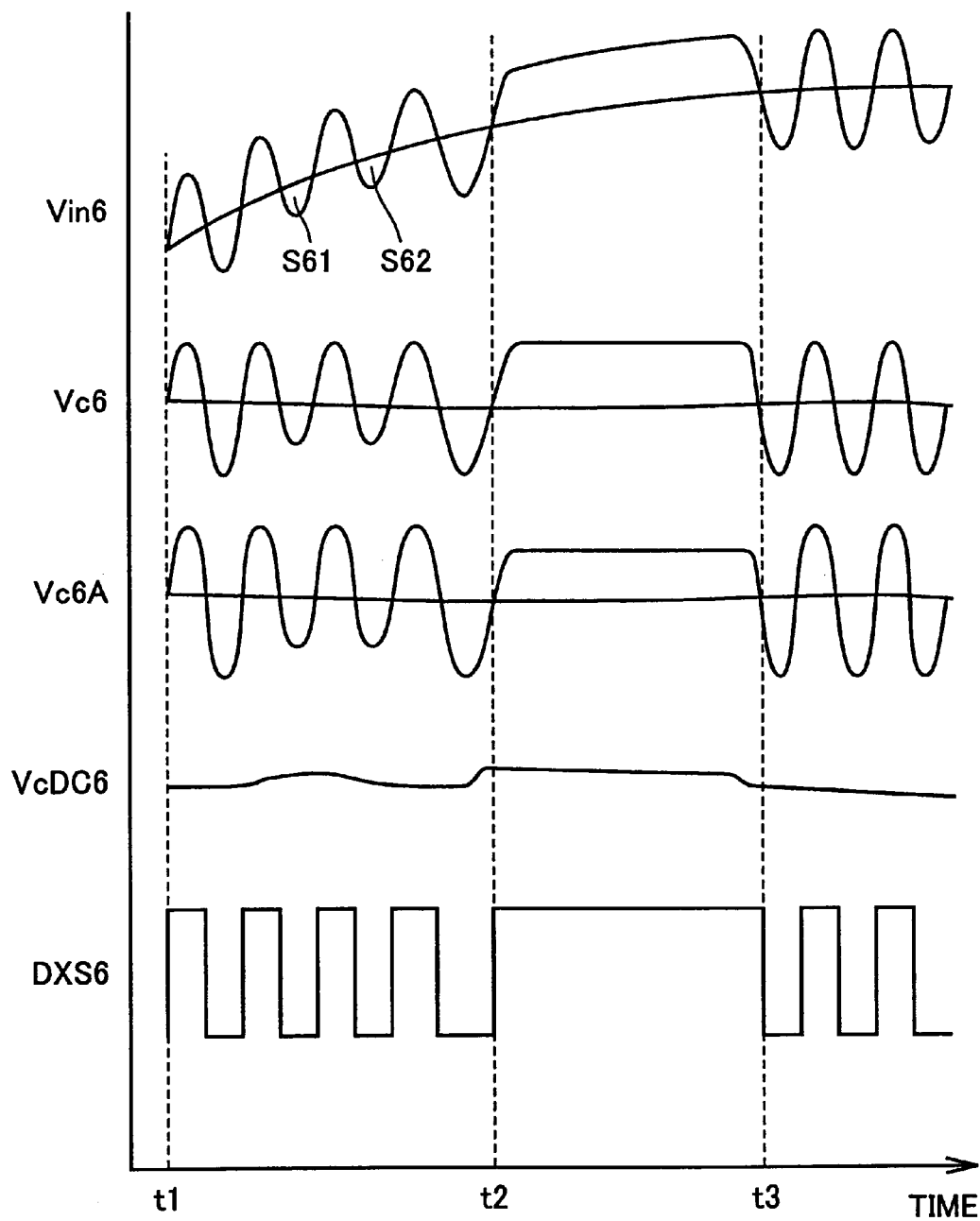
FIG. 27 is a timing chart of signals for illustrating an operation of the slice circuit shown in FIG. 24.

Referring to FIG. 27, the operation of slice circuit 90D will now be described. When an input signal Vin6 is applied to DC component adjusting circuit 92 via input terminal 91, DC component adjusting circuit 92 receives signal SW1 at H-level from control circuit 110. DC component adjusting circuit 92 provides an input signal Vc6, in which the AC components in input signal Vin6 are maintained as they are, and the DC components are converted to the DC components formed of a uniform voltage level, to node N7.

During the initial period of reception of input signal Vin6, integrator 93A receives signal SW3 at H-level from control circuit 110, and switch 93b is turned on. Integrator 93A receives input signal Vc6 from DC component adjusting circuit 92, amplifies only the high frequency components of or above a predetermined frequency in input signal Vc6 to a large extent, and provides a signal Vc6A to the noninverting input terminal of comparator 95.

Average potential detecting circuit 97 receives input signal Vc6 from DC component adjusting circuit 92, attenuates the amplitude of input signal Vc6 and detects the average voltage of the attenuated signal. Average potential detecting circuit 97 provides a signal VcDC6 formed of the detected average voltage to the inverting input terminal of comparator 95.

Comparator 95 compares the voltage of signal Vc6A sent from integrator 93 with signal VcDC6 sent from average potential detecting circuit 97, and provides a digital signal DXS6 having the logical level corresponding to results of the comparison to output terminal 96.

During the initial period of reception of input signal Vin6 (i.e., period from timing t1 to timing t2), integrator 93A amplifies input signal Vc6 to a large extent, and provides signal Vc6A even if input signal Vin6 contains components S61 and S62 of a small amplitude. Therefore, the voltage level of signal Vc6A crosses the voltage level of signal VcDC6, and input signal Vin6 is accurately converted from the analog signal to the digital signal.

After turn-on of receiver 100E, receiver 100E may initially receive input signal Vin6 containing components of a small amplitude. Even in this case, slice circuit 90D accurately converts input signal Vin6 from the analog signal to the digital signal.

During the latter period of reception of input signal Vin6 (after timing t2), the gain of integrator 93A is set smaller than that during the initial period of reception of input signal Vin6 so that erroneous detection of noises is suppressed.

The operation of receiver 100E is the same as that of receiver 100 except for that the operation of slice circuit 90 is replaced with the operation of slice circuit 90D described above.

Structures and operations other than the above are the same as those in the first and third embodiments.

According to the seventh embodiment, the slice circuit includes the DC component adjusting circuit maintaining the AC components in the input signal as they are, and converting the DC components to the DC components formed of the uniform voltage level, the average potential detecting circuit attenuating the amplitude of the input signal and detecting the average voltage of the attenuated input signal, and the integrator significantly amplifying the high frequency components in the input signal during the initial period of the input signal reception, and slightly amplifying the high frequency components in the input signal during the latter period of the input signal reception. Therefore, the single slice circuit can achieve the following three effects.

(a) Even when input signal Vin contains the drift of DC offset, the drift of DC offset can be removed, and input signal Vin can be accurately followed and converted from the analog signal to the digital signal.

(b) Even when the input signal contains components formed of a succession of uniform voltage levels, the input signal can be accurately converted from the analog signal to the digital signal.

(c) Even when the input signal contains noise components, erroneous detection of noise components can be prevented.

Eighth Embodiment

Figure 28:
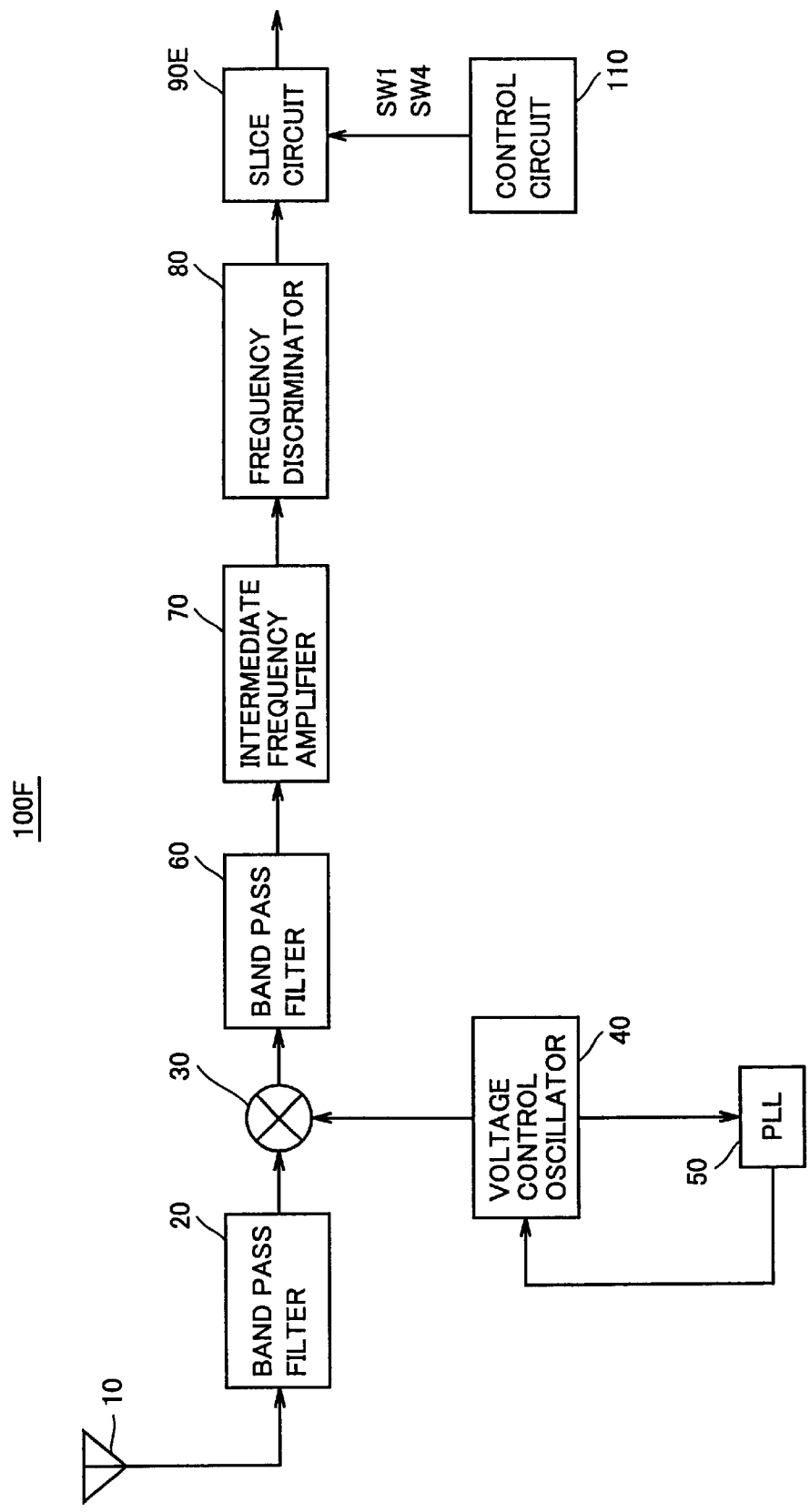
FIG. 28 is a schematic block diagram of a receiver according to an eighth embodiment.

Referring to FIG. 28, a receiver 100F according to an eighth embodiment is the same as receiver 100 except for that slice circuit 90 in receiver 100 is replaced with a slice circuit 90E.

In receiver 100F, control circuit 110 provides signals SW1 and SW4 to slice circuit 90E.

Figure 29:
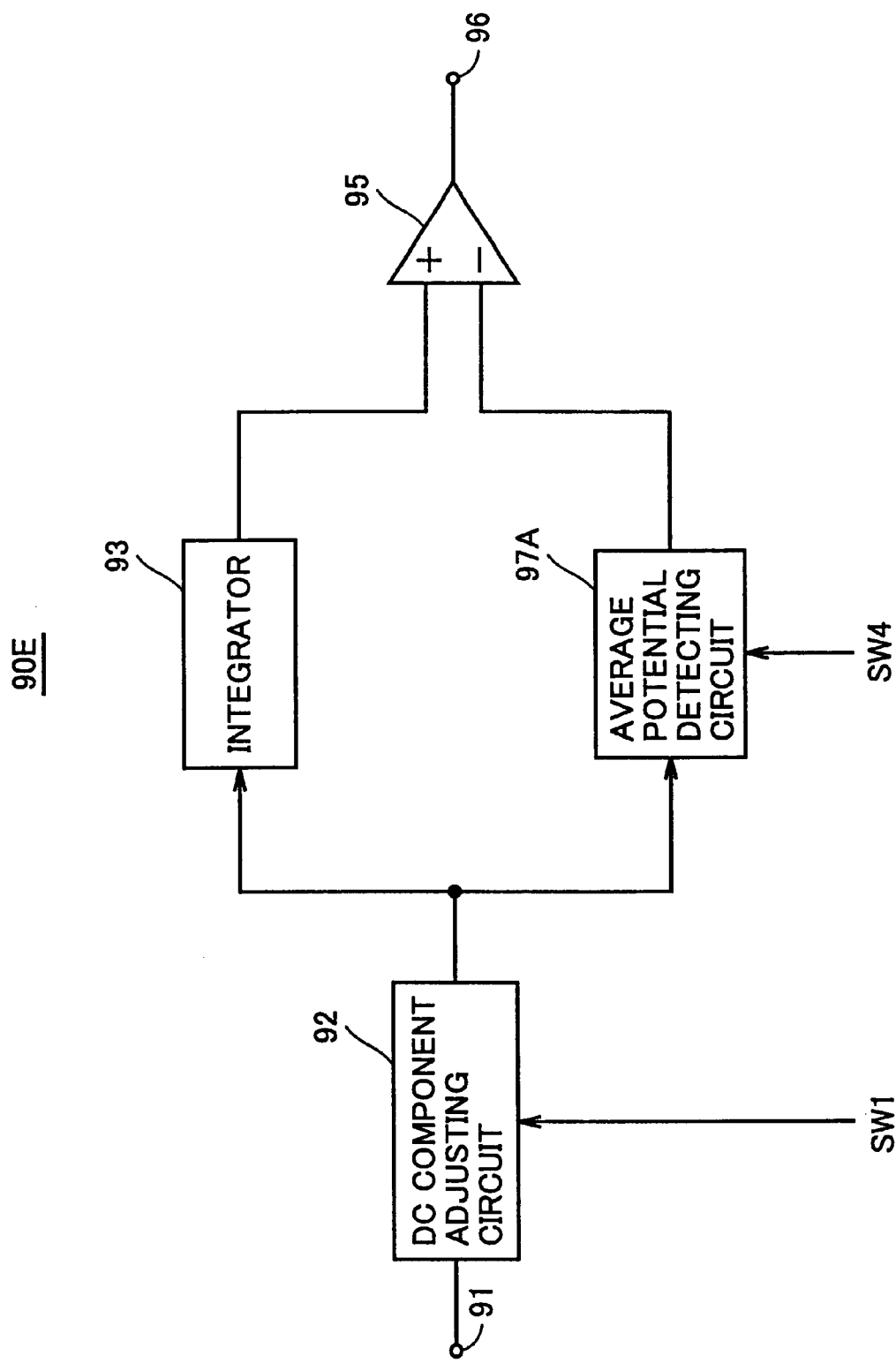
FIG. 29 is a block diagram of a slice circuit shown in FIG. 28.

Referring to FIG. 29, slice circuit 90E includes DC component adjusting circuit 92, integrator 93, comparator 95 and an average potential detecting circuit 97A. Slice circuit 90E is the same as slice circuit 90B in the third embodiment except for that average potential detecting circuit 97 in slice circuit 90B is replaced with average potential detecting circuit 97A.

DC component adjusting circuit 92, integrator 93 and comparator 95 are the same as those already described. Average potential detecting circuit 97A amplifies the input signal with a gain G1 in accordance with signal SW4 at H-level sent from control circuit 110, and detects the average value of the amplified input signal. Average potential detecting circuit 97A amplifies the input signal with a gain G2 in accordance with signal SW4 at L-level sent from control circuit 110, and detects the average voltage of the amplified input signal.

Gains G1 and G2 are smaller than "1", and gain G2 is smaller than gain G1. Thus, gains G1 and G2 satisfy a relationship of 0<G2<G1<1. While keeping the functions of attenuating the amplitude of the input signal, and detecting the average voltage of the attenuated signal, therefore, average potential detecting circuit 97A detects the average voltage by amplifying the input signal to a large extent in response to signal SW4 at H-level, and detects the average voltage by amplifying the input signal to a small extent in response to signal SW4 at L-level.

DC component adjusting circuit 92, integrator 93 and average potential detecting circuit 97A form a signal processing circuit.

Figure 30:
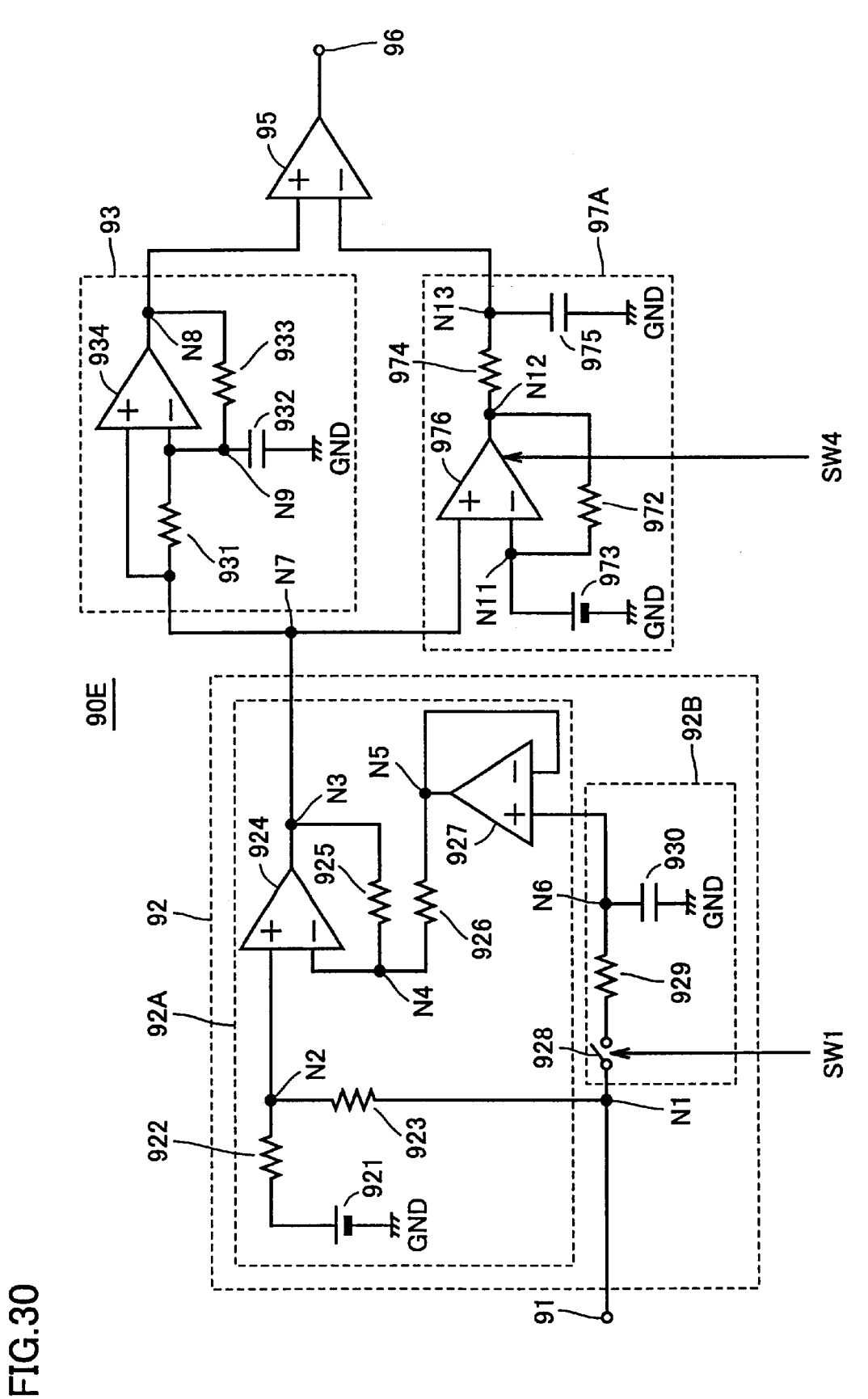
FIG. 30 is a circuit diagram showing a DC component adjusting circuit, an integrator, a comparator and an average potential detecting circuit shown in FIG. 29.

FIG. 30 is a circuit diagram showing DC component adjusting circuit 92, integrator 93, comparator 95 and average potential detecting circuit 97 shown in FIG. 29. The circuit structures of DC component adjusting circuit 92, integrator 93 and comparator 95 are the same as those already described.

Referring to FIG. 30, average potential detecting circuit 97A is the same as average potential detecting circuit 97 shown in FIG. 12 except for that operational amplifier 971 in FIG. 12 is replaced with an operational amplifier 976. Operational amplifier 976 amplifies the input signal with gain G1, which is determined in accordance with signal SW4 at H-level sent from control circuit 110, and provides the amplified input signal to node N12. Also, operational amplifier 976 amplifies the input signal with gain G2, which is determined in accordance with signal SW4 at L-level sent from control circuit 110, and provides the amplified input signal to node N12.

Figure 31:
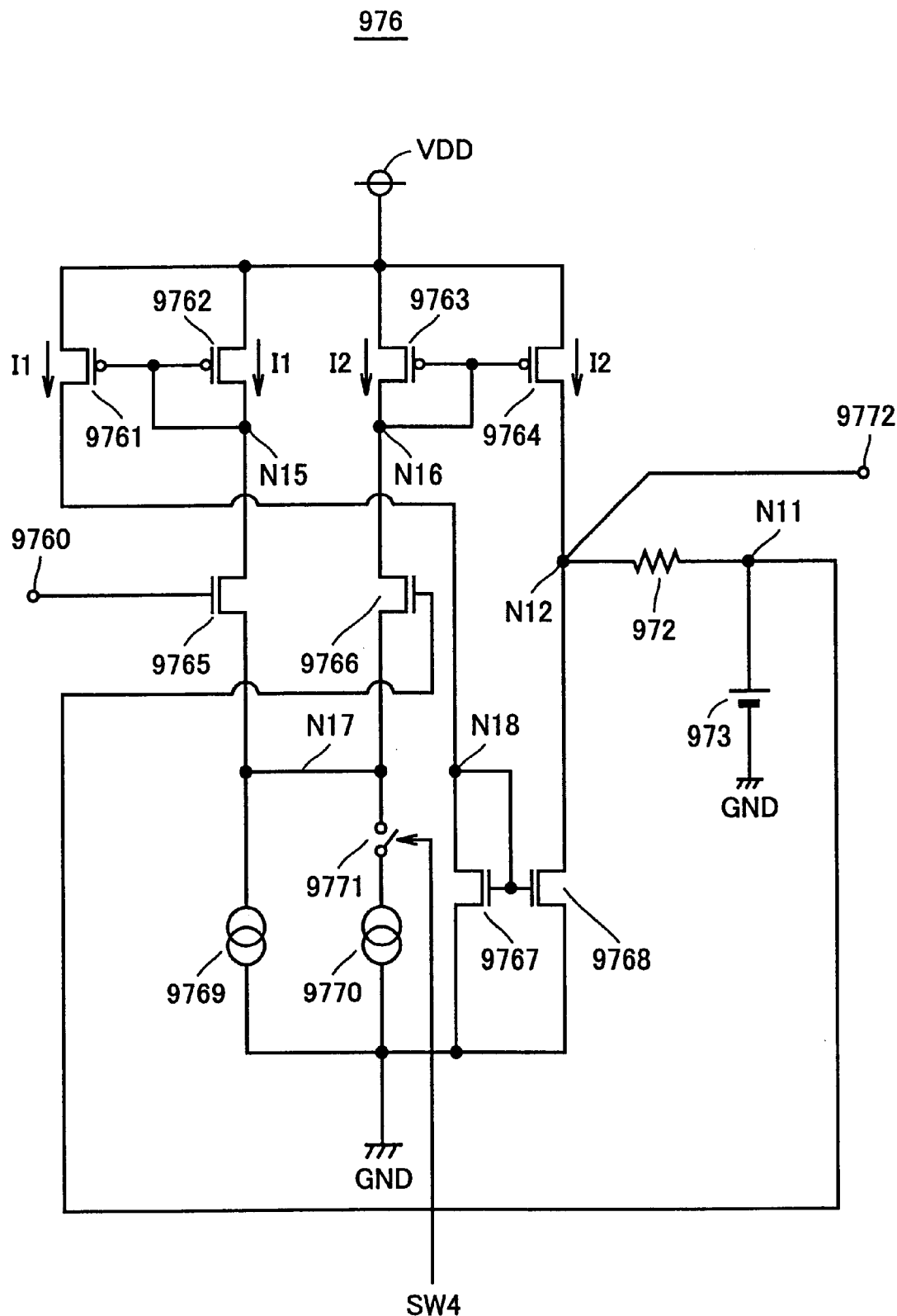
FIG. 31 is a circuit diagram of an operational amplifier included in an average potential detecting circuit shown in FIG. 30.

Referring to FIG. 31, operational amplifier 976 includes P-channel MOS transistors 9761–9764, N-channel MOS transistors 9765–9768, current supplies 9769 and 9770, and a switch 9771.

P- and N-channel MOS transistors 9761 and 9767 are connected in series between power supply node VDD and ground node GND. P- and N-channel MOS transistors 9762 and 9765 are connected in series between power supply node VDD and a node N17. Each of P-channel MOS transistors 9761 and 9762 receives on its gate a voltage placed on a node N15.

P- and N-channel MOS transistors 9763 and 9766 are connected in series between power supply node VDD and node N17. P- and N-channel MOS transistors 9763 and 9766 are connected in parallel to P- and N-channel MOS transistors 9762 and 9765.

P- and N-channel MOS transistors 9764 and 9768 are connected in series between power supply node VDD and ground node GND. N-channel MOS transistors 9767 and 9768 receive on their gate terminals a voltage placed on a node N18. P-channel MOS transistors 9763 and 9764 receive on their gate terminals a voltage placed on a node N16.

Current supply 9769 is connected between node N17 and ground node GND. Current supply 9770 and switch 9771 are connected in series between node N17 and ground node GND. Switch 9771 is turned on in response to signal SW4 at H-level sent from control circuit 110, and is turned off in response to signal SW4 at L-level.

N-channel MOS transistor 9765 receives on its gate terminal a signal supplied to a noninverting input terminal 9760 of operational amplifier 976. N-channel MOS transistor 9766 receives on its gate terminal a signal, which is carried on node N11 and is supplied to an inverting input terminal of operational amplifier 976.

Since P-channel MOS transistors 9761 and 9762 receive on their gate terminals the voltage placed on node N15, the current flowing through P-channel MOS transistor 9761 is equal to the current flowing through P-channel MOS transistor 9762. Since P-channel MOS transistors 9763 and 9764 receive on their gate terminals the voltage placed on node N16, the current flowing through P-channel MOS transistor 9763 is equal to the current flowing through P-channel MOS transistor 9764.

It is assumed that a current I1 flows through P-channel MOS transistors 9761 and 9762, a current I2 flows through P-channel MOS transistors 9763 and 9764, and switch 9771 is off.

In this case, current I1 is larger than current I2 when the voltage placed on the gate terminal of N-channel MOS transistor 9765 is higher than the voltage placed on the gate terminal of N-channel MOS transistor 9766.

Current I1 flowing through P-channel MOS transistor 9761 also flows to N-channel MOS transistor 9767 via node N18. Since N-channel MOS transistors 9767 and 9768 receive on their gate terminals the voltage placed on node N18, the current flowing through N-channel MOS transistor 9768 increases from current I2 to current I1 as a result of current mirror.

Consequently, node N12 is supplied with a large current from power supply node VDD so that the voltage on node N12 rises. When the voltage of input signal is higher than the reference voltage supplied from voltage supply 973, operational amplifier 976 provides a voltage higher than the voltage, which is placed on node N12 when current I2 flows, to an output terminal 9772.

Conversely, when the voltage applied to the gate terminal of N-channel MOS transistor 9765 is lower than the voltage applied to the gate terminal of N-channel MOS transistor 9766, current I1 is smaller than current I2.

In this case, the current flowing through N-channel MOS transistor 9768 decreases from current I2 to current I1 as a result of current mirror of the currents flowing through N-channel MOS transistors 9767 and 9768, respectively. Thereby, the voltage on node N12 lowers. Thus, when the voltage of the input signal is lower than the reference voltage supplied from voltage supply 973, operational amplifier 976 provides the voltage lower than the voltage, which is placed on node N12 when current I2 flows, to output terminal 9772.

When switch 9771 is on in response to signal SW4, current I1 flowing through P- and N-channel MOS transistors 9762 and 9765 flow to both current supplies 9769 and 9770 via node N17. Current I2 flowing through P- and N-channel MOS transistors 9763 and 9766 flows to both current supplies 9769 and 9770 via node N17.

When the voltage applied to the gate terminal of N-channel MOS transistor 9765 is higher than the voltage applied to the gate terminal of N-channel MOS transistor 9766, current I1 increases from a value attained in the off state of switch 9771, and a difference between currents I1 and I2 increases from a value attained in the off state of switch 9771. As a result, the voltage on node N12 further increases from a value attained in the off state of switch 9771.

When the voltage applied to the gate terminal of N-channel MOS transistor 9765 is lower than the voltage applied to the gate terminal of N-channel MOS transistor 9766, current I2 increases from a value attained in the off state of switch 9771, and a difference between currents I1 and I2 increases from a value attained in the off state of switch 9771. As a result, the voltage on node N12 further lowers from the value attained in the off state of switch 9771.

Therefore, the gain of operational amplifier 976 increases when switch 9771 is turned on in response to signal SW4.

In the eighth embodiment, control circuit 110 provides signal SW4 at H-level to slice circuit 90E during the initial period of the input signal reception, and provides signal SW4 at L-level to slice circuit 90E during the latter period of the input signal reception.

Thereby, average potential detecting circuit 97A of slice circuit 90E detects the average voltage by amplifying the input signal with large gain G1 during the initial period of the input signal reception, and detects the average voltage by amplifying the input signal with small gain G2 during the latter period of the input signal reception.

Figure 32:
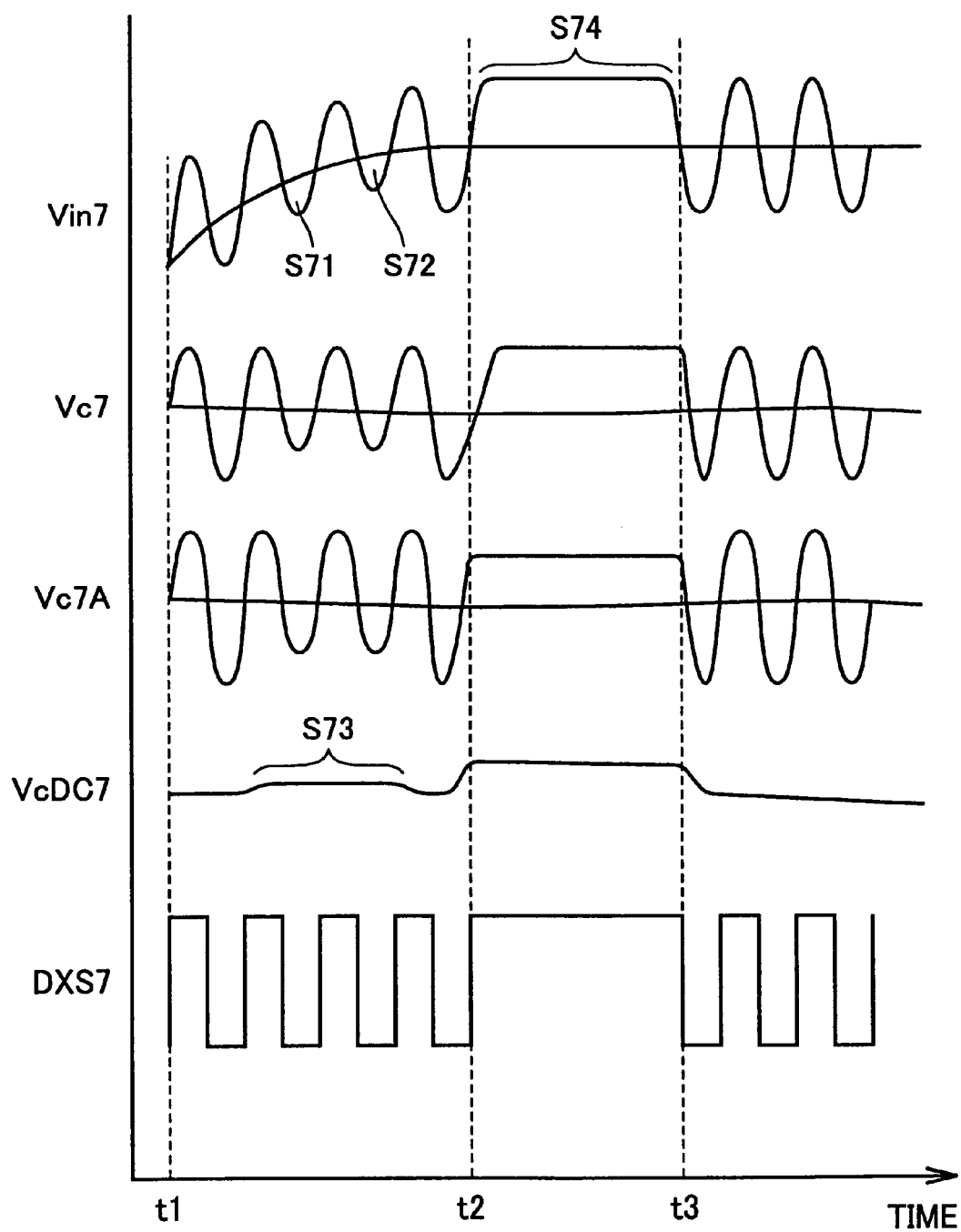
FIG. 32 is a timing chart of signals for illustrating an operation of the slice circuit shown in FIG. 28.

Referring to FIG. 32, the operation of slice circuit 90E will now be described. When an input signal Vin7 is applied to DC component adjusting circuit 92 via input terminal 91, DC component adjusting circuit 92 receives signal SW1 at H-level from control circuit 110. DC component adjusting circuit 92 provides an input signal Vc7, in which the AC components in input signal Vin7 are maintained as they are, and the DC components are converted to the DC components formed of a uniform voltage level, to node N7.

Integrator 93 receives input signal Vc7 from DC component adjusting circuit 92, amplifies only the high frequency components of or above a predetermined frequency in input signal Vc7, and provides a signal Vc7A to the noninverting input terminal of comparator 95. Average potential detecting circuit 97A receives input signal Vc7 from DC component adjusting circuit 92, attenuates the amplitude of input signal Vc7 and detects the average voltage of the attenuated signal. Average potential detecting circuit 97A provides a signal VcDC7 formed of the detected average voltage to the inverting input terminal of comparator 95.

During the initial period of reception of input signal Vc7 (i.e., period from timing t1 to timing t2), average potential detecting circuit 97A amplifies input signal Vc7 with gain G1 selected in accordance with signal SW4 at H-level sent from control circuit 110, and detects the average voltage of input signal Vc7 thus amplified. During the latter period of reception of input signal Vc7 (after timing t2), average potential detecting circuit 97A amplifies input signal Vc7 with gain G2 selected in accordance with signal SW4 at L-level sent from control circuit 110, and detects the average voltage of input signal Vc7 thus amplified.

Comparator 95 compares the voltage of signal Vc7A sent from integrator 93 with signal VcDC7 sent from average potential detecting circuit 97A, and provides a digital signal DXS7 having the logical level corresponding to results of the comparison to output terminal 96.

In the initial period of reception of input signal Vin7, input signal Vin7 may contain components S71 and S72 having small amplitudes. Even in this case, average potential detecting circuit 97A amplifies input signal Vc7 with gain G1, which is large but is smaller than 1, and detects the average voltage of amplified input signal Vc7. Therefore, an average voltage S73 corresponding to components S71 and S72 shifts toward the peak value of input signal Vc7. Consequently, the voltage level of signal VcDC7 provided from average potential detecting circuit 97A necessarily crosses the voltage level of signal Vc7A provided from integrator 93, and comparator 95 can accurately compare the voltage of signal Vc7A with the voltage of signal VcDC7 so that input signal Vin7 can be accurately converted from the analog signal to the digital signal.

After receiver 100F is turned on, receiver 100F may initially receive input signal Vin7 containing components of a small amplitude. Even in this case, slice circuit 90E accurately convert input signal Vin7 from the analog signal to the digital signal.

During the latter period of reception of input signal Vin7, average potential detecting circuit 97A amplifies input signal Vc7 with a gain smaller than the value during the initial reception period (i.e., with gain G2 smaller than 1 and also smaller than gain G1), and detects the average voltage of amplified input signal Vc7. Therefore, comparator 95 can accurately convert input signal Vin7 from the analog signal to the digital signal even when input signal Vin7 contains components S74 corresponding to a signal containing a succession of "1" produced by the FSK modulation.

The operation of receiver 100F is the same as that of receiver 100 except for that the operation of slice circuit 90 is replaced with the operation of slice circuit 90E described above.

Structures and operations other than the above are the same as those in the first and third embodiments.

According to the eighth embodiment, the slice circuit includes the DC component adjusting circuit maintaining the AC components in the input signal as they are, and converting the DC components to the DC components formed of the uniform voltage level, the average potential detecting circuit attenuating the amplitude of the input signal to a small extent during the initial period of the input signal reception, attenuating the amplitude of the input signal to a large extent during the latter period of the input signal reception and detecting the average voltage of the input signal having the attenuated amplitude, and the integrator amplifying the high frequency components in the input signal. Therefore, the single slice circuit can achieve the following three effects.

(a) Even when input signal Vin contains the drift of DC offset, the drift of DC offset can be removed, and input signal Vin can be accurately followed and converted from the analog signal to the digital signal.

(b) Even when the input signal contains components formed of a succession of uniform voltage levels, the input signal can be accurately converted from the analog signal to the digital signal.

(c) Even when the input signal contains noise components, erroneous detection of noise components can be prevented.

Ninth Embodiment

Figure 33:
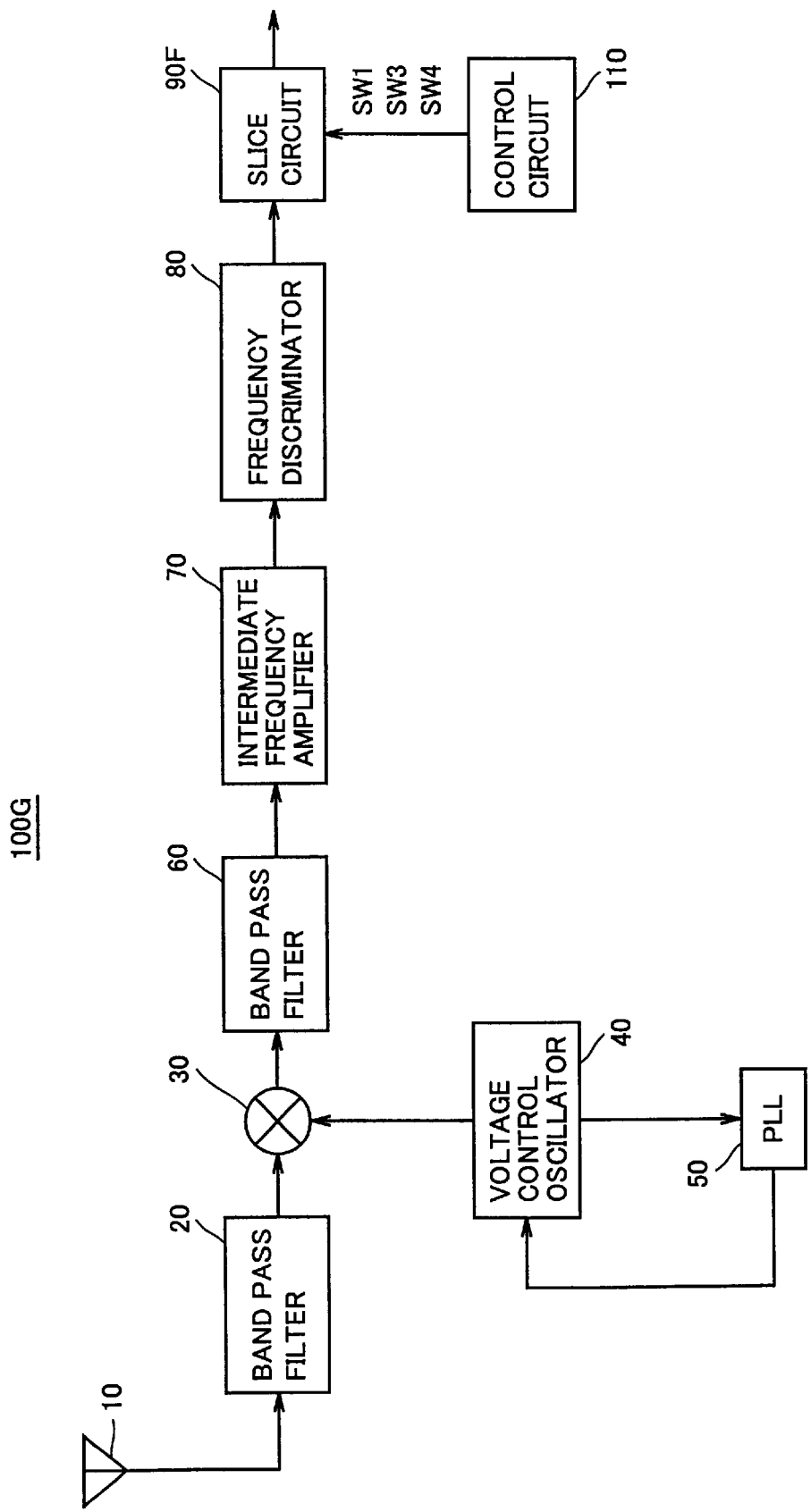
FIG. 33 is a schematic block diagram of a receiver according to a ninth embodiment.

Referring to FIG. 33, a receiver 100G according to a ninth embodiment is the same as receiver 100 except for that slice circuit 90 in receiver 100 is replaced with a slice circuit 90F. In receiver 100G, control circuit 110 provides signals SW1, SW3 and SW4 to slice circuit 90F.

Figure 34:
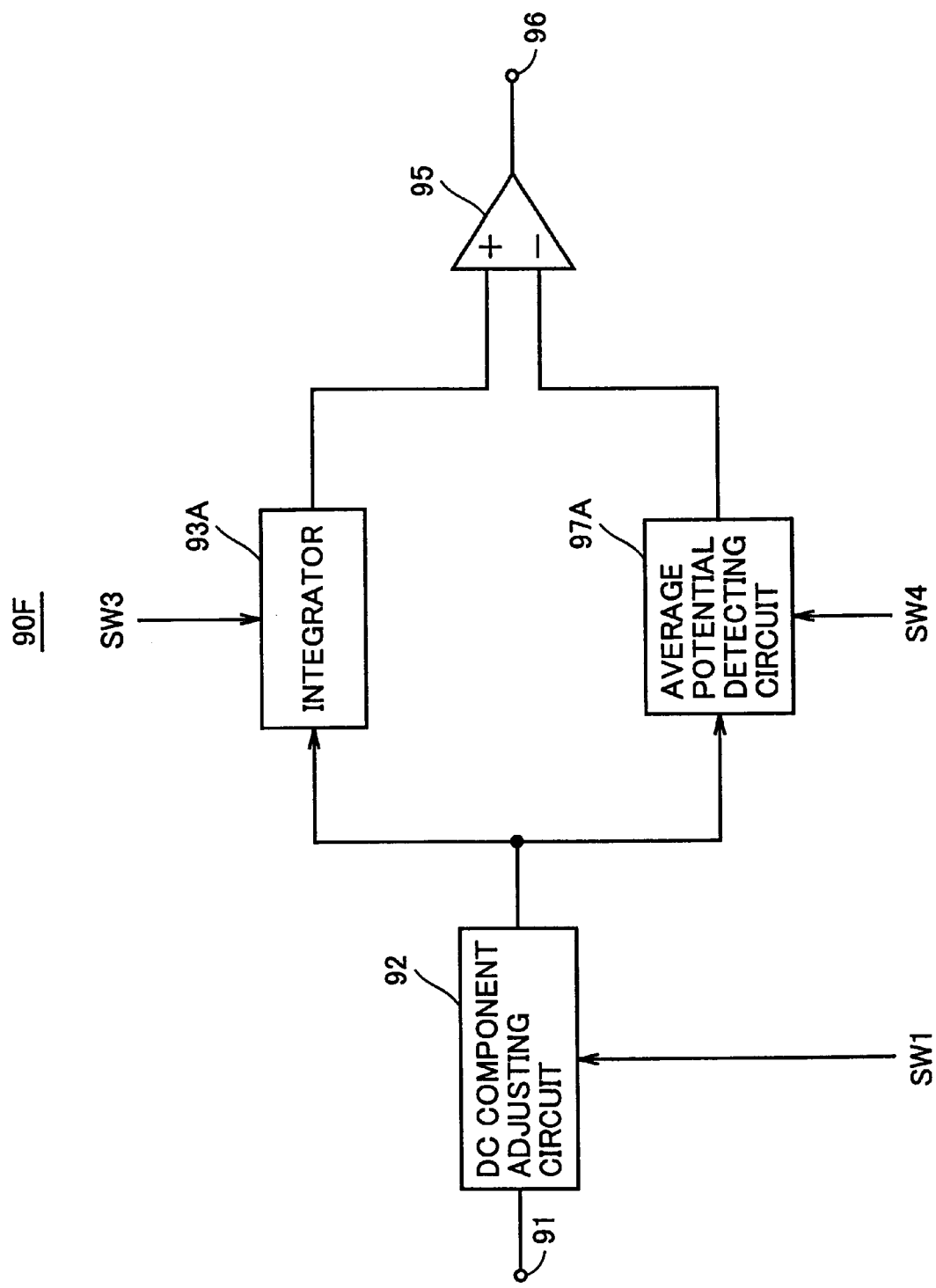
FIG. 34 is a block diagram of a slice circuit shown in FIG. 33.

Referring to FIG. 34, slice circuit 90F includes DC component adjusting circuit 92, integrator 93A, comparator 95 and average potential detecting circuit 97A. DC component adjusting circuit 92, integrator 93A, comparator 95 and average potential detecting circuit 97A are the same as those already described.

DC component adjusting circuit 92, integrator 93A and average potential detecting circuit 97A form a signal processing circuit.

Figure 35:
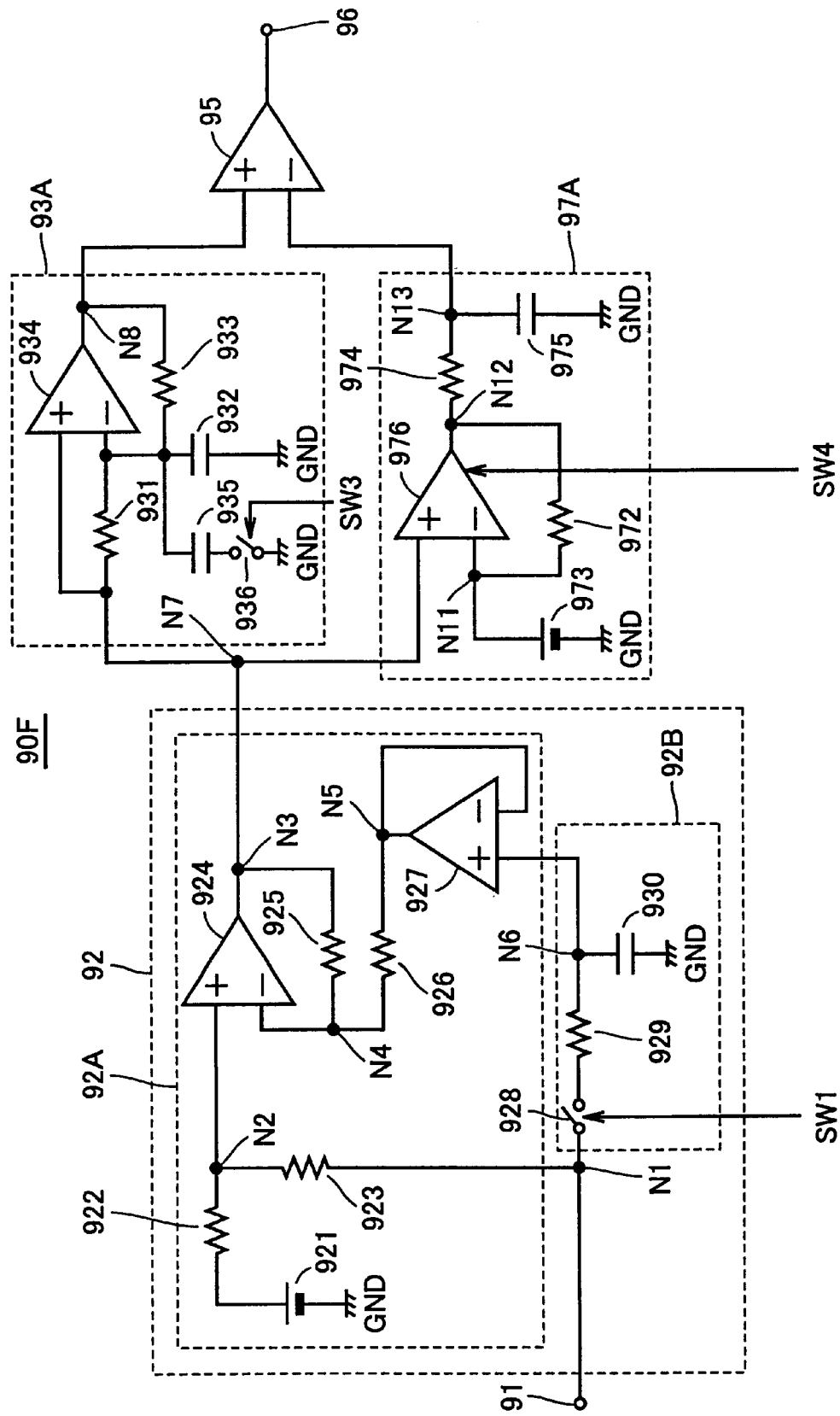
FIG. 35 is a circuit diagram showing a DC component adjusting circuit, an integrator, a comparator and an average potential detecting circuit shown in FIG. 34.

FIG. 35 is a circuit diagram showing DC component adjusting circuit 92, integrator 93A, comparator 95 and average potential detecting circuit 97A shown in FIG. 34. The circuit structures of DC component adjusting circuit 92, integrator 93A, comparator 95 and average potential detecting circuit 97A are the same as those already described.

During the initial period of input signal reception, slice circuit 90F maintains the AC components in the input signal in accordance with signal SW1 at H-level as they are, converts the DC components to the DC components formed of a uniform voltage level, significantly amplifies the high frequency components in the input signal sent from DC component adjusting circuit 92 in accordance with signal SW3 at H-level, slightly attenuates the amplitude of the input signal sent from DC component adjusting circuit 92 in accordance with signal SW4 at H-level, thereby detects the average voltage, compares the voltage of the output signal sent from integrator 93A with the voltage of the output signal sent from average potential detecting circuit 97A, and converts the input signal from the analog signal to the digital signal.

During the latter period of the input signal reception, slice circuit 90F changes the input signal to a signal, in which the DC components change in accordance with the DC offset in the input signal, in accordance with signal SW1 at L-level, slightly amplifies the high frequency components in the input signal sent from DC component adjusting circuit 92 in accordance with signal SW3 at L-level, significantly attenuates the amplitude of the input signal sent from DC component adjusting circuit 92 in accordance with signal SW4 at L-level, thereby detects the average voltage, compares the voltage of the output signal sent from integrator 93A with the voltage of the output signal sent from average potential detecting circuit 97A, and converts the input signal from the analog signal to the digital signal.

Slice circuit 90F corresponds to a structure, in which slice circuits 90D and 90E in the seventh and eighth embodiments are applied to slice circuit 90B in the fourth embodiment.

Accordingly, slice circuit 90F can accurately convert the input signal from the analog signal to the digital signal throughout the input signal even if the input signal contains components of a small amplitude during the initial reception period.

The operation of slice circuit 90F is the same as that of slice circuit 90B in the fourth embodiment except for that the operation of integrator 93 in the fourth embodiment is replaced with the operation of integrator 93A in the seventh embodiment, and the operation of average potential detecting circuit 97 in the fourth embodiment is replaced with the operation of average potential detecting circuit 97A in the eighth embodiment.

The operation of receiver 100G is the same as that of receiver 100 except for that the operation of slice circuit 90 is replaced with the operation of slice circuit 90F described above.

Structures and operations other than the above are the same as those in the first, fourth, seventh and eighth embodiments.

According to the ninth embodiment, the slice circuit includes the DC component adjusting circuit operating, during the initial period of the input signal reception, to maintain the AC components in the input signal as they are and change the DC components to the DC components formed of the uniform voltage level, and changing the input signal to the signal having the DC components, which change in accordance with the DC offset in the input signal, during the latter period of the input signal reception, the average potential detecting circuit slightly attenuating the amplitude of the input signal during the initial period of the input signal reception, significantly attenuating the amplitude of the input signal during the latter period of the input signal reception and detecting the average voltage of the input signal having the attenuated amplitude, and the integrator significantly amplifying the high frequency components in the input signal during the initial period of the input signal reception, and slightly amplifying the high frequency components in the input signal during the latter period of the input signal reception. Therefore, the single slice circuit can achieve the following three effects.

(a) Even when input signal Vin contains the drift of DC offset, the drift of DC offset can be removed, and input signal Vin can be accurately followed and converted from the analog signal to the digital signal.

(b) Even when the input signal contains components formed of a succession of uniform voltage levels, the input signal can be accurately converted from the analog signal to the digital signal.

(c) Even when the input signal contains noise components, erroneous detection of noise components can be prevented.

Tenth Embodiment

Figure 36:
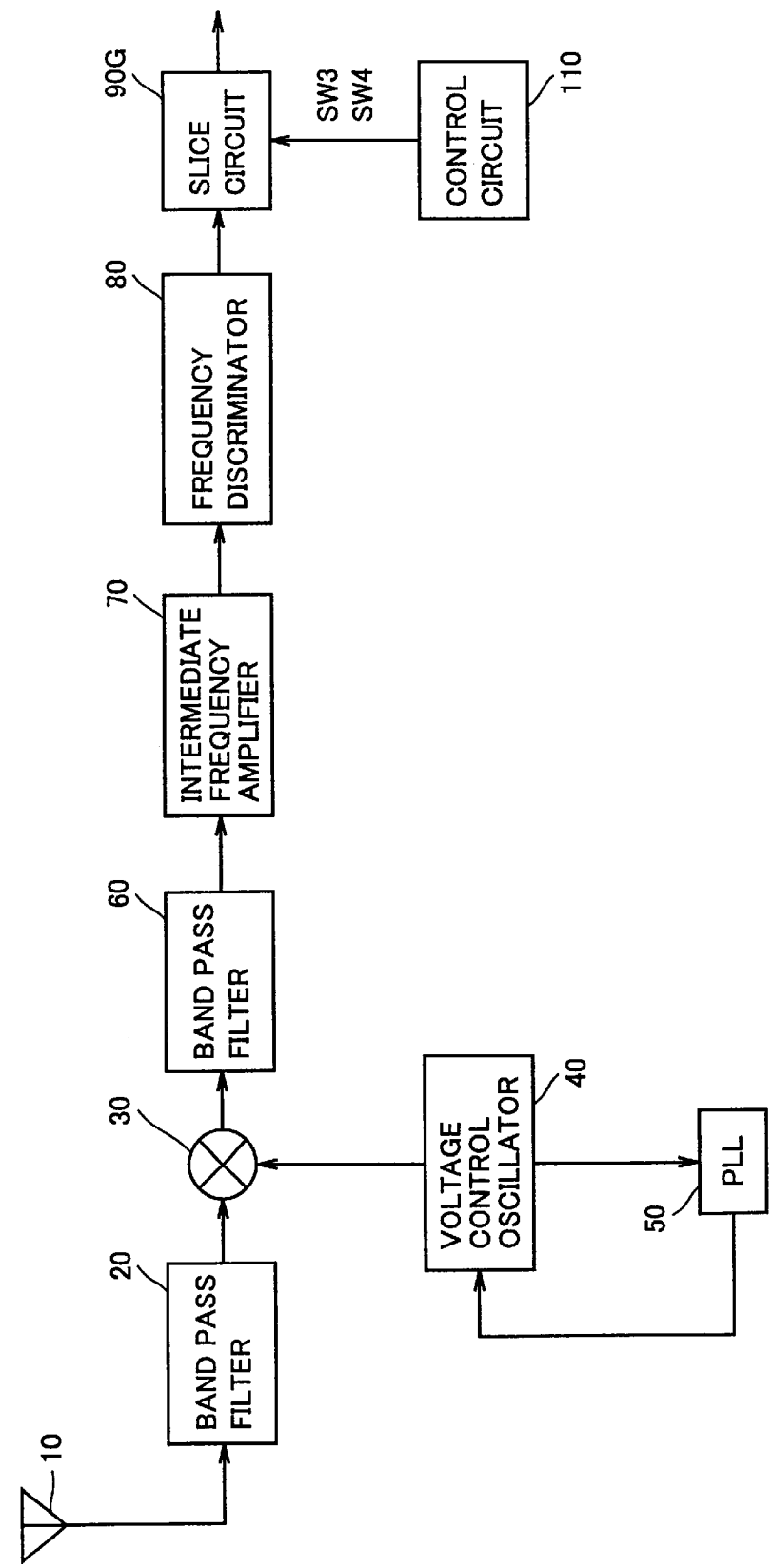
FIG. 36 is a schematic block diagram of a receiver according to a tenth embodiment.

Referring to FIG. 36, a receiver 100H according to a tenth embodiment is the same as receiver 100 except for that slice circuit 90 in receiver 100 is replaced with a slice circuit 90G. In receiver 100H, control circuit 110 provides signals SW3 and SW4 to slice circuit 90G.

Figure 37:
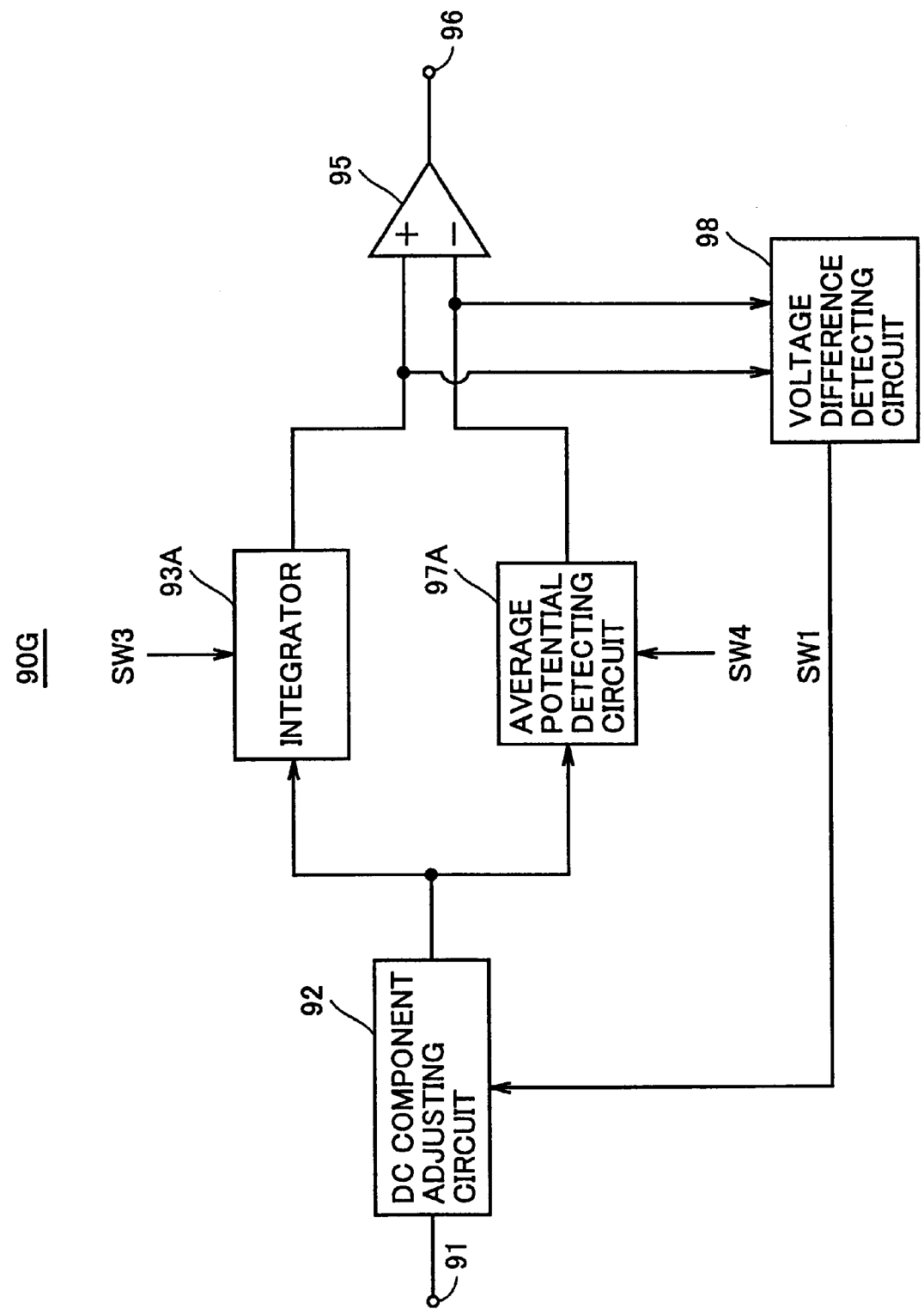
FIG. 37 is a block diagram of a slice circuit shown in FIG. 36.

Referring to FIG. 37, slice circuit 90G includes DC component adjusting circuit 92, integrator 93A, comparator 95, average potential detecting circuit 97A and voltage difference detecting circuit 98. DC component adjusting circuit 92, integrator 93A, comparator 95, average potential detecting circuit 97A and voltage difference detecting circuit 98 are the same as those already described.

Thus, slice circuit 90G corresponds to a structure, in which slice circuits 90D and 90E in the seventh and eighth embodiments are applied to slice circuit 90C in the fifth embodiment.

DC component adjusting circuit 92, integrator 93A and average potential detecting circuit 97A form a signal processing circuit.

Figure 38:
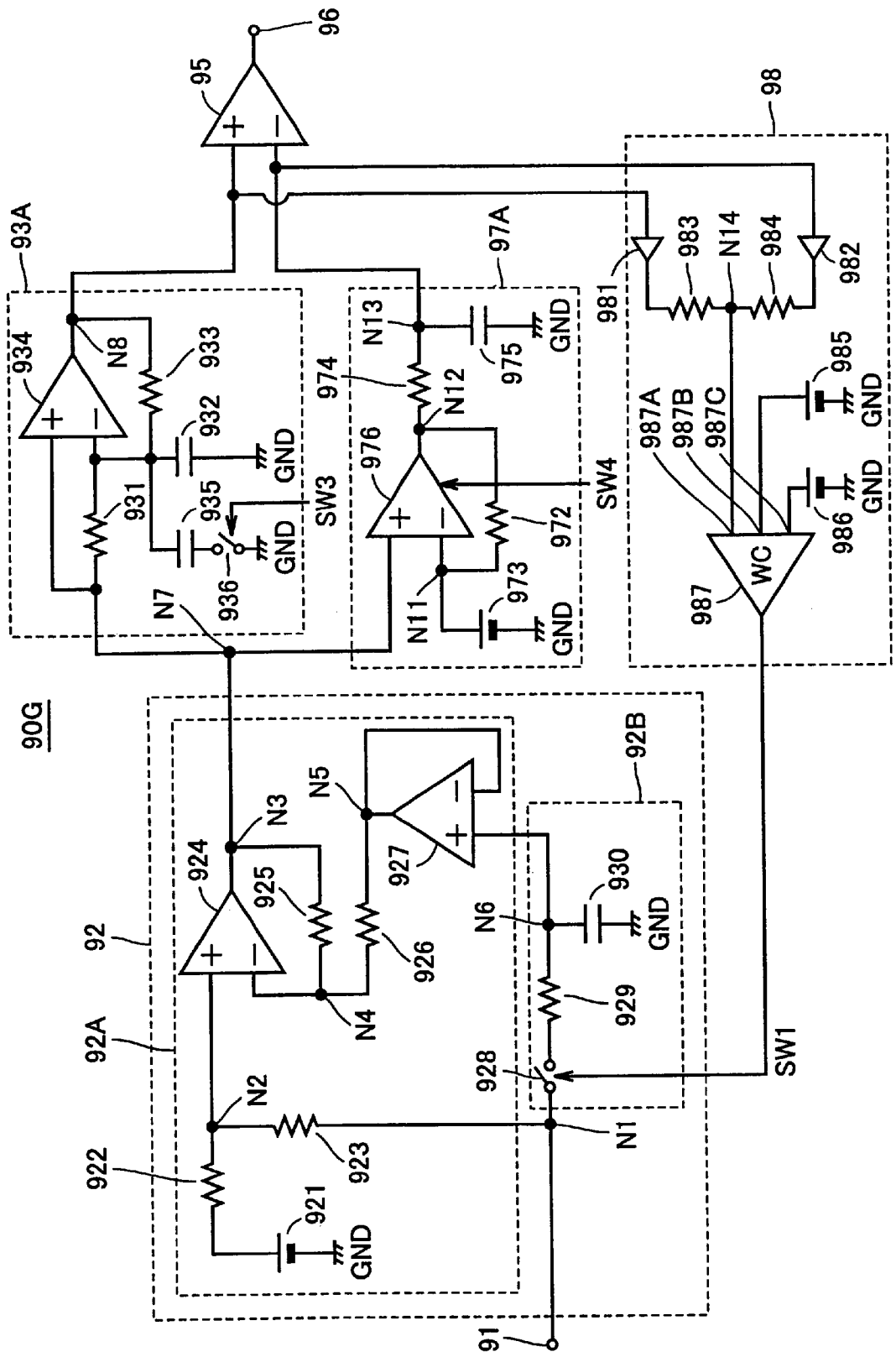
FIG. 38 is a circuit diagram showing a DC component adjusting circuit, an integrator, a comparator, an average potential detecting circuit and a voltage difference detecting circuit shown in FIG. 37.

FIG. 38 is a circuit diagram showing DC component adjusting circuit 92, integrator 93A, comparator 95, average potential detecting circuit 97A and voltage difference detecting circuit 98 shown in FIG. 37. The circuit structures of DC component adjusting circuit 92, integrator 93A, comparator 95, average potential detecting circuit 97A and voltage difference detecting circuit 98 are the same as those already described.

When a voltage difference between two signals applied to comparator 95 falls outside a predetermined range, voltage difference detecting circuit 98 in slice circuit 90G provides signal SW1 at H-level to switch 928, and DC component adjusting circuit 92 maintains the AC components in the input signal as they are, and changes the DC components to the DC components formed of a uniform voltage level.

When the voltage difference between the two signals applied to comparator 95 falls within the predetermined range, voltage difference detecting circuit 98 provides signal SW1 at L-level to switch 928, and DC component adjusting circuit 92 changes the input signal to the signal, in which DC components change in accordance with the DC offset in the input signal.

Integrator 93A significantly amplifies the high frequency components in the input signal sent from DC component adjusting circuit 92 in accordance with signal SW3 at H-level during the initial period of the input signal reception, and slightly amplifies them in accordance with the signal SW3 at L-level during the latter period of the input signal reception. The average potential detecting circuit 97A detects the average voltage by slightly attenuating the input signal sent from DC component adjusting circuit 92 in accordance with signal SW4 at H-level during the initial period of the input signal reception, and detects the average voltage by significantly attenuating the input signal in accordance with the signal SW4 at L-level during the latter period of the input signal reception.

Comparator 95 compares the voltage of the signal sent from integrator 93A with the voltage of the signal sent from average potential detecting circuit 97A, and converts the input signal from the analog signal to the digital signal.

Thus, slice circuit 90G adjusts the DC components in the input signal such that comparator 95 can accurately compare the voltage of the signal sent from integrator 93A with the voltage of the signal sent from average potential detecting circuit 97A. In addition to the adjustment of the DC components, slice circuit 90G detects the average voltage during the initial period of the input signal reception by significantly amplifying the high frequency components in the input signal having the adjusted DC components and slightly attenuating the amplitude of the input signal having the adjusted DC components. In addition to the adjustment of the DC components, slice circuit 90G detects the average voltage during the latter period of the input signal reception by slightly amplifying the high frequency components in the input signal having the adjusted DC components and significantly attenuating the amplitude of the input signal having the adjusted DC components.

The operation of slice circuit 90G is the same as that of slice circuit 90C except for that the operation of integrator 93 is replaced with the operation of integrator 93A, and the operation of average potential detecting circuit 97 is replaced with the operation of average potential detecting circuit 97A.

The operation of receiver 100H is the same as that of receiver 100 except for that the operation of slice circuit 90 is replaced with the operation of slice circuit 90G described above.

Structures and operations other than the above are the same as those in the first, fifth, seventh and eighth embodiments.

According to the tenth embodiment, the slice circuit includes the DC component adjusting circuit selectively performing the signal processing, in which the AC components in the input signal are maintained as they are, and the DC components are changed to the DC components formed of the uniform voltage level, and the signal processing of changing the input signal to the signal, in which the DC components change in accordance with the DC offset in the input signal. The slice circuit also includes the voltage difference detecting circuit producing the signal, which selects the signal processing in the DC component adjusting circuit, in accordance with the voltage difference between the two signals supplied to the comparator, the average potential detecting circuit slightly attenuating the amplitude of the input signal during the initial period of the input signal reception, significantly attenuating the amplitude of the input signal during the latter period of the input signal reception and detecting the average voltage of the input signal having the attenuated amplitude, and the integrator significantly amplifying the high frequency components in the input signal during the initial period of the input signal reception, and slightly amplifying the high frequency components in the input signal during the latter period of the input signal reception. Therefore, the single slice circuit can achieve the following three effects.

(a) Even when input signal Vin contains the drift of DC offset, the drift of DC offset can be removed, and input signal Vin can be accurately followed and converted from the analog signal to the digital signal.

(b) Even when the input signal contains components formed of a succession of uniform voltage levels, the input signal can be accurately converted from the analog signal to the digital signal.

(c) Even when the input signal contains noise components, erroneous detection of noise components can be prevented.

Eleventh Embodiment

Figure 39:
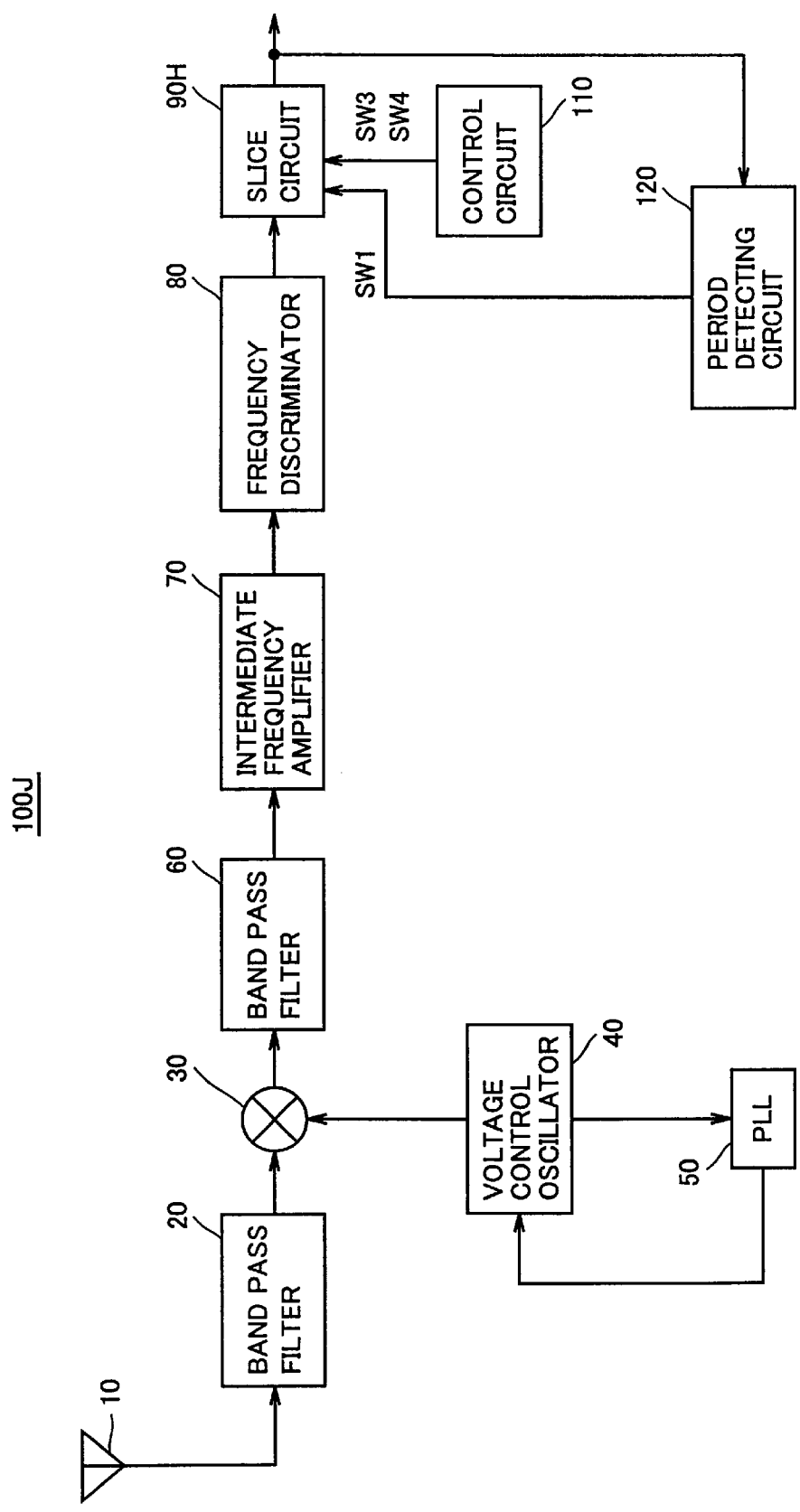
FIG. 39 is a schematic block diagram of a receiver according to an eleventh embodiment.

Referring to FIG. 39, a receiver 100J according to an eleventh embodiment is the same as receiver 100 except for that slice circuit 90 in receiver 100 is replaced with slice circuit 90H.

In receiver 100J, period detecting circuit 120 produces signal SW1 at H- or L-level in accordance with the operation already described in connection with the sixth embodiment, and provides signal SW1 at H- or L-level thus produced to slice circuit 90H. Further, control circuit 110 produces signals SW3 and SW4, and provides them to slice circuit 90H.

Figure 40:
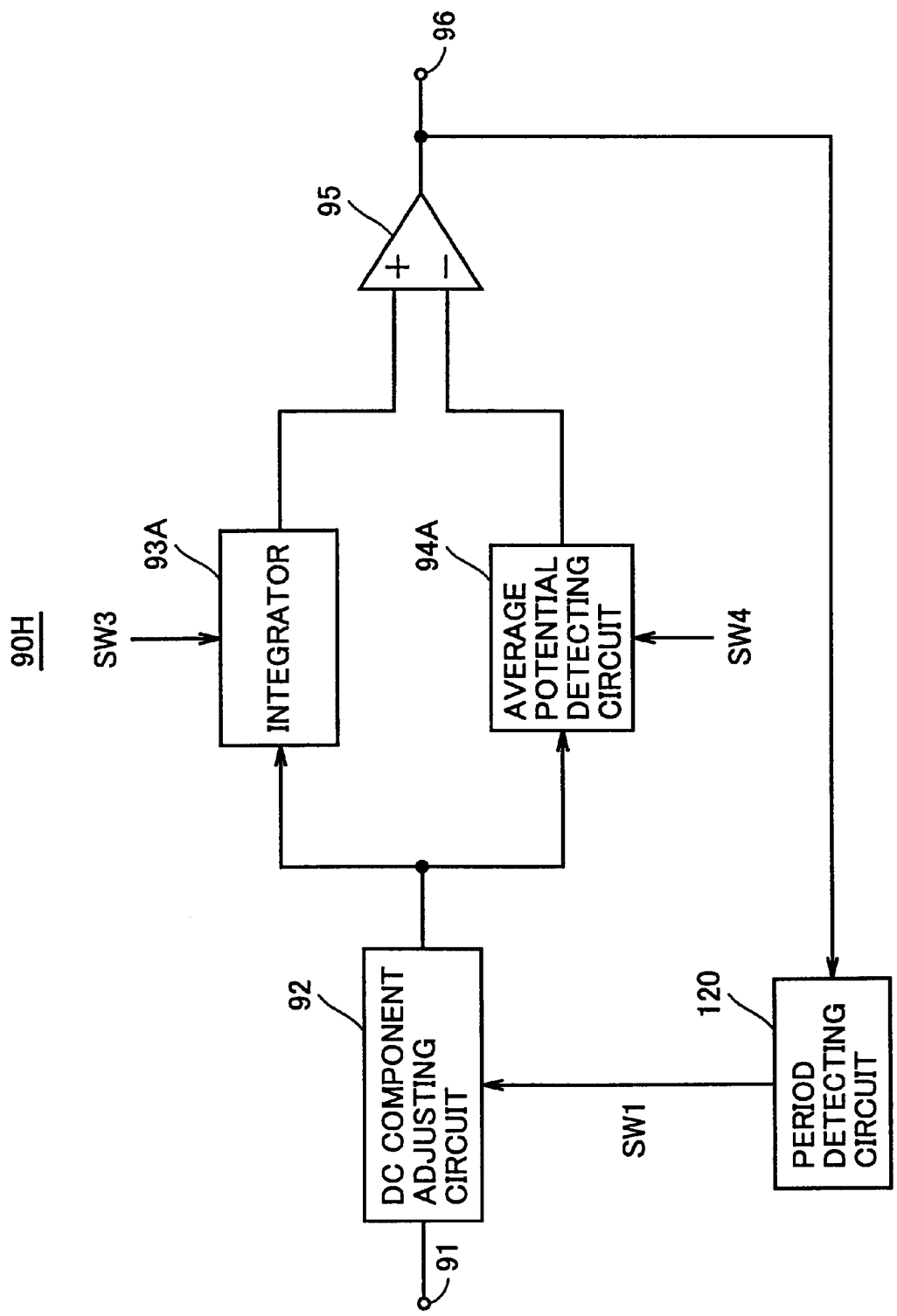
FIG. 40 is a block diagram of a slice circuit shown in FIG. 39.

Referring to FIG. 40, slice circuit 90H includes DC component adjusting circuit 92, integrator 93A, comparator 95 and average potential detecting circuit 97A. Slice circuit 90H has the same circuit structures as slice circuit 90F in the ninth embodiment, but differs from slice circuit 90F in that DC component adjusting circuit 92 receives signal SW1 from period detecting circuit 120.

Thus, slice circuit 90H corresponds to a structure, in which slice circuits 90D and 90E in the seventh and eighth embodiments are applied to slice circuit 90B in the sixth embodiment.

DC component adjusting circuit 92, integrator 93A, comparator 95, average potential detecting circuit 97A and period detecting circuit 120 are the same as those already described.

DC component adjusting circuit 92, integrator 93A and average potential detecting circuit 97A form a signal processing circuit.

Figure 41:
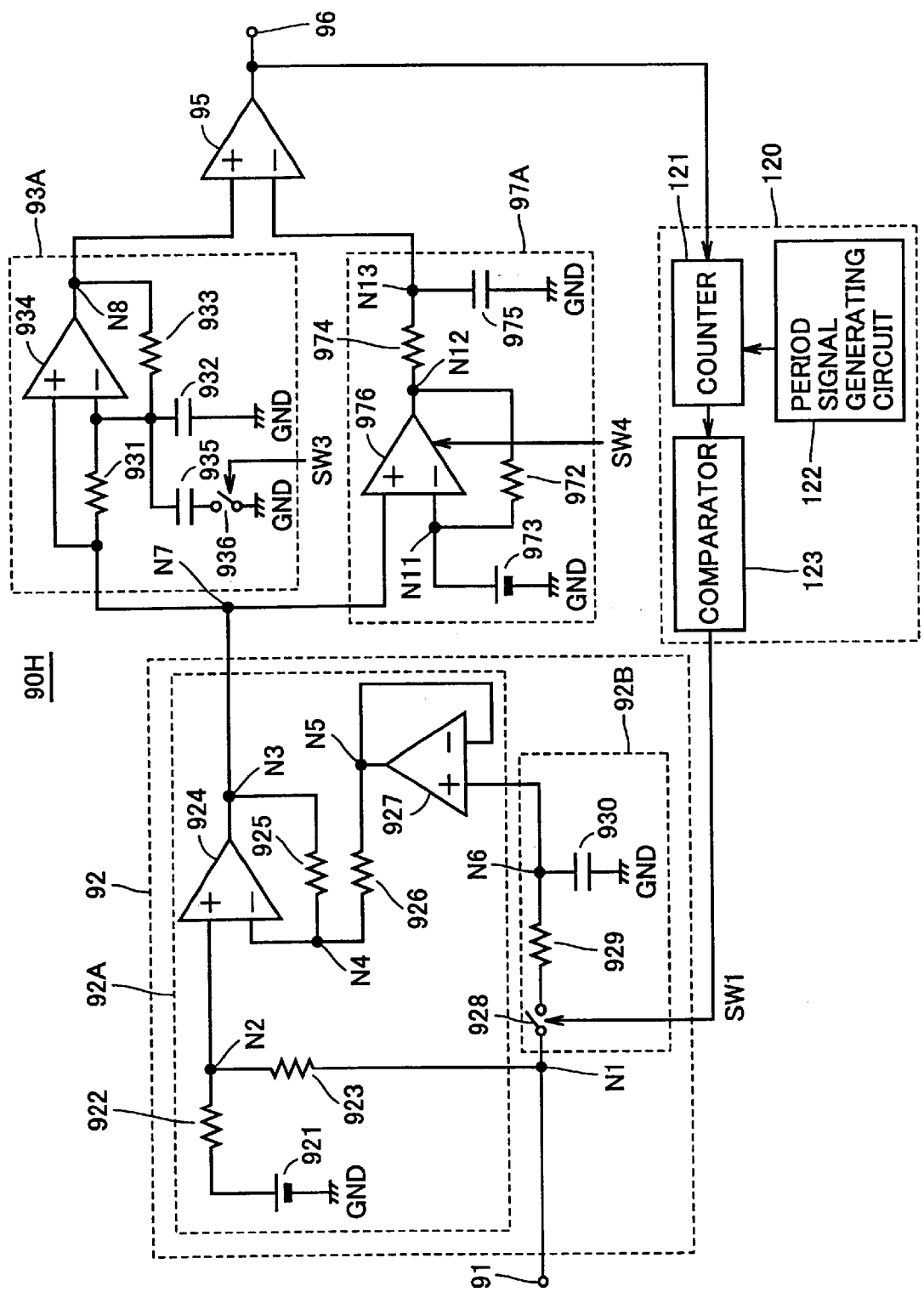
FIG. 41 is a circuit diagram showing a DC component adjusting circuit, an integrator, a comparator, an average potential detecting circuit and a period detecting circuit shown in FIG. 40.

FIG. 41 is a circuit diagram showing DC component adjusting circuit 92, integrator 93A, comparator 95 and average potential detecting circuit 97A shown in FIG. 40, and also shows period detecting circuit 120 in a block form. The circuit structures of DC component adjusting circuit 92, integrator 93A, comparator 95 and average potential detecting circuit 97A are the same as those already described. Period detecting circuit 120 is the same as that already described.

In slice circuit 90H, when DC component adjusting circuit 92 receives signal SW1 at H-level from period detecting circuit 120, it maintains the AC components in the input signal as they are, and changes the DC components to the DC components formed of a uniform voltage level. When DC component adjusting circuit 92 receives signal SW1 at L-level from period detecting circuit 120, it changes the input signal to the signal, in which the DC components change in accordance with the DC offset.

Integrator 93A significantly amplifies the high frequency components in the input signal sent from DC component adjusting circuit 92 in accordance with signal SW3 at H-level during the initial period of the input signal reception, and slightly amplifies them in accordance with signal SW3 at L-level during the latter period of the input signal reception. The average potential detecting circuit 97A detects the average voltage by slightly attenuating the input signal sent from DC component adjusting circuit 92 in accordance with signal SW4 at H-level during the initial period of the input signal reception, and detects the average voltage by significantly attenuating the input signal in accordance with signal SW4 at L-level during the latter period of the input signal reception.

Comparator 95 compares the voltage of the signal sent from integrator 93A with the voltage of the signal sent from average potential detecting circuit 97A, and converts the input signal from the analog signal to the digital signal. Period detecting circuit 120 provides signal SW1 at H-level to switch 928 of DC component adjusting circuit 92 when the digital signal sent from comparator 95 has a succession of H- or L-levels during a period, which falls outside a predetermined range. When the digital signal sent from comparator 95 has a succession of H- or L-levels during a period, which falls within a predetermined range, period detecting circuit 120 provides signal SW1 at L-level to switch 928 of DC component adjusting circuit 92.

Thus, slice circuit 90H adjusts the DC components in the input signal such that comparator 95 can accurately compare the voltage of the signal sent from integrator 93A with the voltage of the signal sent from average potential detecting circuit 97A even when the digital signal sent from comparator 95 has a succession of H- or L-levels. In addition to the adjustment of the DC components, slice circuit 90H detects the average voltage during the initial period of the input signal reception by significantly amplifying the high frequency components in the input signal having the adjusted DC components, and slightly attenuating the amplitude of the input signal having the adjusted DC components. Further, in addition to the adjustment of the DC components, slice circuit 90H detects the average voltage during the latter period of the input signal reception by slightly amplifying the high frequency components in the input signal having the adjusted DC components, and significantly attenuating the amplitude of the input signal having the adjusted DC components.

The operation of slice circuit 90H is the same as that of slice circuit 90B except for that the operation of integrator 93 is replaced with the operation of integrator 93A, and the operation of average potential detecting circuit 97 is replaced with the operation of average potential detecting circuit 97A.

The operation of receiver 100J is the same as that of receiver 100 except for that the operation of slice circuit 90 is replaced with the operation of slice circuit 90H described above.

Structures and operations other than the above are the same as those in the first, sixth, seventh and eighth embodiments.

According to the eleventh embodiment, the slice circuit includes the DC component adjusting circuit selectively performing the signal processing, in which the AC components in the input signal are maintained as they are, and the DC components are changed to the DC components formed of the uniform voltage level, and the signal processing of changing the input signal to the signal, in which the DC components change in accordance with the DC offset in the input signal. The slice circuit also includes the average potential detecting circuit slightly attenuating the amplitude of the input signal during the initial period of the input signal reception, significantly attenuating the amplitude of the input signal during the latter period of the input signal reception and detecting the average voltage of the input signal having the attenuated amplitude, and the integrator significantly amplifying the high frequency components in the input signal during the initial period of the input signal reception, and slightly amplifying the high frequency components in the input signal during the latter period of the input signal reception. The switching or selection of the signal processing in the DC component adjusting circuit is performed in accordance with the period, for which the H- or L-level continues in the digital signal. Therefore, the single slice circuit can achieve the following three effects.

(a) Even when input signal Vin contains the drift of DC offset, the drift of DC offset can be removed, and input signal Vin can be accurately followed and converted from the analog signal to the digital signal.

(b) Even when the input signal contains components formed of a succession of uniform voltage levels, the input signal can be accurately converted from the analog signal to the digital signal.

(c) Even when the input signal contains noise components, erroneous detection of noise components can be prevented.

Twelfth Embodiment

Figure 42:
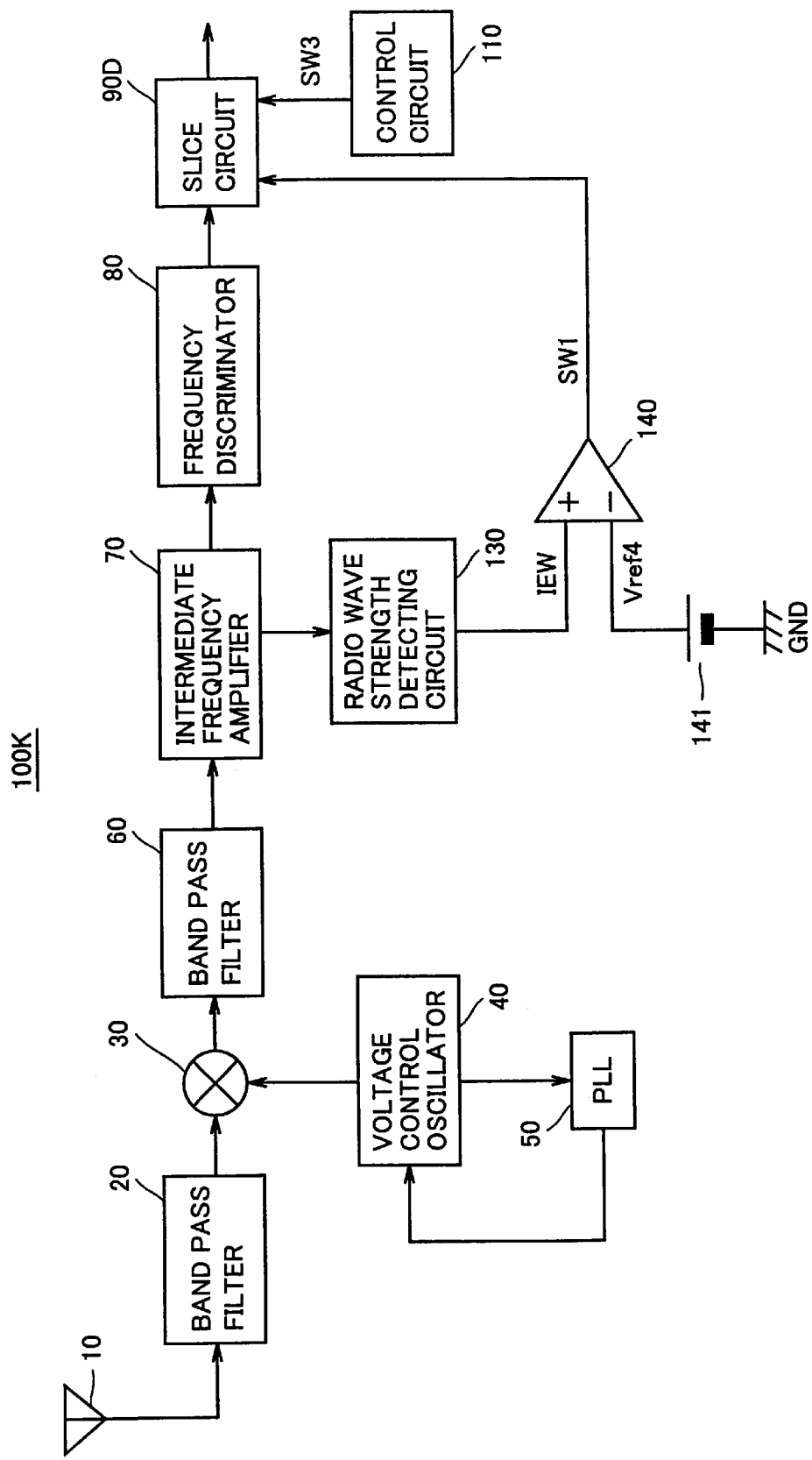
FIG. 42 is a schematic block diagram of a receiver according to a twelfth embodiment.

Referring to FIG. 42, a receiver 100K according to a twelfth embodiment is the same as receiver 100 except for that slice circuit 90 in receiver 100 is replaced with slice circuit 90D, and a radio wave strength detecting circuit 130, a comparator 140 and a voltage supply 141 are additionally employed.

Radio wave strength detecting circuit 130 receives an input signal from intermediate frequency amplifier 70, and detects the strength of the received input signal. Radio wave strength detecting circuit 130 provides a strength IEW of the input signal thus detected to the noninverting input terminal of comparator 140.

Voltage supply 141 is connected between the inverting input terminal of comparator 140 and ground node GND. Comparator 140 compares the voltage indicating strength IEW of the input signal received from radio wave strength detecting circuit 130 with a reference voltage Vref4 supplied from voltage supply 141, and provides signal SW1 at the logical level corresponding to results of the comparison to slice circuit 90D.

More specifically, comparator 140 provides signal SW1 at H-level to slice circuit 90D when the voltage indicating strength IEW of the input signal is higher than reference voltage Vref4, and provides signal SW1 at L-level to slice circuit 90D when the voltage indicating strength IEW of the input signal is equal to or lower than reference voltage Vref4.

Control circuit 110 provides signal SW3 to slice circuit 90D.

Slice circuit 90D has the same structure as that shown in the block diagram of FIG. 25, and the circuit structures of DC component adjusting circuit 92, integrator 93A, comparator 95 and average potential detecting circuit 97 included therein are the same as those shown in FIG. 26.

The operation of receiver 100K is as follows. The same operations of and between the reception of the receive signal by antenna 10 and the output of the input signal subjected to the FM demodulation by frequency discriminator 80 are the same as those already described in connection with the first embodiment.

Radio wave strength detecting circuit 130 receives the input signal from intermediate frequency amplifier 70, and detects strength IEW of the received input signal. Radio wave strength detecting circuit 130 provides detected strength IEW of the input signal to the noninverting input terminal of comparator 140.

Thereby, comparator 140 compares the voltage, which indicates strength IEW of the input signal and is received from radio wave strength detecting circuit 130, with reference voltage Vref4. Comparator 140 provides signal SW1 at H-level to slice circuit 90D when the voltage indicating strength IEW of the input signal is higher than reference voltage Vref4, and provides signal SW1 at L-level to slice circuit 90D when the voltage indicating strength IEW of the input signal is equal to or lower than reference voltage Vref4.

When slice circuit 90D receives signal SW1 at H-level from comparator 140, it maintains the AC components in the input signal as they are, and changes the DC components to the DC components formed of a uniform voltage level. Also, slice circuit 90D converts the input signal from the analog signal to the digital signal by significantly amplifying the high frequency components in the input signal having the DC components formed of the uniform voltage level in response to signal SW3 at H-level during the initial period of the input signal reception, and slightly amplifying the high frequency components in response to signal SW3 at L-level during the latter period of the input signal reception.

When slice circuit 90D receives signal SW1 at L-level from comparator 140, slice circuit 90D changes the input signal to the signal, in which the DC components change in accordance with the DC offset in the input signal, and converts the input signal from the analog signal to the digital signal by significantly amplifying the high frequency components in the signal thus changed in response to signal SW3 at H-level during the initial period of the input signal reception, and slightly amplifying the high frequency components in response to signal SW3 at L-level during the latter period of the input signal reception.

As described above, slice circuit 90D converts the input signal from the analog signal to the digital signal by changing the DC components in the input signal to the DC components formed of the uniform voltage level when the voltage indicating strength IEW of the input signal is larger than reference voltage Vref4. When the voltage indicating strength IEW of the input signal is equal to or lower than reference voltage Vref4, slice circuit 90D converts the input signal from the analog signal to the digital signal by changing the input signal to the signal, in which the DC components change in accordance with the DC offset thereof, significantly amplifying the high frequency components in the changed signal during the initial period of the input signal reception, and slightly amplifying the high frequency components during the latter period of the input signal reception.

Thereby, slice circuit 90D can accurately convert the input signal from the analog signal to the digital signal even when the strength of the input signal changes.

As described above, receiver 100K has a RSSI (Received Signal Strength Indicator) function, and can accurately convert the input signal from the analog signal to the digital signal in accordance with the strength of the input signal.

Structures and operations other than the above are the same as those in the first and seventh embodiments.

According to the twelfth embodiment, the slice circuit includes the DC component adjusting circuit selectively performing the signal processing, in which the AC components in the input signal are maintained as they are, and the DC components are changed to the DC components formed of the uniform voltage level, and the signal processing of changing the input signal to the signal, in which the DC components change in accordance with the DC offset in the input signal. The slice circuit also includes the average potential detecting circuit detecting the average voltage of the input signal, and the integrator significantly amplifying the high frequency components in the input signal during the initial period of the input signal reception, and slightly amplifying the high frequency components in the input signal during the latter period of the input signal reception. The switching or selection of the above signal processing in the DC component adjusting circuit is performed in accordance with the strength of the input signal. Therefore, the single slice circuit can achieve the following three effects even when the strength of the input signal changes.

(a) Even when input signal Vin contains the drift of DC offset, the drift of DC offset can be removed, and input signal Vin can be accurately followed and converted from the analog signal to the digital signal.

(b) Even when the input signal contains components formed of a succession of uniform voltage levels, the input signal can be accurately converted from the analog signal to the digital signal.

(c) Even when the input signal contains noise components, erroneous detection of noise components can be prevented.

Thirteenth Embodiment

Figure 43:
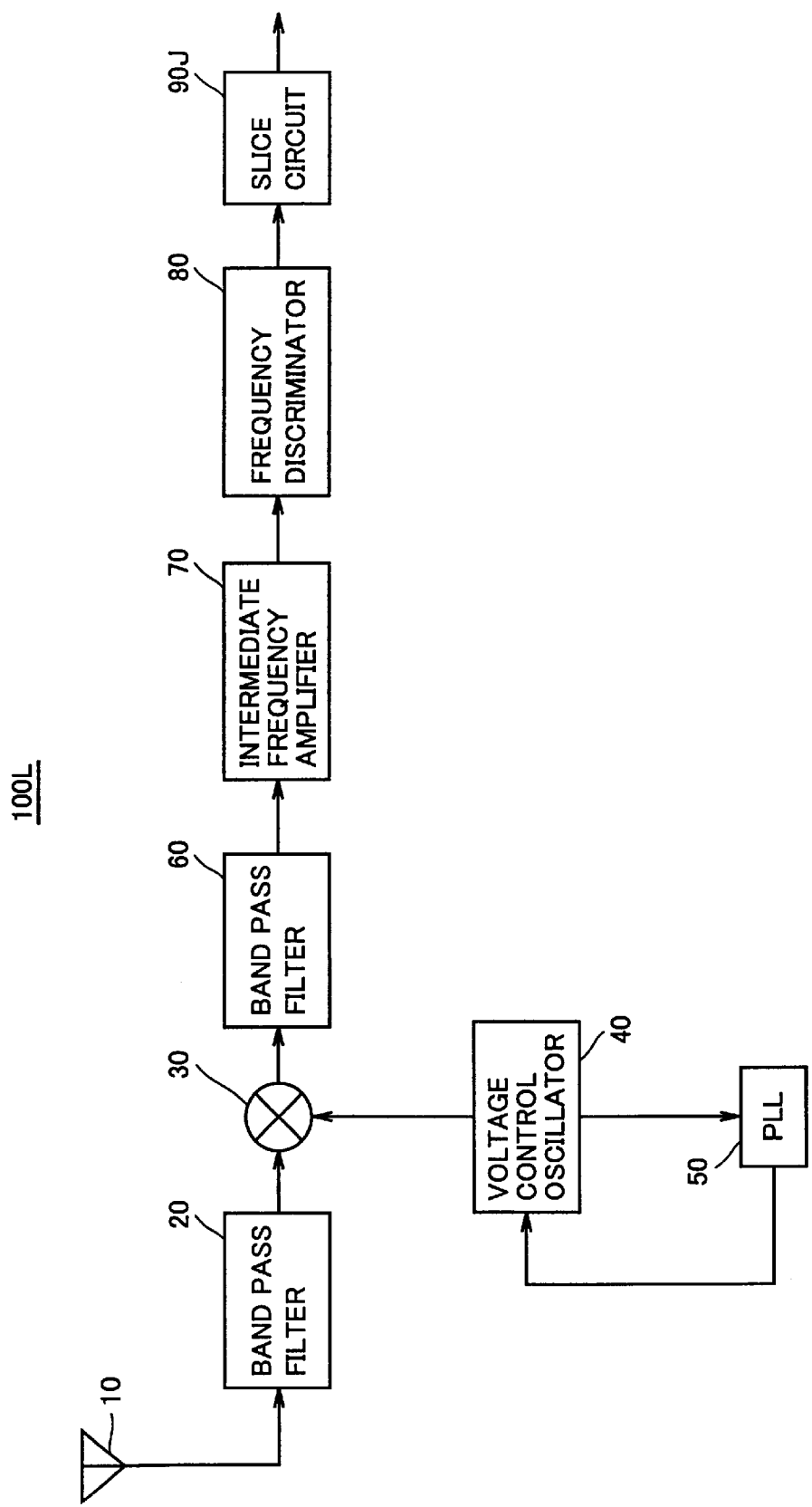
FIG. 43 is a schematic block diagram of a receiver according to a thirteenth embodiment.

Referring to FIG. 43, a receiver 100L according to a thirteenth embodiment is the same as receiver 100A except for that slice circuit 90A in receiver 100A is replaced with slice circuit 90J.

Figure 44:
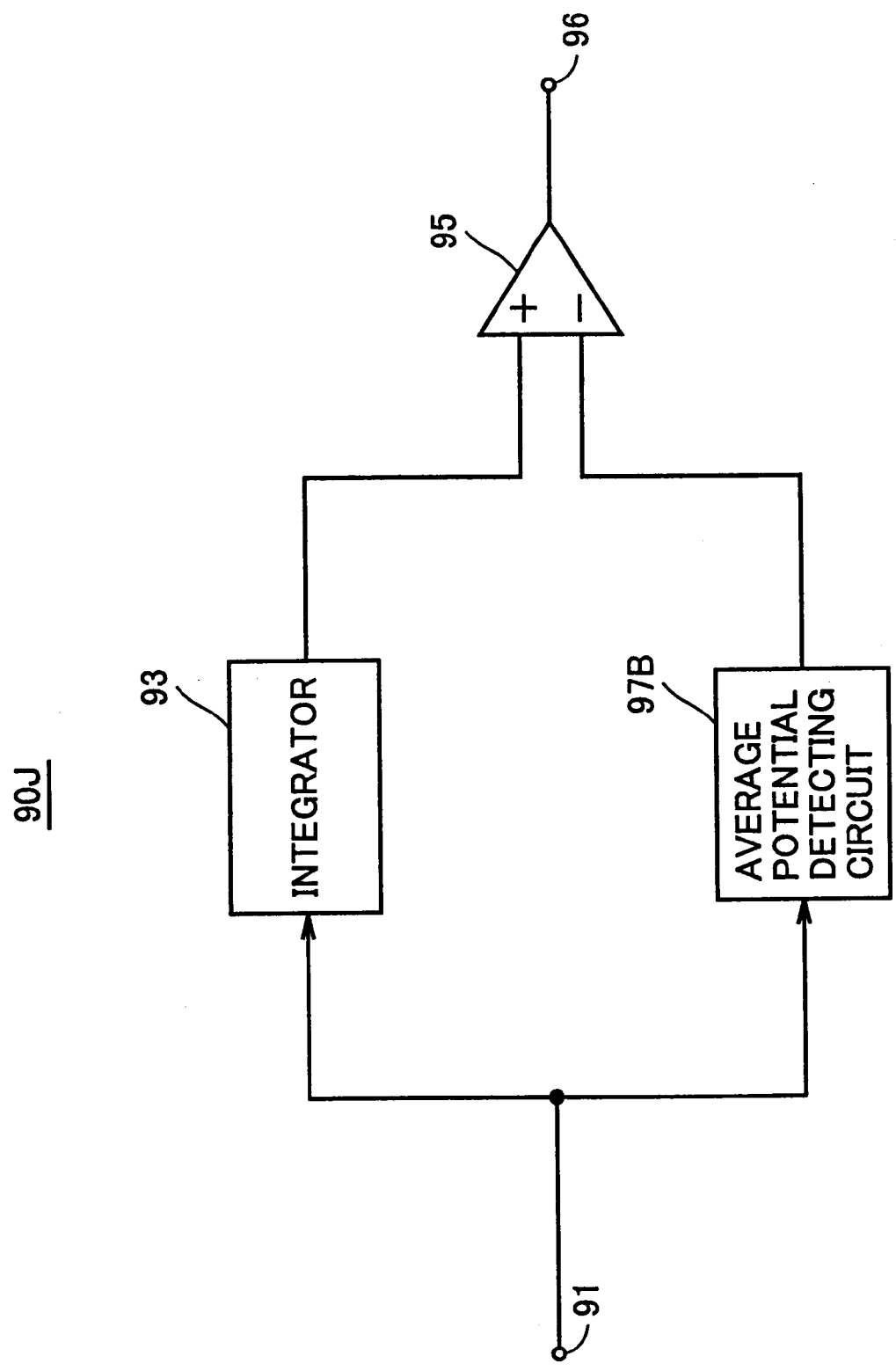
FIG. 44 is a block diagram of a slice circuit shown in FIG. 43.

Referring to FIG. 44, slice circuit 90J includes integrator 93, comparator 95 and average potential detecting circuit 97B. Integrator 93 and comparator 95 are the same as those already described. Slice circuit 90J is the same as slice circuit 90A except for that average potential detecting circuit 97 of slice circuit 90A in the second embodiment is replaced with average potential detecting circuit 97B.

Average potential detecting circuit 97B detects the average voltage of the input signal supplied via input terminal 91, and attenuates the detected average voltage. Average potential detecting circuit 97B provides the signal formed of the attenuated average voltage to the inverting input terminal of comparator 95.

Integrator 93 and average potential detecting circuit 97B form a signal processing circuit.

Figure 45:
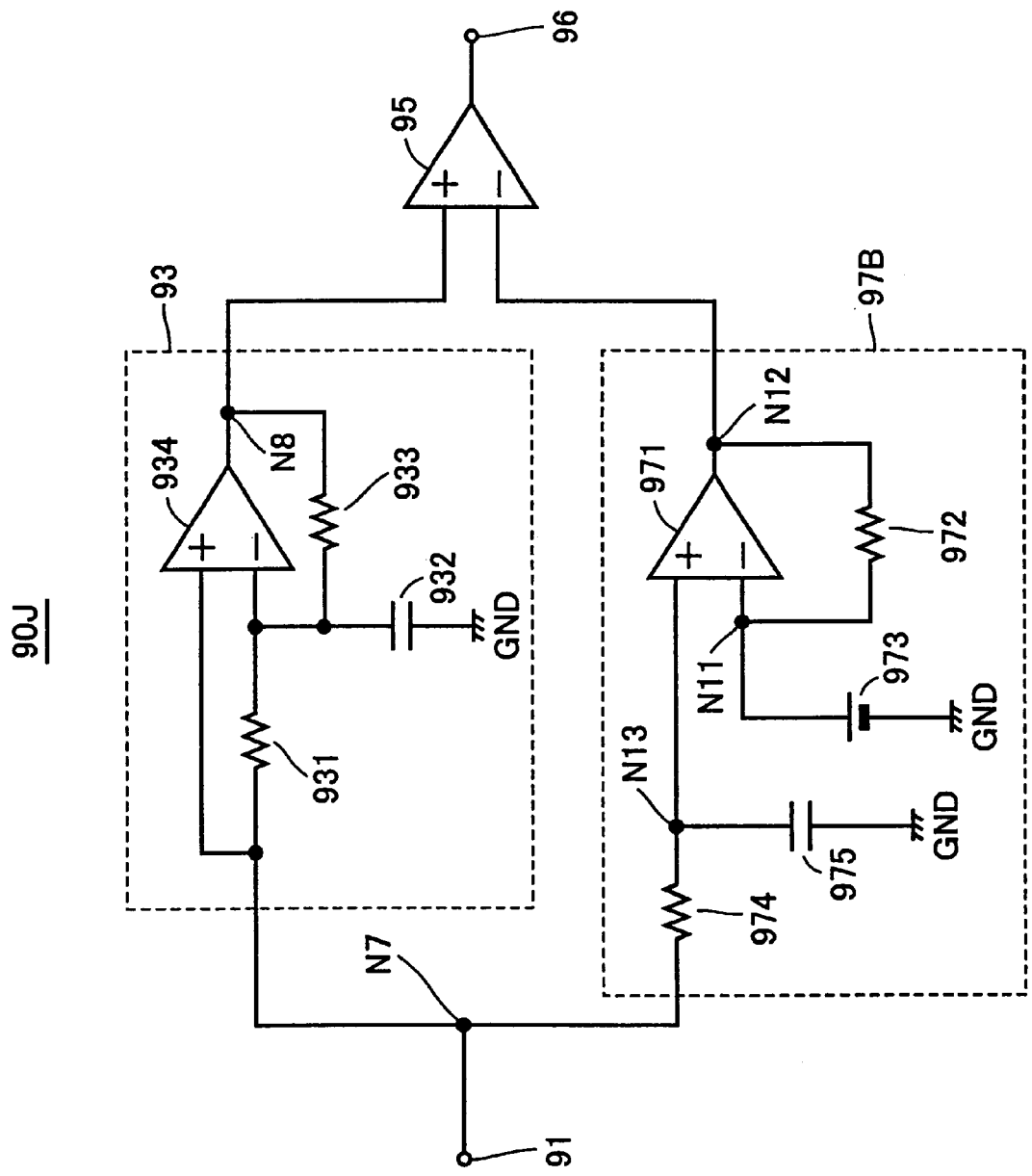
FIG. 45 is a circuit diagram showing an integrator, a comparator and an average potential detecting circuit shown in FIG. 44.

FIG. 45 is a circuit diagram showing integrator 93, comparator 95 and average potential detecting circuit 97B shown in FIG. 44. Referring to FIG. 45, average potential detecting circuit 97B is formed of the same elements as average potential detecting circuit 97, but differs therefrom in that a low pass filter formed of resistance 974 and capacitor 975 is arranged upstream to operational amplifier 971.

Average potential detecting circuit 97B first detects the average voltage of the input signal by resistance 974 and capacitor 975, and then attenuates the detected average voltage by operational amplifier 971. Even when the average voltage of the input signal is attenuated after detecting the average voltage of the input signal, slice circuit 90J can achieve the same effects as those already described in connection with the second embodiment.

Structures and operations other than the above are the same as those in the second embodiment.

In the above description, average potential detecting circuit 97 of slice circuit 90A in the second embodiment is replaced with average potential detecting circuit 97B. However, average potential detecting circuit 97B may be applied to slice circuits 90, 90B, 90C, 90D, 90E, 90F, 90G and 90H.

According to the thirteenth embodiment, the slice circuit includes the average potential detecting circuit detecting the average voltage of the input signal, and attenuating the detected average voltage. Therefore, even if the input signal contains components corresponding to a signal, in which "1" or "0" produced by the FSK modulation continues, the input signal can be accurately converted from the analog signal to the digital signal, and erroneous detection of noise components as an intend signal can be prevented.

Fourteenth Embodiment

Figure 46:
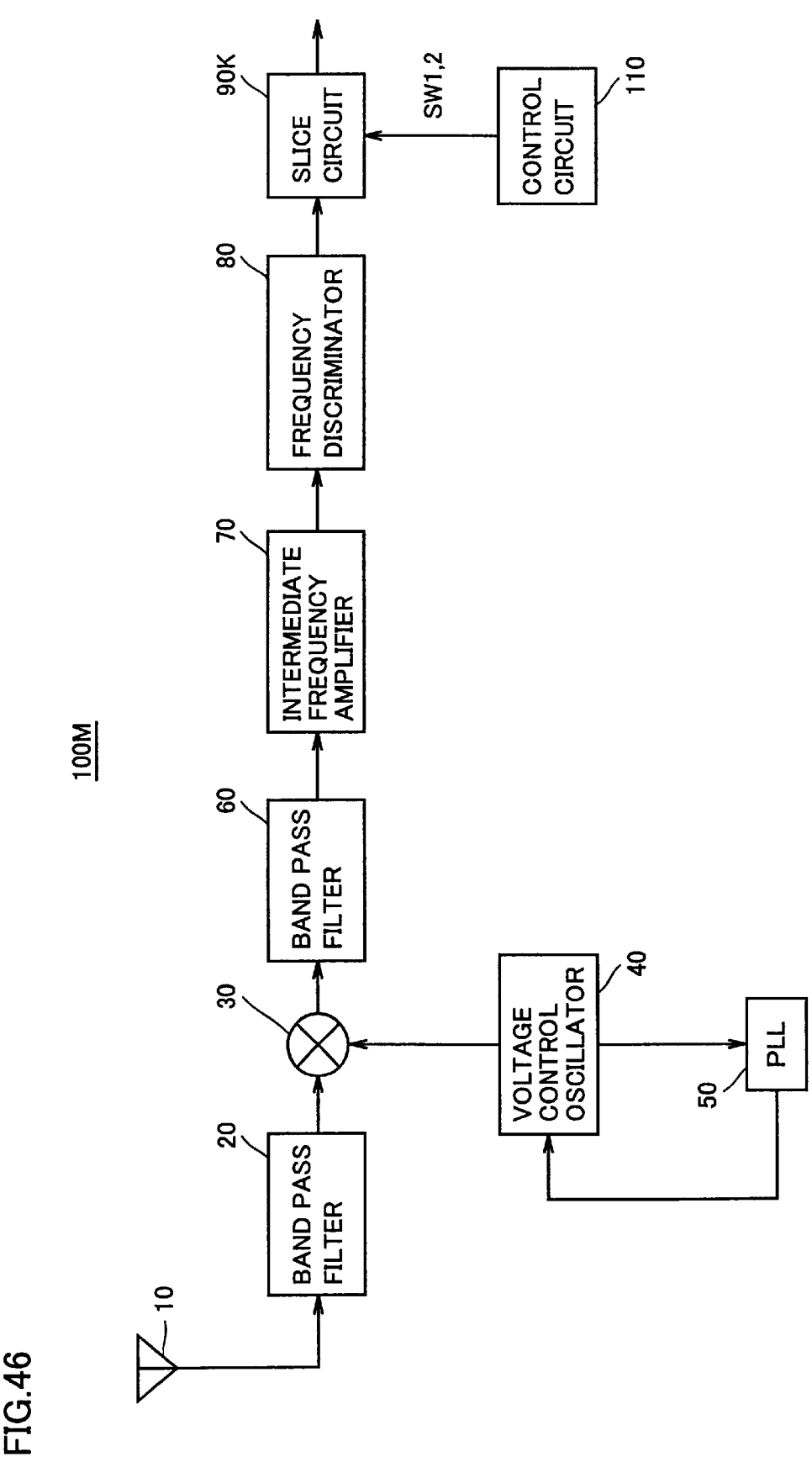
FIG. 46 is a schematic block diagram of a receiver according to a fourteenth embodiment.

Referring to FIG. 46, a receiver 100M in a fourteenth embodiment is the same as receiver 100 except for that slice circuit 90 in receiver 100 is replaced with slice circuit 90K.

Figure 47:
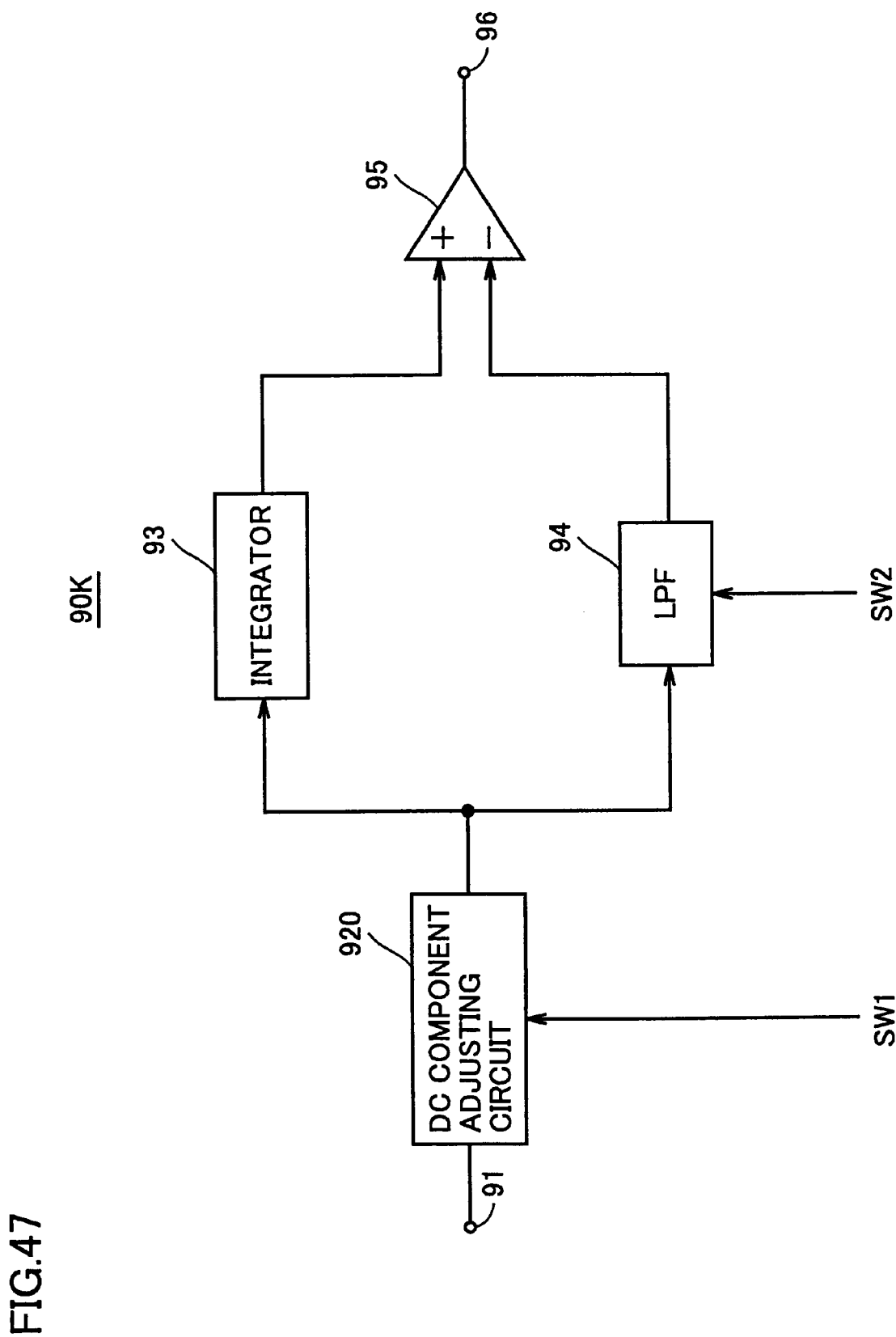
FIG. 47 is a block diagram of a slice circuit shown in FIG. 46.

Referring to FIG. 47, slice circuit 90K includes a DC component adjusting circuit 920, integrator 93, low pass filter 94 and comparator 95. Integrator 93, low pass filter 94 and comparator 95 are the same as those already described.

DC component adjusting circuit 920 integrates the input signal sent via input terminal 91, and provides a signal, in which only the DC components in the input signal are changed into an integrated value of the input signal. In this case, DC component adjusting circuit 920 integrates the input signal with a time constant, which is reduced in accordance with signal SW1 at L-level sent from control circuit 110, and is increased in accordance with signal SW1 at H-level sent from control circuit 110.

DC component adjusting circuit 920, integrator 93 and low pass filter 94 form a signal processing circuit.

Figure 48:
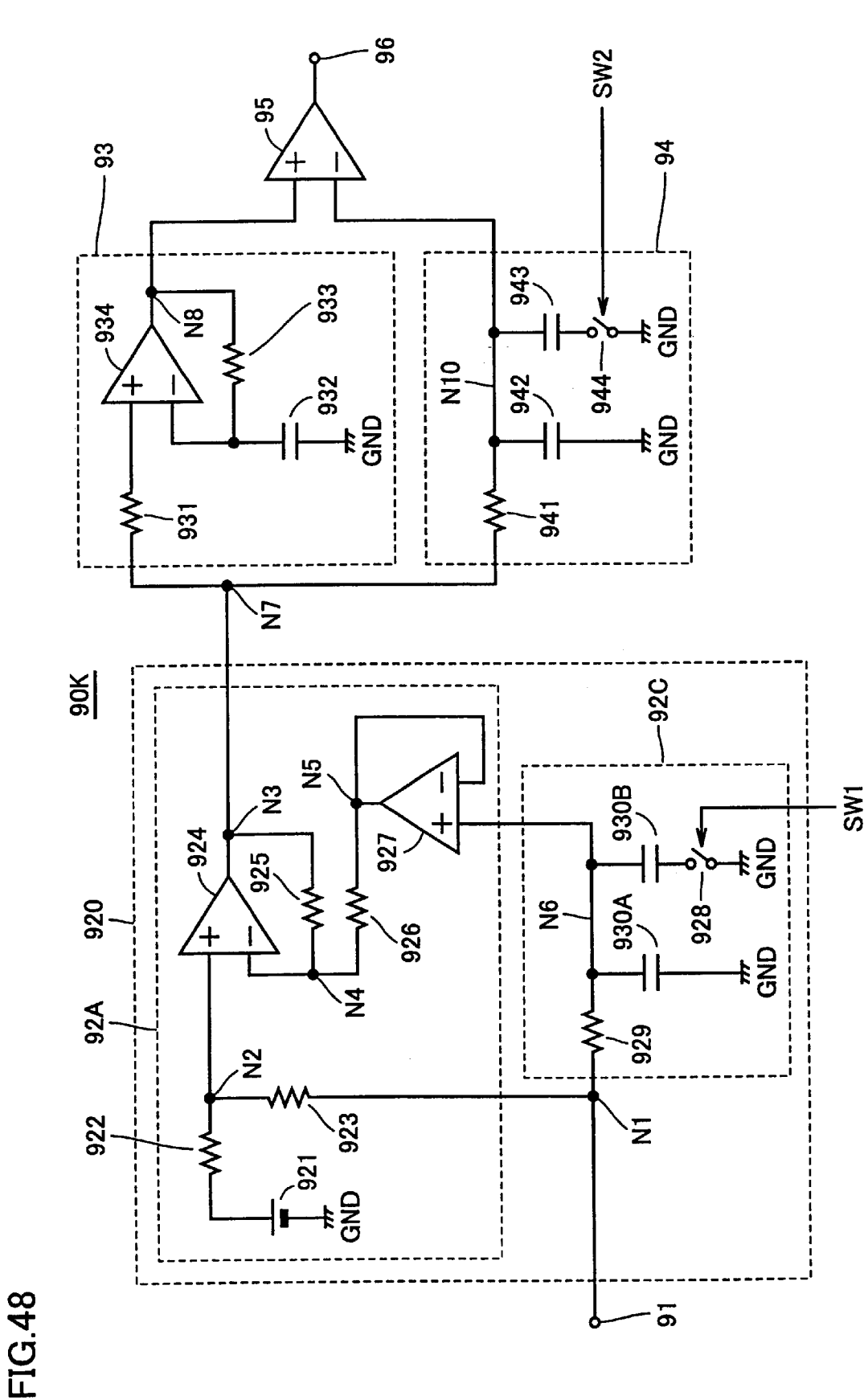
FIG. 48 is a circuit diagram showing a DC component adjusting circuit, an integrator, a low pass filter and a comparator shown in FIG. 47.

FIG. 48 is a circuit diagram showing DC component adjusting circuit 920, integrator 93, low pass filter 94 and comparator 95 shown in FIG. 47. Integrator 93, low pass filter 94 and comparator 95 have the same circuit structures as those already described.

Referring to FIG. 48, DC component adjusting circuit 920 includes a DC component adjusting circuit 92A and a low pass filter 92C. DC component adjusting circuit 92A is already described in connection with the first embodiment.

Low pass filter 92C includes resistance 929, capacitors 930A and 930B, and switch 928. Resistance 929 is connected between nodes N1 and N6. Capacitor 930A is connected between node N6 and ground node GND. Capacitor 930B and switch 928 are connected in series between node N6 and ground node GND.

Assuming that capacitors 930A and 930B have capacitances C1 and C2, respectively, and capacitor 930 in sample hold circuit 92B shown in FIG. 3 has a capacitance of C, capacitances C1 and C2 are determined such that a sum of capacitances C1 and C2 is twice or more as large as capacitance C.

Figure 49:
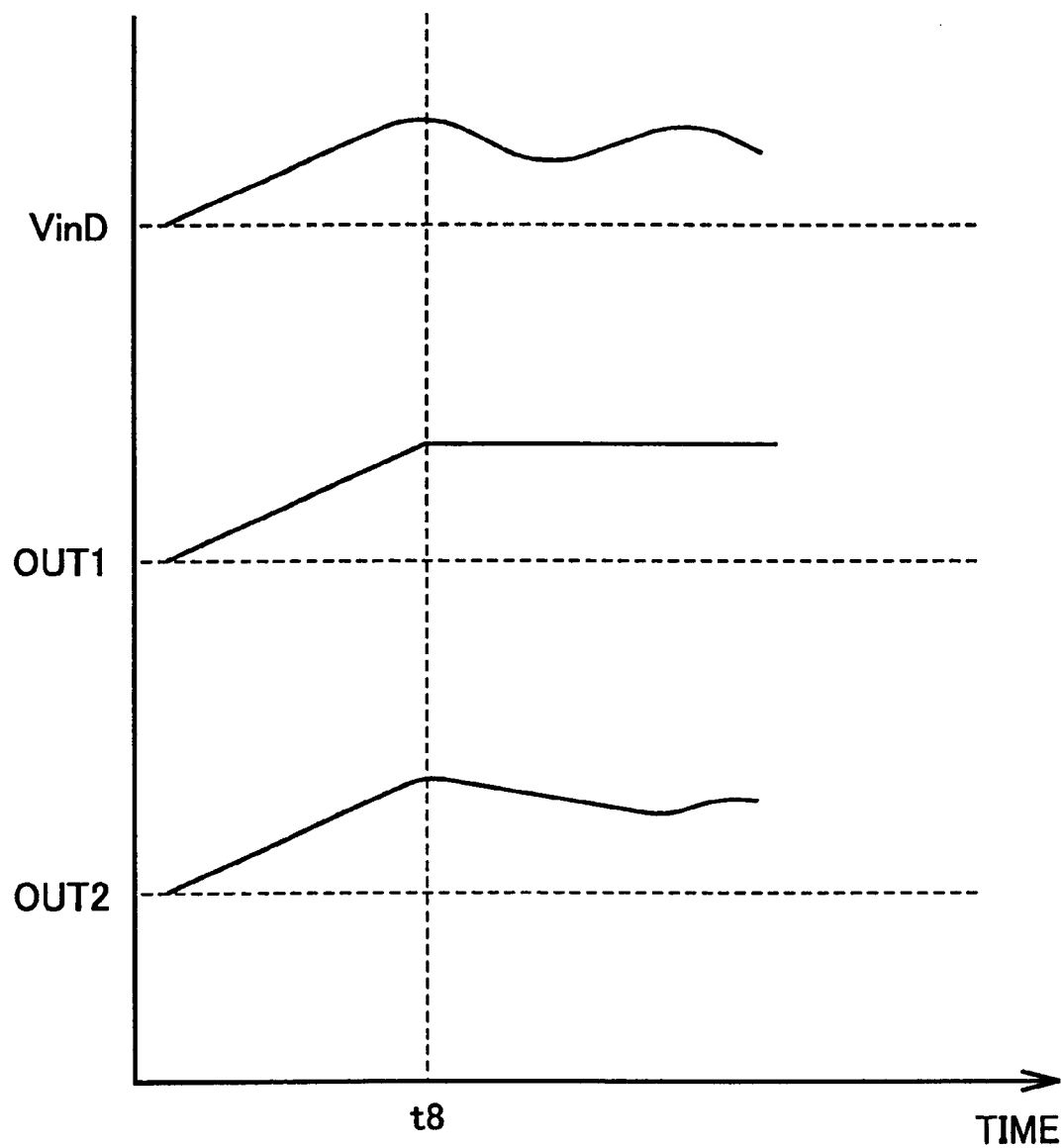
FIG. 49 is a timing chart of signals for illustrating a function of the DC component adjusting circuit shown in FIGS. 47 and 48.

Referring to FIG. 49, a function of low pass filter 92C will now be described. Low pass filter 92C receives signal SW1 at L-level from control circuit 110 at or before timing t8, and receives signal SW1 at H-level from control circuit 110 after timing t8.

Sample hold circuit 92B receives signal SW1 at H-level from control circuit 110 at or before foregoing timing t8, and receives signal SW1 at L-level from control circuit 110 after timing t8.

An input signal VinD shown in FIG. 49 is formed of the DC components in input signal Vin supplied to node N1.

When input signal Vin is supplied to sample hold circuit 92B via node N1, sample hold circuit 92B provides the average voltage of input signal Vin, which changes in accordance with DC components VinD of input signal Vin, for a period before timing t8. When switch 928 is turned off at timing t8, sample hold circuit 92B provides a hold value, which is produced by holding the average voltage provided at timing t8, at and after timing t8. Thus, sample hold circuit 92B provides a signal OUT1.

When low pass filter 92C receives input signal Vin, it detects the average voltage of input signal Vin with a time constant, which is small because switch 928 is off, until timing t8. Therefore, low pass filter 92C detects the average voltage, which changes in accordance with DC components VinD of input signal Vin until timing t8. Switch 928 is turned on at timing t8, and low pass filter 92C detects the average voltage of input signal Vin with an increased time constant at and after timing t8. Thus, low pass filter 92C provides a signal OUT2.

As described above, low pass filter 92C detects the average voltage of input signal Vin while changing the time constant in accordance with the logical level of signal SW1 sent from control circuit 110. Low pass filter 92C achieves the substantially same function as sample hold circuit 92B of DC component adjusting circuit 92.

When DC component adjusting circuit 920 receives signal SW1 at L-level from control circuit 110, it maintains the AC components in the input signal as they are, and changes the DC components in the input signal to the DC components formed of the average voltage of the input signal detected with the small time constant. Thus, DC component adjusting circuit 920 detects the average voltage of the input signal in response to the change in DC components of the input signal. When DC component adjusting circuit 920 receives signal SW1 at H-level from control circuit 110, it maintains the AC components in the input signal as they are, and changes the DC components in the input signal to the DC components formed of the average voltage of the input signal detected with the increased time constant. Thus, DC component adjusting circuit 920 holds the average voltage of the input signal detected in response to the change in DC components of the input signal.

Thereby, DC component adjusting circuit 920 achieves the substantially same function as DC component adjusting circuit 92 in the first embodiment.

The operation of slice circuit 90K is the same as that of slice circuit 90 except for that the operation of DC component adjusting circuit 92 is replaced with the operation of DC component adjusting circuit 920.

The operation of receiver 100M is the same as that of receiver 100 except for that the operation of slice circuit 90 is replaced with the operation of slice circuit 90K described above. Slice circuit 90K employing DC component adjusting circuit 920 achieves the same function as slice circuit 90.

Structures and operations other than the above are the same as those in the first embodiment.

In the above description, DC component adjusting circuit 920 is applied to slice circuit 90. The invention is not restricted to this, and DC component adjusting circuit 920 may be applied to slice circuits 90B, 90C, 90D, 90E, 90F, 90G and 90H. Slice circuits prepared by applying DC component adjusting circuit 920 to slice circuits 90B, 90C, 90D, 90E, 90F, 90G and 90H achieve the same functions as slice circuits 90B, 90C, 90D, 90E, 90F, 90G and 90H, respectively.

According to the fourteenth embodiment, the slice circuit used in the receiver includes the DC component adjusting circuit maintaining the AC components in the input signal, and changing the DC components in the input signal to the DC components formed of the average voltage of the input signal, which is detected in response to the change in DC components of the input signal, and the low pass filter having the gain, which can be set small. Therefore, even if the input signal contains the fast drift of DC offset, the input signal can be accurately converted from the analog signal to the digital signal. Even when the input signal contains the components corresponding to the signal formed of a succession of "1" or "0" produced by the FSK modulation, the input signal can be accurately converted from the analog signal to the digital signal.

Description has been given on the receivers used for wireless communication as well as the slice circuits employed therein. However, the slice circuit according to the invention and the receiver employing the same are not restricted to the wireless communication, and may be applied to communication via cables.

Figure 50:
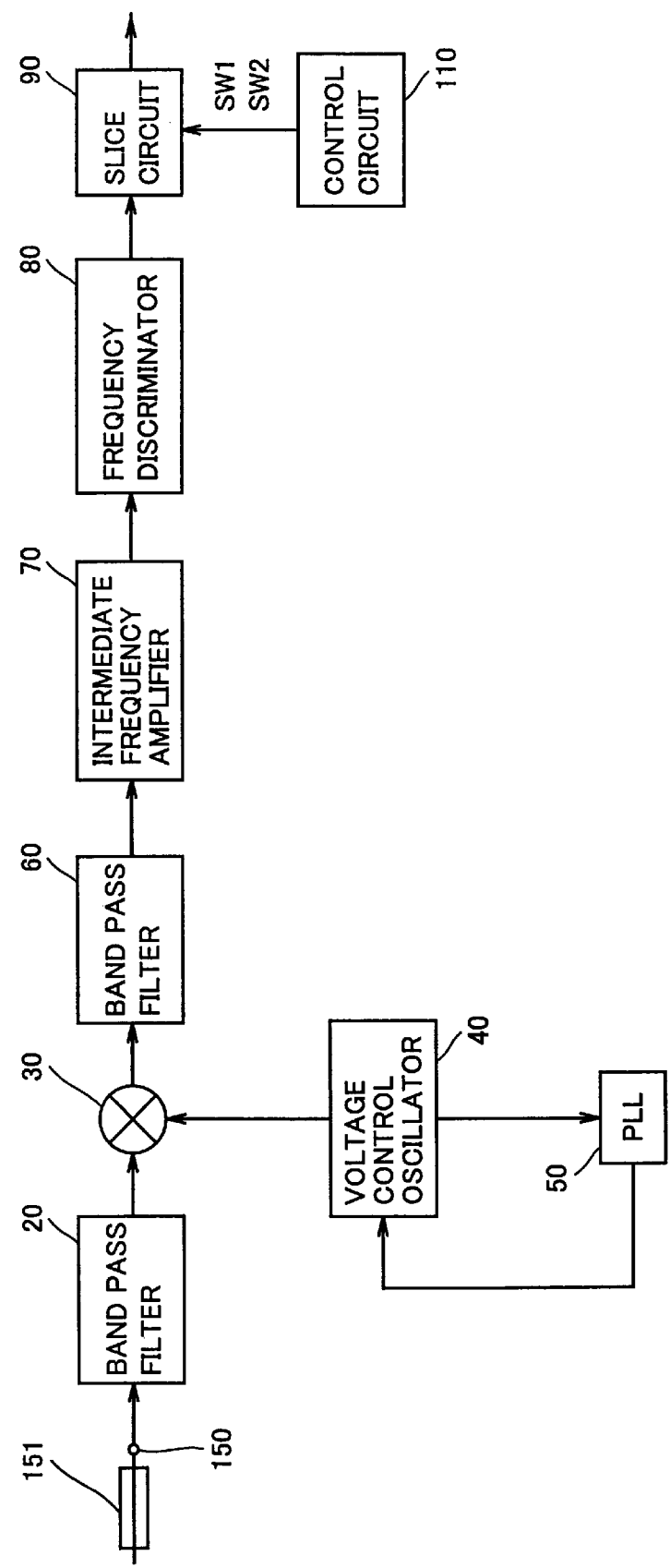
FIG. 50 is a schematic block diagram of another receiver according to the invention.

For the communication via cables, a receiver 100N shown in FIG. 50 is employed. Referring to FIG. 50, receiver 100N is the same as receiver 100 except for that antenna 10 in receiver 100 is removed, and an input terminal 150 is added. A cable 151 is connected to input terminal 150.

Receiver 100N receives the signal sent via cable 151 to input terminal 150. Slice circuit 90 in receiver 100N converts the input signal of frequency discriminator 80 from the analog signal to the digital signal as already described in connection with the first embodiment. Receiver 100N processes the received signal by the operations, which are performed by band pass filter 20, slice circuit 90 and circuits between them.

The slice circuit used for the communication via cables is not restricted to slice circuit 90, and may be selected from slice circuits 90A, 90B, 90C, 90D, 90E, 90F, 90G, 90H and 90H already described. The receiver used for the communication via cables may be prepared by applying slice circuit 90A, 90B, 90C, 90D, 90E, 90FP 90G, 90H or 90H to receiver 100N.

Figure 51:
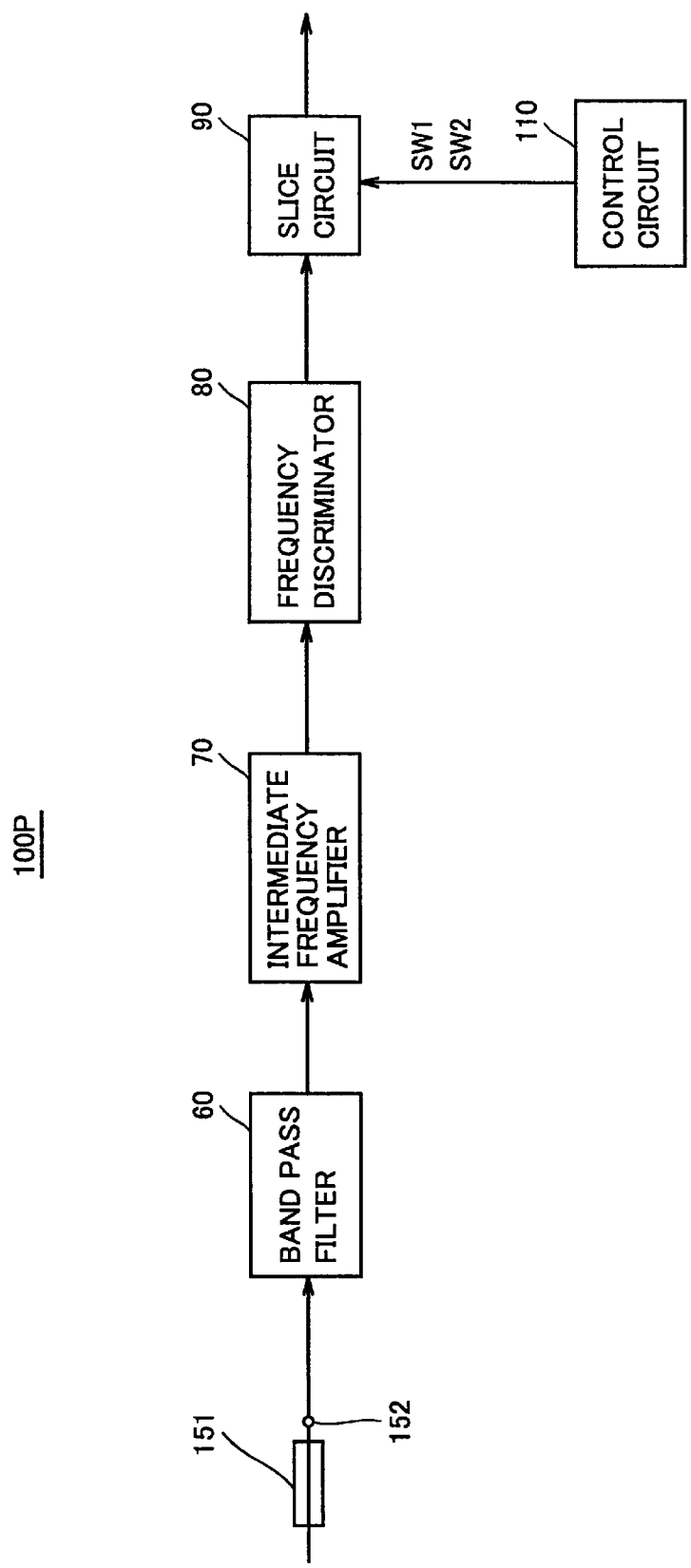
FIG. 51 is a schematic block diagram of still another receiver according to the invention.
Figure 52:
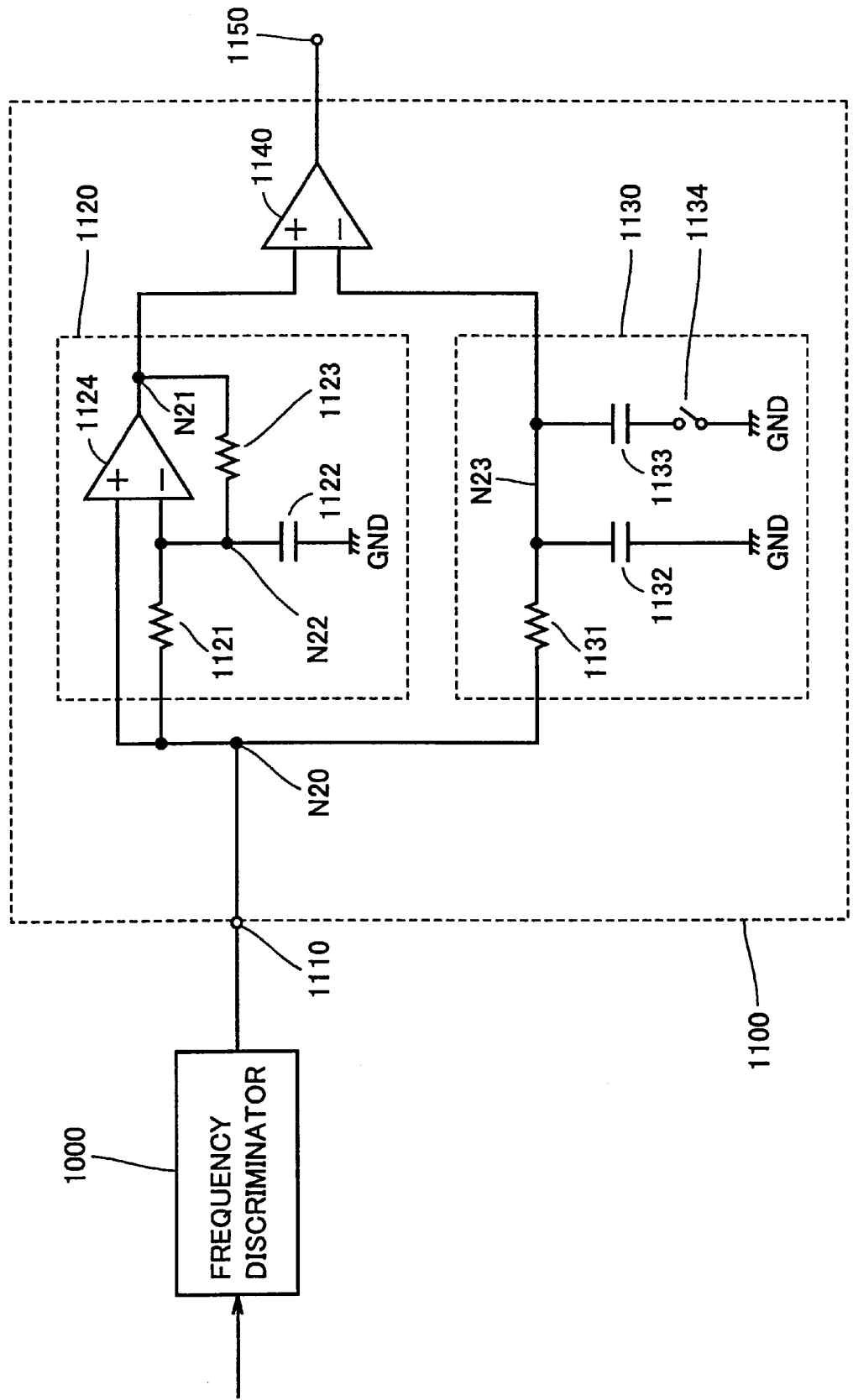
FIG. 52 is a circuit diagram of a conventional slice circuit.
Figure 53:
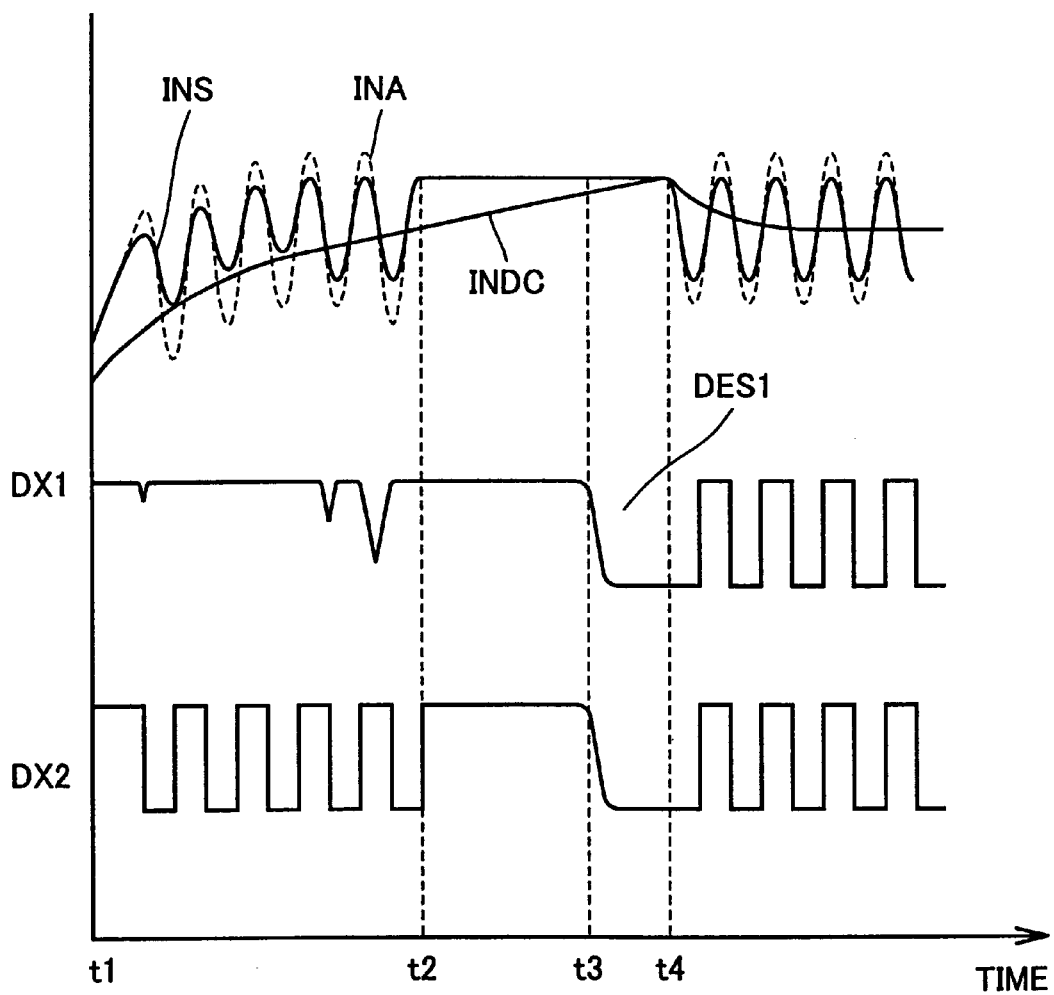
FIG. 53 is a timing chart of signals for illustrating problems of the conventional slice circuit.

The receiver used for the communication via cables is not restricted to receiver 100N shown in FIG. 50, and may be a receiver 100P shown in FIG. 51. Referring to FIG. 51, receiver 100P is the same as receiver 100 except for that antenna 10, band pass filter 20, mixer 30, voltage control oscillator 40 and PLL 50 in receiver 100 are removed, and an input terminal 152 is added. Cable 151 is connected to input terminal 152.

Receiver 100P receives the signal sent via cable 151 from input terminal 152. The slice circuit 90 in receiver 100P converts the input signal sent from frequency discriminator 80 from the analog signal to the digital signal, as already described in connection with the first embodiment. Receiver 100P processes the received signal by the operation of band pass filter 60, slice circuit 90 and circuits between them already described in connection with the first embodiment.

The receiver used for the communication via cables may be a receiver prepared by applying slice circuit 90A, 90B, 90C, 90D, 90E, 90F, 90G, 90H, or 90J to receiver 100P.

As described above, slice circuits 90A, 90B, 90C, 90D, 90E, 90F, 90G, 90H and 90J according to the invention as well as receivers 100, 100A, 100B, 100C, 100D, 100E, 100F, 100G, 100H, 100J, 100K, 100L, 100M, 100N and 100P employing such slice circuits can achieve all or two of the following three effects at the same time.

(a) Even when input signal Vin contains the drift of DC offset, the drift of DC offset can be removed, and input signal Vin can be accurately followed and converted from the analog signal to the digital signal.

(b) Even when the input signal contains components formed of a succession of uniform voltage levels, the input signal can be accurately converted from the analog signal to the digital signal.

(c) Even when the input signal contains noise components, erroneous detection of noise components can be prevented.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A slice circuit receiving an input signal prepared by demodulating a received signal subjected to frequency modulation and having a voltage level corresponding to the frequency modulation, and converting the input signal received from an analog signal to a digital signal, comprising:

a signal processing circuit producing, based on the input signal, one of a first processing signal including a first main signal and a first reference signal, a second processing signal including a second main signal and a second reference signal, and a third processing signal including the first main signal and the second reference signal; and a comparator comparing voltage levels of the first main signal and the first reference signal to provide a digital signal having a voltage level corresponding to the comparing when receiving the first processing signal, voltage levels of second main signal and the second reference signal to provide a digital signal having a voltage level corresponding to results of the comparing when receiving the second processing signal, and the voltage levels of the first main signal and the second reference signal to provide a digital signal having a voltage level corresponding to results of the comparing when receiving the third processing signal, wherein the first main signal is a signal having an amplified high frequency component of at least a predetermined frequency and a DC component including a predetermined voltage level, or is a signal having the high frequency component and a DC component at a voltage level changing in accordance with the DC component in the input signal, the second main signal is a signal having the high frequency component and a DC component the same as the DC component in the input signal, the first reference signal is a signal having an average voltage obtained by smoothing the input signal, and the second reference signal is a signal at a voltage level lower than the average voltage.

2. The slice circuit according to claim 1, wherein said signal processing circuit includes:

a DC component adjusting circuit changing the voltage level of the DC component in the input signal to a uniform voltage level or a voltage level according to the DC component in the input signal, and providing an AC component in the input signal, an amplifier circuit receiving an output signal of said DC component adjusting circuit, and providing the first main signal by amplifying the high frequency component in the output signal received, and a low pass filter receiving the output signal of said DC component adjusting circuit, and providing the first reference signal by smoothing the output signal received, and said comparator compares the voltage level of the first main signal with the voltage level of the first reference signal to provide a digital signal having a logical level corresponding to the comparing.

3. The slice circuit according to claim 1, wherein said signal processing circuit includes:

an amplifier circuit amplifying the high frequency component in the input signal to provide the second main signal, and an average potential producing circuit producing the second reference signal having a voltage level lower than that of the average voltage produced by smoothing the input signal, and said comparator compares the voltage level of the second main signal with the voltage level of the second reference signal, and provides a digital signal having a logical level corresponding to the comparing.

4. The slice circuit according to claim 1, wherein said signal processing circuit includes:

a DC component adjusting circuit converting the voltage level of the DC component in the input signal to a uniform voltage level or a voltage level corresponding to the DC component in the input signal, and providing an AC component in the input signal, an amplifier circuit receiving an output signal of said DC component adjusting circuit, and providing the first main signal by amplifying the high frequency component in the output signal received, and an average potential producing circuit producing the second reference signal having a voltage level lower than that of the average voltage produced by smoothing said input signal, and said comparator compares the voltage level of the first main signal with the voltage level of the second reference signal, and provides a digital signal having a logical level corresponding to results of the comparison.

5. The slice circuit according to claim 4, wherein said average potential producing circuit provides the second reference signal by smoothing the input signal and attenuating the input voltage smoothed.

6. The slice circuit according to claim 4, wherein said average potential producing circuit provides the second reference signal by attenuating the input signal and smoothing the input signal attenuated.

7. The slice circuit according to claim 6, wherein said average potential producing circuit includes:

a differential amplifier circuit comparing a voltage of the input signal with a reference voltage, and attenuating the voltage level of the input signal, and a low pass filter smoothing an output signal of said differential amplifier circuit.

8. The slice circuit according to claim 7, wherein gain of said differential amplifier circuit is set to a first gain during a period from start of reception of the input signal to a predetermined time, and is set to a second gain, lower than the first gain, after the predetermined time.

9. The slice circuit according to claim 4, wherein said DC component adjusting circuit includes:

a sample-hold circuit detecting a voltage level of a DC component in the input signal to provide a detected voltage value, or to hold the detected voltage value and provide a hold value of the detected voltage value, and a DC level converting circuit converting only a voltage level of the DC component in the input signal based on the input signal and the voltage value and outputting the voltage level converted, or converting only the voltage level of the DC component based on the input signal and the hold value and outputting the voltage level converted.

10. The slice circuit according to claim 9, wherein said sample hold circuit includes:

a switch, and a low pass filter providing the detected voltage value by integrating the input signal when said switch is on, and operating in response to turn-off of said switch to hold the detected voltage value at the turn-off for providing the hold value; and said DC level converting circuit includes:

a noninverting amplifier circuit receiving on a noninverting input terminal an input voltage equal to a sum of a voltage including the input signal and a divided voltage obtained by dividing a voltage difference between a voltage including the input signal and a reference voltage in a predetermined ratio, receiving the detected voltage value or the hold value on a bias terminal, converting only a DC component in the input signal to the reference voltage based on the input voltage and the voltage value for output, and converting only the DC component in accordance with the DC component in the input signal based on the input voltage and the hold value to provide the DC component converted, and a buffer receiving the voltage value provided from said sample hold circuit or the hold value, and providing the voltage value received or the hold value received to the bias terminal without change.

11. The slice circuit according to claim 10, wherein said switch is on for a period from start of reception of the input signal to a predetermined time, and is off after the predetermined time.

12. The slice circuit according to claim 10, further comprising a voltage difference detecting circuit detecting a voltage difference between a voltage of the first main signal and a voltage of the second reference signal, turning off said switch when the voltage difference falls within a predetermined range, and turning on said switch when the voltage difference falls outside the predetermined range.

13. The slice circuit according to claim 10, wherein said switch is turned off when the logical level of the digital signal provided from said comparator continues for a predetermined period.

14. The slice circuit according to claim 10, wherein gain of said amplifier circuit is set to a first gain during a period from start of reception of the input signal to a predetermined time, and is set to a second gain, lower than the first gain, after the predetermined time.

15. The slice circuit according to claim 14, wherein said switch is on when the input signal received has a strength at least equal to a predetermined value, and is off when the signal received has a strength lower than the predetermined value.

16. The slice circuit according to claim 10, wherein said average potential producing circuit includes:

a differential amplifier circuit comparing a voltage of the input signal with another reference voltage, and attenuating the voltage level of the input signal, and a low pass filter smoothing an output signal of said differential amplifier circuit, said switch is on for a period from start of reception of the input signal to a first time, and is off after the first time, gain of said amplifier circuit is set to a first gain during a period from start of reception of the input signal to a second time, and is set to a second gain, lower than the first gain, after the second time, and gain of said differential amplifier circuit is set to a third gain during a period from the start of reception of the input signal to a third time, and is set to a fourth gain, lower than the third gain, after the third time.

17. The slice circuit according to claim 10, further comprising:
a voltage difference detecting circuit detecting a voltage difference between a voltage of the first main signal and a voltage of the second reference signal, turning off said switch when the voltage difference detected falls within a predetermined range, and turning on said switch when the voltage difference detected falls outside the predetermined range, wherein said average potential producing circuit includes:
a differential amplifier circuit comparing a voltage of the input signal with another reference voltage, and attenuating voltage level of the input signal, and
a low pass filter smoothing an output signal of said differential amplifier circuit,
gain of said amplifier circuit is set to a first gain during a period from start of reception of the input signal to a first time, and is set to a second gain, lower than the first gain, after first time, and
gain of said differential amplifier circuit is set to a third gain during a period from the start of reception of the input signal to a second time, and is set to a fourth gain, lower than the third gain, after said second time.

18. The slice circuit according to claim 10, wherein
said average potential producing circuit includes:
a differential amplifier circuit comparing a voltage of the input signal with another reference voltage, and attenuating the voltage level of the input signal, and
a low pass filter smoothing an output signal of said differential amplifier circuit,
said switch is turned off when the logical level of the digital signal provided from said comparator continues for a predetermined period,
gain of said amplifier circuit is set to a first gain during a period from start of reception of the input signal to a first time, and is set to a second gain, lower than the first gain, after the first timing, and
gain of said differential amplifier circuit is set to a third gain during a period from the start of reception of the input signal to second timing, and is set to a fourth gain, lower than the third gain, after the second timing.

* * * * *